United States Patent
Miura et al.

(10) Patent No.: US 10,332,921 B2
(45) Date of Patent: Jun. 25, 2019

(54) SOLID-STATE IMAGE SENSING DEVICE AND METHOD FOR MANUFACTURING THE SAME, AND ELECTRONIC DEVICE

(71) Applicant: SONY SEMICONDUCTOR SOLUTIONS CORPORATION, Kanagawa (JP)

(72) Inventors: Tsukasa Miura, Kanagawa (JP); Shuji Manda, Kanagawa (JP); Tomoyuki Hirano, Kanagawa (JP); Junpei Yamamoto, Kanagawa (JP); Kazunobu Ota, Nagasaki (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/761,671

(22) PCT Filed: Sep. 27, 2016

(86) PCT No.: PCT/JP2016/078348
§ 371 (c)(1),
(2) Date: Mar. 20, 2018

(87) PCT Pub. No.: WO2017/061295
PCT Pub. Date: Apr. 13, 2017

(65) Prior Publication Data
US 2018/0350854 A1 Dec. 6, 2018

(30) Foreign Application Priority Data

Oct. 9, 2015 (JP) ................................. 2015-201354

(51) Int. Cl.
*H01L 27/146* (2006.01)
*H01L 21/28* (2006.01)
(Continued)

(52) U.S. Cl.
CPC .......... *H01L 27/1461* (2013.01); *H01L 21/28* (2013.01); *H01L 21/283* (2013.01);
(Continued)

(58) Field of Classification Search
CPC .................................................. H01L 27/1461
(Continued)

(56) References Cited

U.S. PATENT DOCUMENTS 5,481,124 A * 1/1996 Kozuka ............. H01L 27/14672
257/16
8,981,517 B2 3/2015 Oshiyama et al.
(Continued)

FOREIGN PATENT DOCUMENTS

CN 102208427 A 10/2011
CN 102239546 A 11/2011
(Continued)

OTHER PUBLICATIONS

International Search Report and Written Opinion of PCT Application No. PCT/JP2016/078348, dated Dec. 6, 2016, 09 pages.

*Primary Examiner* — Jami Valentine Miller
(74) *Attorney, Agent, or Firm* — Chip Law Group

(57) ABSTRACT

The present disclosure relates to a solid-state image sensing device capable of restricting an occurrence of a dark current and a method for manufacturing the same, and an electronic device. A solid-state image sensing device includes a FD part formed on a P-type semiconductor substrate by implanting an N-type impurity, a high-dielectric insulative film laminated on at least the FD part, and a contact electrode connected to the FD part in a connection structure via the high-dielectric insulative film. For example, the high-dielectric insulative film is formed by use of a material which reduces the schottky barrier height in a connection part between the FD part and the electrode in a single layer or in
(Continued)

a plurality of layers. The present technology is applicable to CMOS image sensors, for example.

14 Claims, 55 Drawing Sheets

(51) Int. Cl.
| | |
|---|---|
| H01L 21/283 | (2006.01) |
| H01L 27/14 | (2006.01) |
| H04N 5/361 | (2011.01) |
| H04N 5/369 | (2011.01) |
| H01L 27/28 | (2006.01) |
| H01L 27/30 | (2006.01) |

(52) U.S. Cl.
CPC ............ *H01L 27/14* (2013.01); *H01L 27/146* (2013.01); *H01L 27/1469* (2013.01); *H01L 27/14612* (2013.01); *H01L 27/14634* (2013.01); *H01L 27/14636* (2013.01); *H01L 27/14645* (2013.01); *H01L 27/14689* (2013.01); *H01L 27/286* (2013.01); *H01L 27/307* (2013.01); *H04N 5/361* (2013.01); *H04N 5/369* (2013.01)

(58) Field of Classification Search
USPC ......................................... 257/229
See application file for complete search history.

(56) References Cited

U.S. PATENT DOCUMENTS

| | | | | |
|---|---|---|---|---|
| 2009/0267160 | A1* | 10/2009 | Ichise | ................. H01L 23/5252 257/369 |
| 2010/0155846 | A1* | 6/2010 | Mukherjee | ........ H01L 21/28512 257/365 |
| 2010/0224916 | A1* | 9/2010 | Shimizu | ............ H01L 21/28176 257/288 |
| 2011/0031376 | A1 | 2/2011 | Oshiyama et al. | |
| 2011/0187911 | A1* | 8/2011 | Shinohara | ......... H01L 27/14812 348/308 |
| 2011/0242390 | A1* | 10/2011 | Sogoh | ............... H01L 27/14609 348/311 |
| 2012/0115330 | A1 | 5/2012 | Mukherjee et al. | |
| 2015/0076571 | A1 | 3/2015 | Mukherjee et al. | |
| 2015/0115336 | A1 | 4/2015 | Sogoh et al. | |
| 2015/0279892 | A1 | 10/2015 | Sato | |
| 2016/0035781 | A1 | 2/2016 | Sogoh et al. | |
| 2016/0044265 | A1 | 2/2016 | Kato | |
| 2018/0070041 | A1* | 3/2018 | Hirota | ............... H01L 27/14605 |

FOREIGN PATENT DOCUMENTS

| | | |
|---|---|---|
| CN | 102272931 A | 12/2011 |
| CN | 103975437 A | 8/2014 |
| EP | 2359394 A2 | 8/2011 |
| EP | 2793263 A1 | 10/2014 |
| JP | 61-285762 A | 12/1986 |
| JP | 2010-212361 A | 9/2010 |
| JP | 2010-239116 A | 10/2010 |
| JP | 2011-216639 A | 10/2011 |
| JP | 2012-508989 A | 4/2012 |
| JP | 2010-212361 A | 9/2014 |
| JP | 2014-160876 A | 9/2014 |
| JP | 2014-216859 A | 11/2014 |
| KR | 10-2011-0084166 A | 7/2011 |
| KR | 10-2011-0109894 A | 10/2011 |
| KR | 10-2011-0132205 A | 12/2011 |
| KR | 10-2014-0110844 A | 9/2014 |
| TW | 201034185 A | 9/2010 |
| TW | 201106481 A | 2/2011 |
| TW | 201203529 A | 1/2012 |
| TW | 201330240 A | 7/2013 |
| WO | 2010/080276 A2 | 7/2010 |
| WO | 2010/104021 A1 | 9/2010 |
| WO | 2013/088984 A1 | 6/2013 |
| WO | 2014/174898 A1 | 10/2014 |

* cited by examiner

FIG. 4
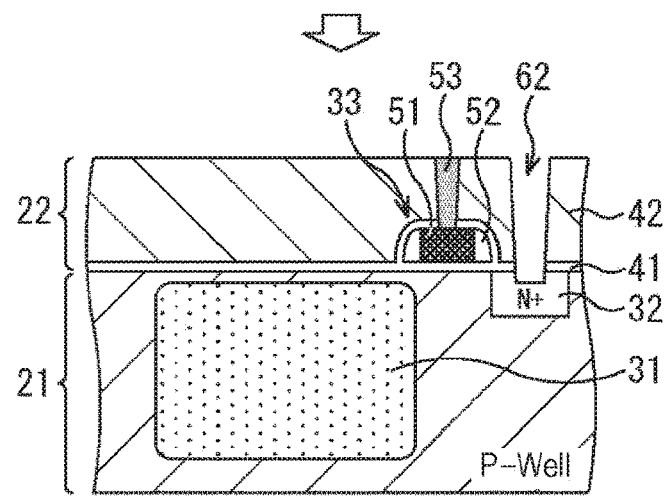
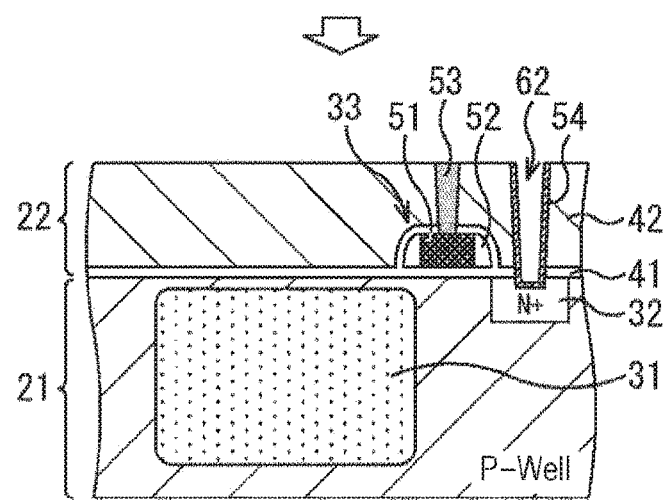
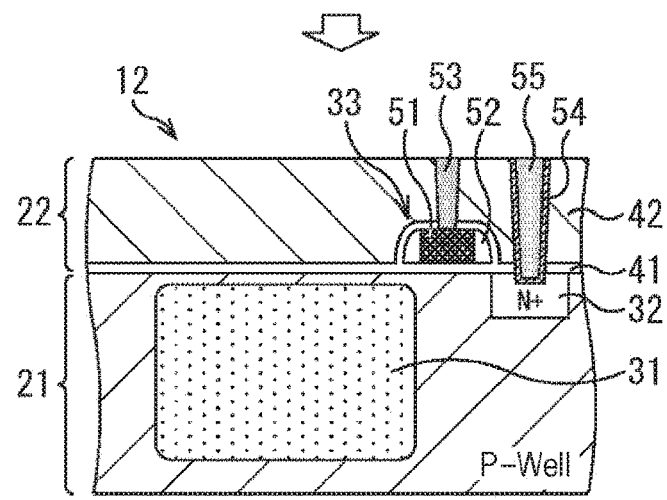

FIG. 7
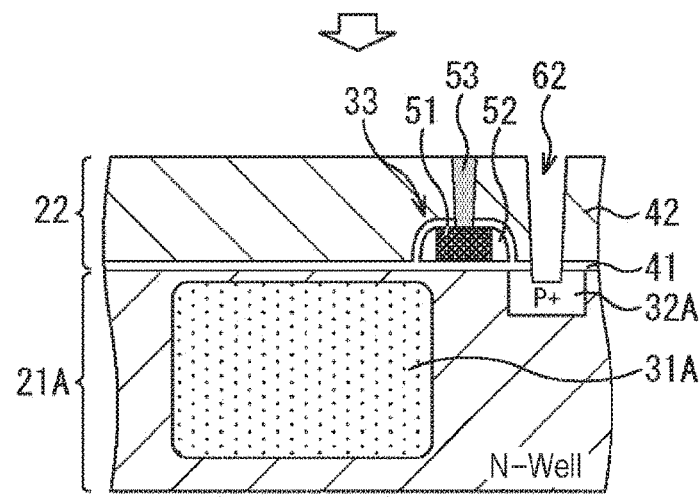
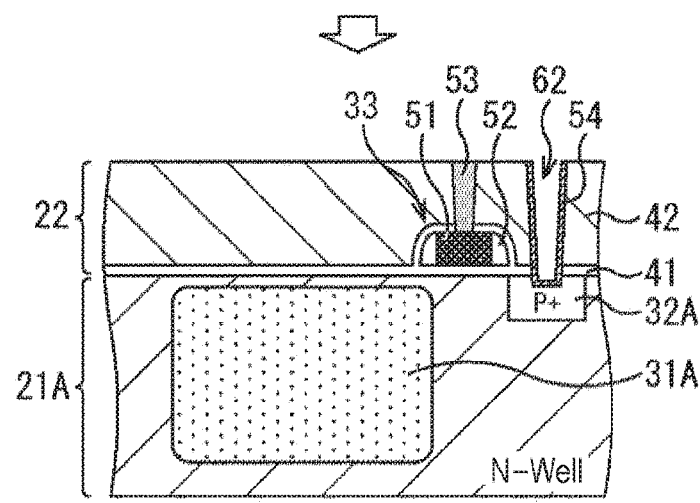
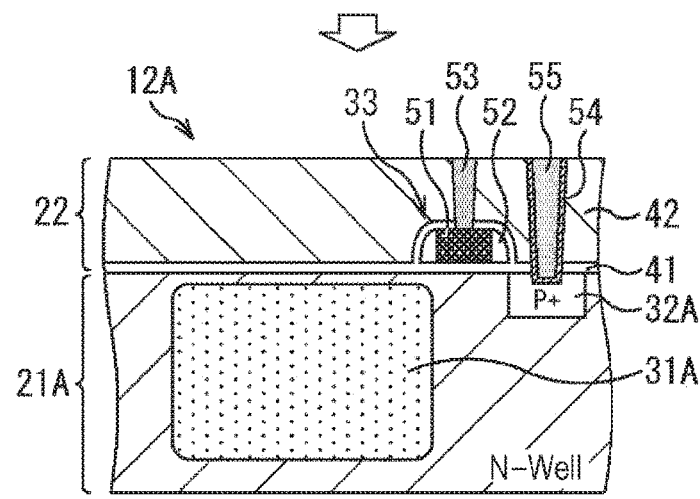

FIG. 9
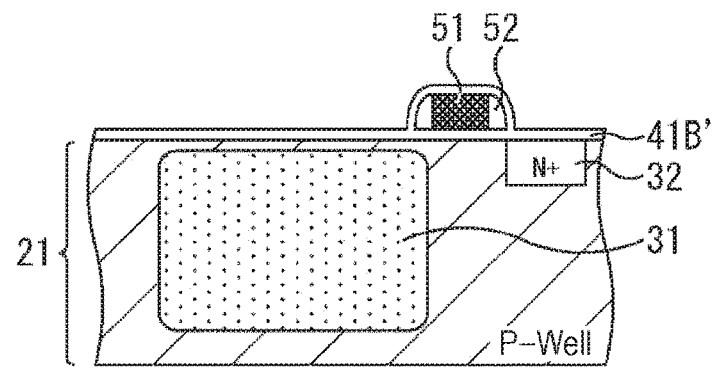
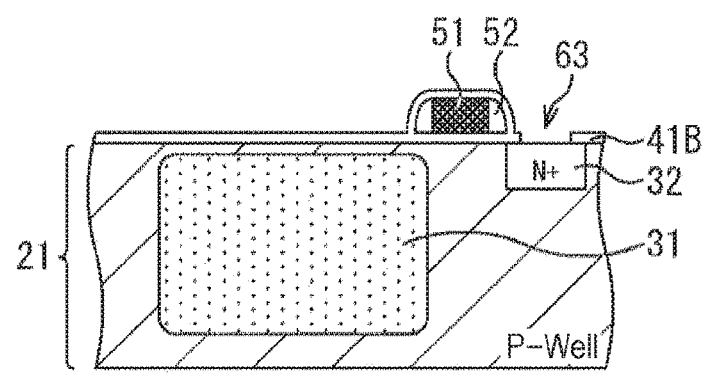
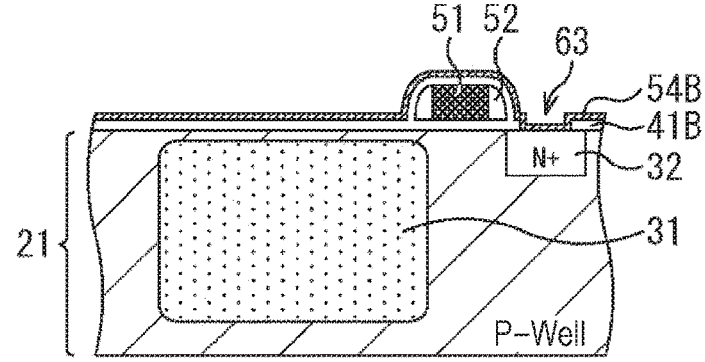

FIG. 19
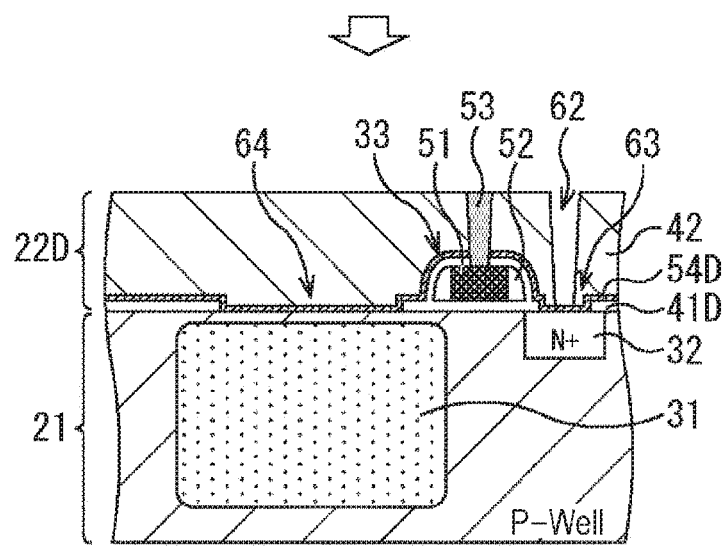
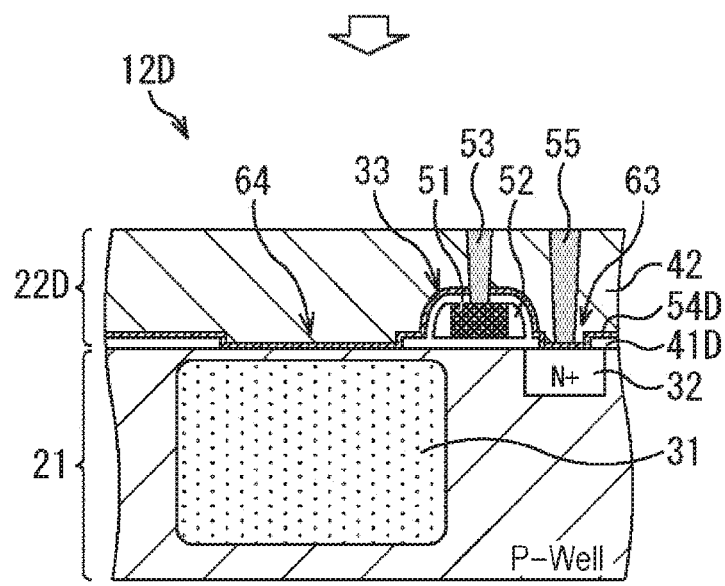

FIG. 21
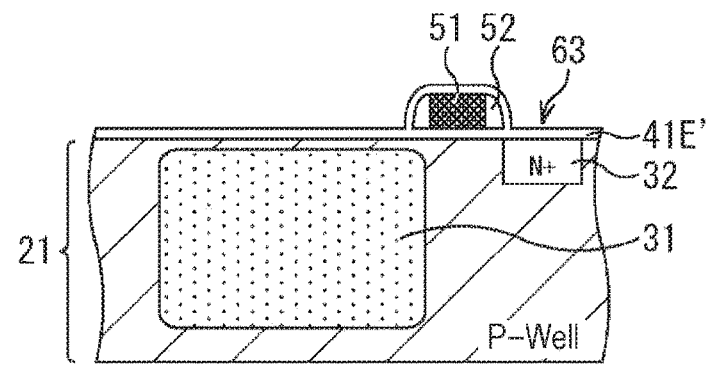
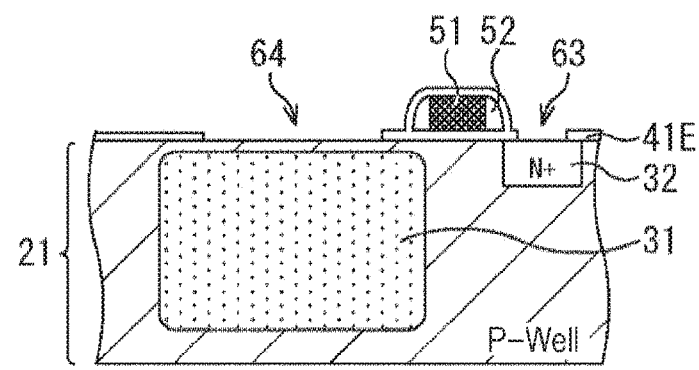
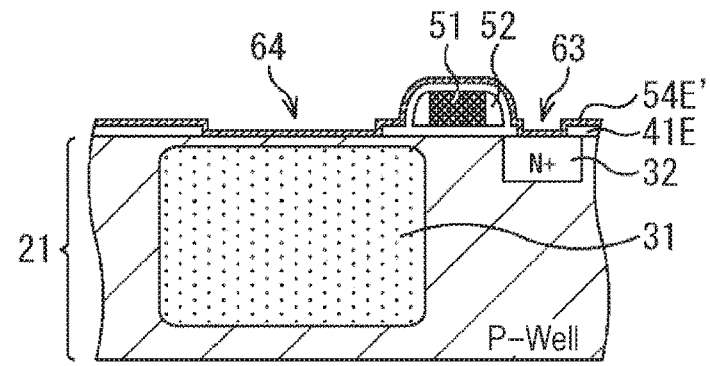

FIG. 22
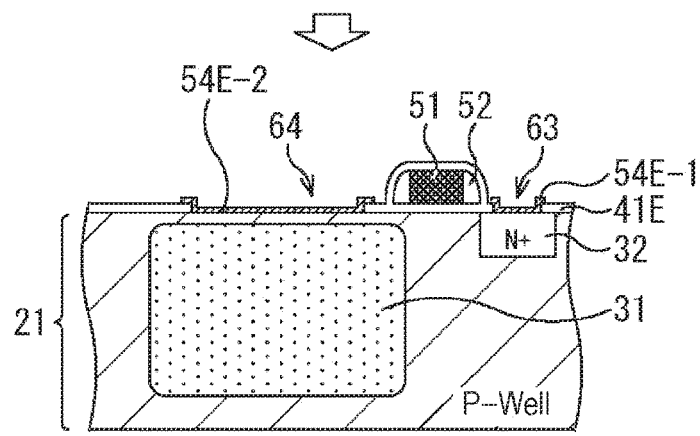
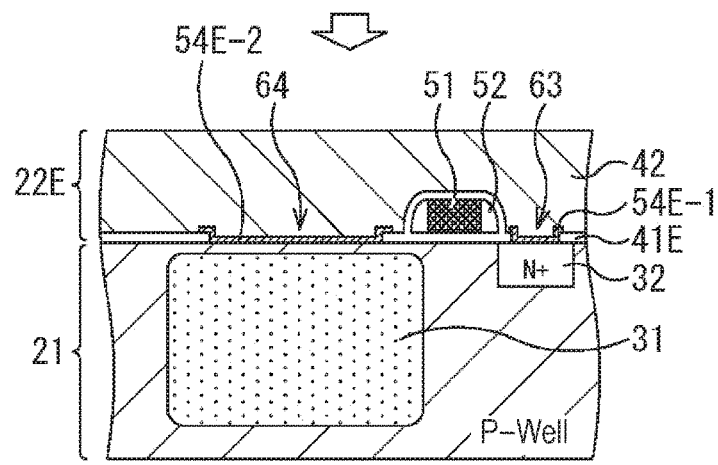
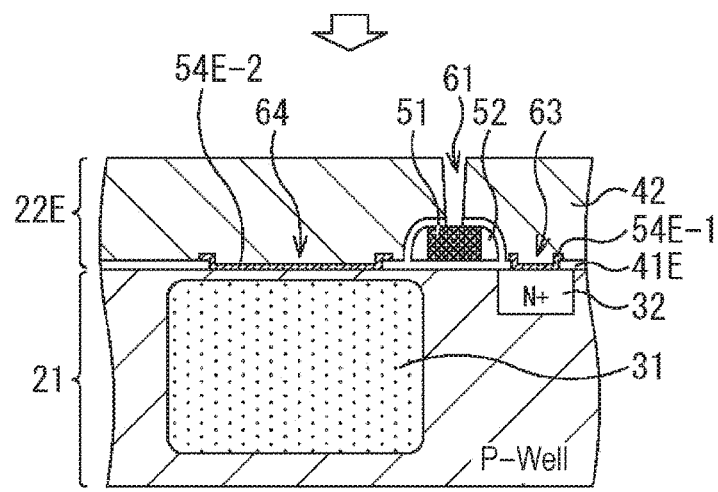

FIG. 23
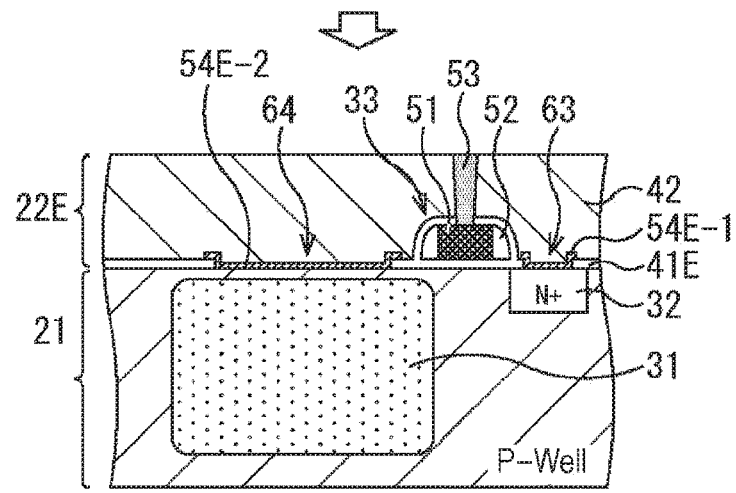
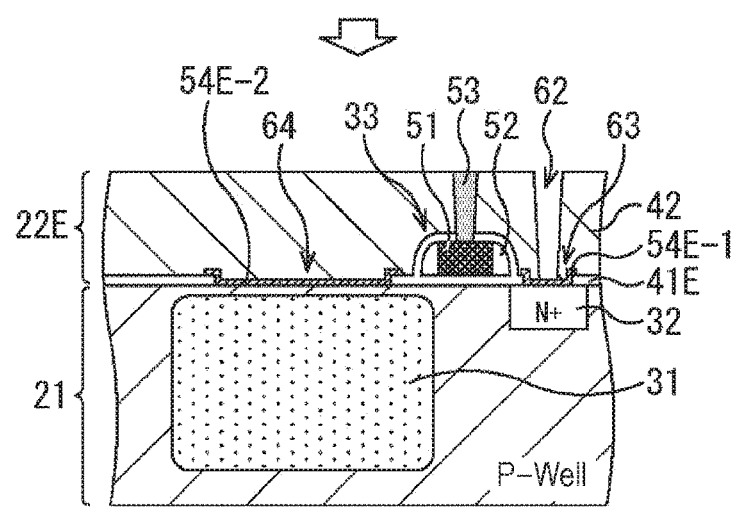
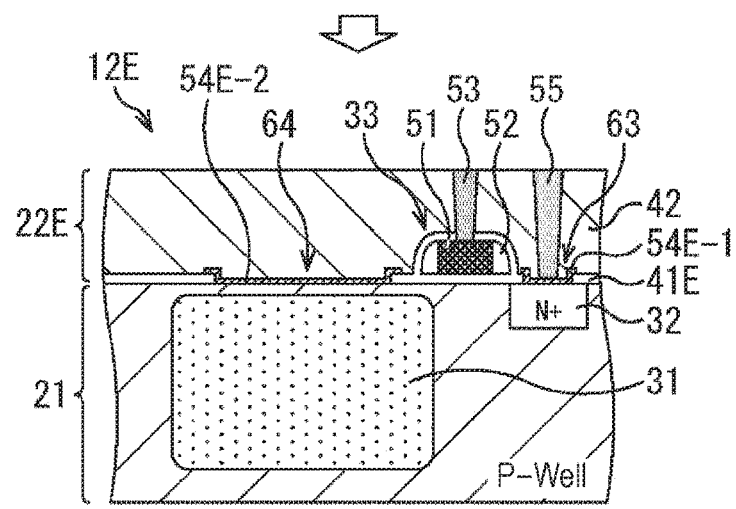

FIG. 29
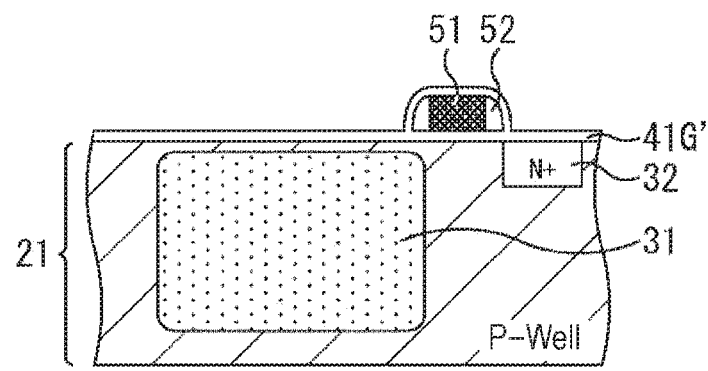
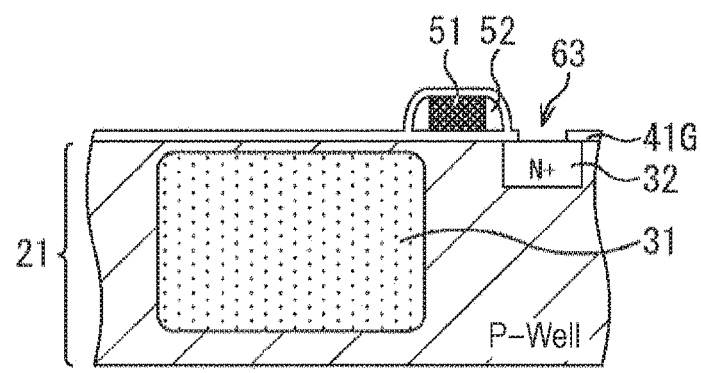
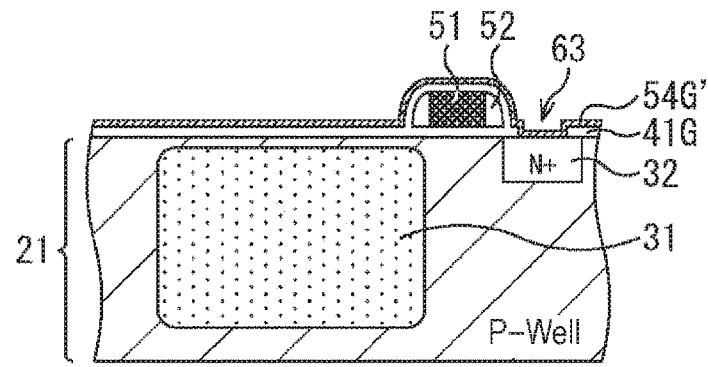

FIG. 37
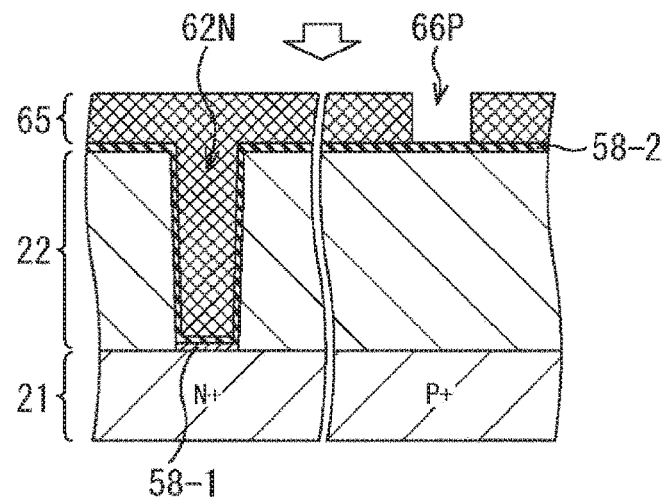
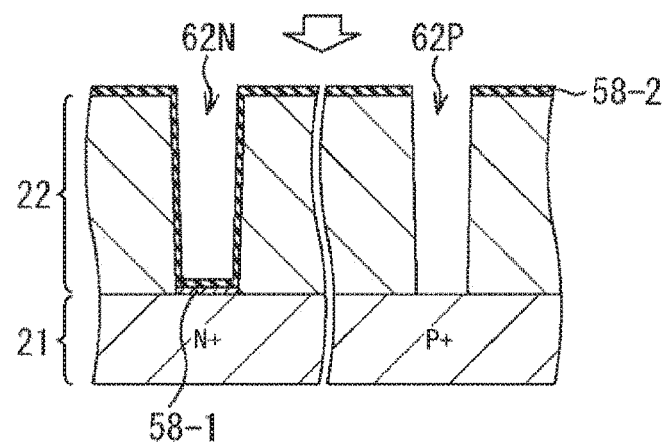
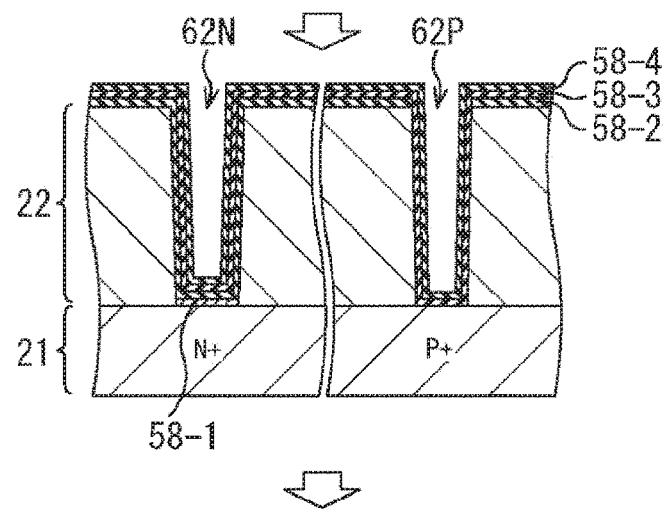

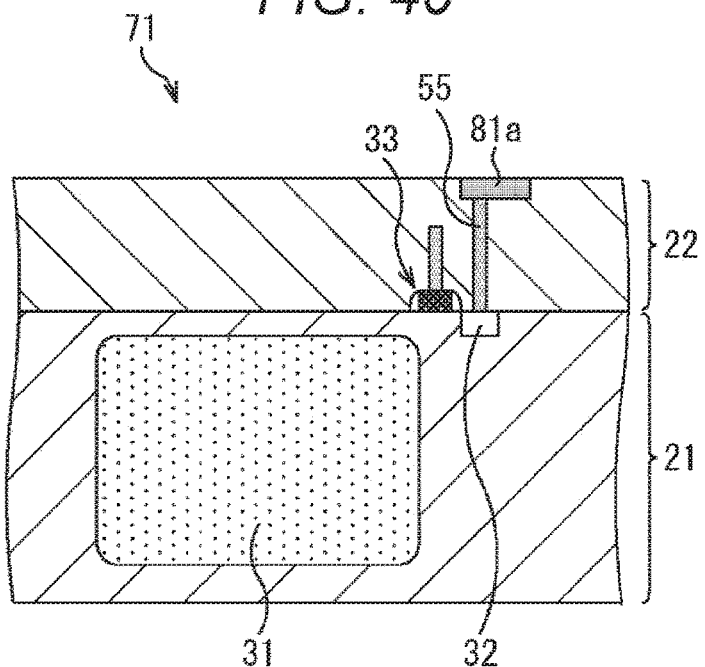
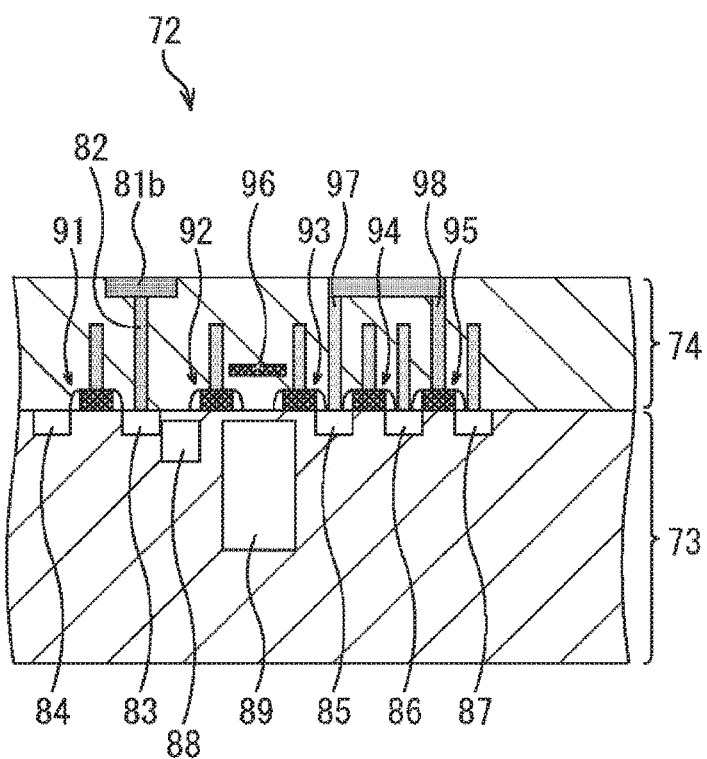

SOLID-STATE IMAGE SENSING DEVICE AND METHOD FOR MANUFACTURING THE SAME, AND ELECTRONIC DEVICE

CROSS REFERENCE TO RELATED APPLICATIONS

This application is U.S. National Phase of International Patent Application No. PCT/JP2016/078348 filed on Sep. 27, 2016, which claims priority benefit of Japanese Patent Application No. JP 2015-201354 filed in the Japan Patent Office on Oct. 9, 2015.Each of the above-referenced applications is hereby incorporated herein by reference in its entirety.

TECHNICAL FIELD

The present disclosure relates to a solid-state image sensing device and a method for manufacturing the same, and an electronic device, and particularly to a solid-state image sensing device capable of restricting an occurrence of a dark current and a method for manufacturing the same, and an electronic device.

BACKGROUND ART

Conventionally, a solid-state image sensing device such as charge coupled device (CCD) or complementary metal oxide semiconductor (CMOS) image sensor is used, for example, in an electronic device including an imaging function such as digital still camera or digital video camera. A solid-state image sensing device has pixels in which a photodiode (PD) configured to perform photoelectric conversion and a plurality of transistors are combined, and an image is constructed on the basis of pixel signals output from the a plurality of pixels arranged on an image face on which the image of an object is formed.

Further, the solid-state image sensing device employs a structure in which charges are accumulated in a diffusion layer in a silicon substrate, which is called floating diffusion (FD) part. Then, contact between a FD part and a drawing electrode metal needs to be at lower resistance, and thus the FD part is formed as high-concentration N-type region.

For example, Patent Document 1 discloses a solid-state image sensing device capable of restricting a dark current due to an interface state.

CITATION LIST

Patent Document

Patent Document 1: Japanese Patent Application Laid-Open No. 2014-160876

SUMMARY OF THE INVENTION

Problems to be Solved by the Invention

Incidentally, in a conventional solid-state image sensing device, in a case where a FD part is configured as a high-concentration N-type region, an electric field intensity of a PN junction part with a P-type semiconductor substrate (P-Well) is strong, and thus a dark current can occur. The dark current serves as noise and is assume to deteriorate image quality when the dark current is mixed into a charge signal caused by photoelectric conversion.

The present disclosure has been made in terms of the above circumstances, and is directed to restricting an occurrence of a dark current.

Solutions to Problems

A solid-state image sensing device of one aspect of the present disclosure includes: an impurity region formed on a semiconductor substrate of a predetermined type by implanting an impurity of a different type from the semiconductor substrate; a high-dielectric insulative film laminated on at least the impurity region; and an electrode connected to the impurity region in a connection structure via the high-dielectric insulative film.

A manufacturing method or program of one aspect of the present disclosure includes: forming an impurity region on a semiconductor substrate of a predetermined type by implanting an impurity of a different type from the semiconductor substrate; laminating a high-dielectric insulative film on at least the impurity region; and forming an electrode connected to the impurity region in a connection structure via the high-dielectric insulative film.

An electronic device of one aspect of the present disclosure includes a solid-state image sensing device including: an impurity region formed on a semiconductor substrate of a predetermined type by implanting an impurity of a different type from the semiconductor substrate; a high-dielectric insulative film laminated on at least the impurity region; and an electrode connected to the impurity region in a connection structure via the high-dielectric insulative film.

According to one aspect of the present disclosure, an impurity of a different type from a semiconductor substrate of a predetermined type is implanted in the semiconductor substrate thereby to form an impurity region, and a high-dielectric insulative film is laminated on at least the impurity region, and an electrode is connected to the impurity region in a connection structure via the high-dielectric insulative film.

Effects of the Invention

According to one aspect of the present disclosure, it is possible to restrict an occurrence of a dark current.

BRIEF DESCRIPTION OF DRAWINGS

FIG. 4 is a diagram for explaining the steps of manufacturing the pixel in the first exemplary configuration.

FIG. 7 is a diagram for explaining the steps of manufacturing the pixel in the second exemplary configuration.

FIG. 9 is a diagram for explaining the steps of manufacturing the pixel in the third exemplary configuration.

FIG. 19 is a diagram for explaining the steps of manufacturing the pixel in the fifth exemplary configuration.

FIG. 21 is a diagram for explaining the steps of manufacturing the pixel in the sixth exemplary configuration.

FIG. 22 is a diagram for explaining the steps of manufacturing the pixel in the sixth exemplary configuration.

FIG. 23 is a diagram for explaining the steps of manufacturing the pixel in the sixth exemplary configuration.

FIG. 29 is a diagram for explaining the steps of manufacturing the pixel in the eighth exemplary configuration.

FIG. 37 is a diagram for explaining the steps of manufacturing the pixel in the 10th exemplary configuration.

FIG. 40 is a diagram for explaining a method for manufacturing the solid-state image sensing device according to the second embodiment.

FIG. 41 is a diagram for explaining the method for manufacturing the solid-state image sensing device according to the second embodiment.

MODE FOR CARRYING OUT THE INVENTION

Specific embodiments to which the present technology is applied will be described below in detail with reference to the drawings.

Figure 1:
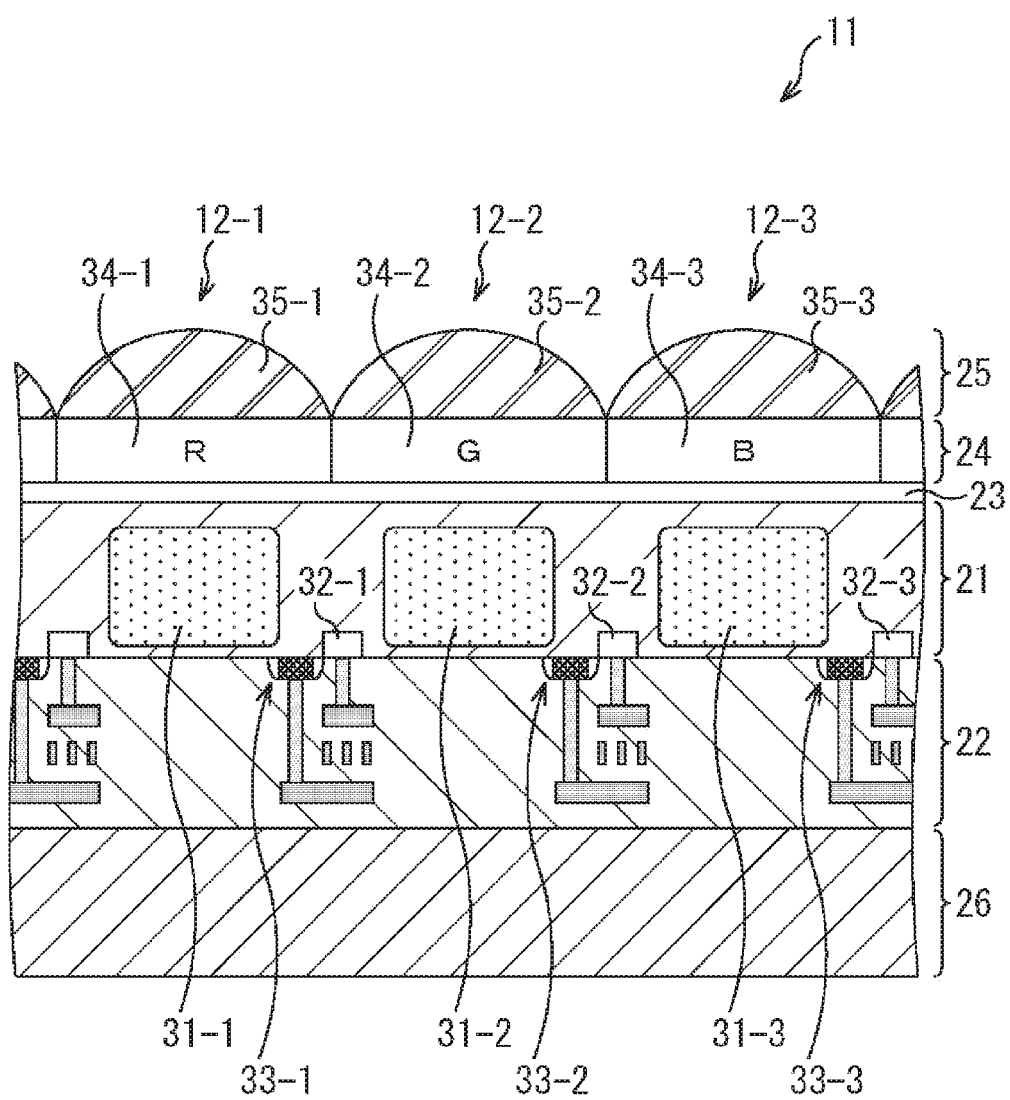
FIG. 1 is a diagram illustrating an exemplary cross-section configuration of a first embodiment of a solid-state image sensing device to which the present technology is applied.

FIG. 1 is a diagram illustrating an exemplary cross-section configuration of a first embodiment of a solid-state image sensing device to which the present technology is applied.

A solid-state image sensing device 11 of FIG. 1 is configured such that a plurality of pixels 12 are arranged in a matrix shape, and FIG. 1 illustrates a cross-section in which three pixels 12-1 to 12-3 are arranged. Additionally, in a case where the pixels 12-1 to 12-3 do not need to be particularly discriminated, they are simply denoted as pixel 12 as needed, and each unit configuring a pixel 12 is similarly denoted.

Further, as illustrated in FIG. 1, the solid-state image sensing device 11 is configured such that a wiring layer 22 is laminated on the surface of a semiconductor substrate 21, a planarization film 23, a filter layer 24, and an on-chip lens layer 25 are laminated on the backside of the semiconductor substrate 21, and a support substrate 26 is attached to the wiring layer 22.

The semiconductor substrate 21 is, for example, a wafer including thinly sliced monocrystal silicon, and is such that a PD 31 as photoelectric conversion unit, and a FD part 32 configured to temporarily accumulate charges generated in the PD 31 are formed per pixel 12. Further, a transfer transistor 33 configured to transfer charges from the PD 31 to the FD part 32 is formed per pixel 12 on the surface of the semiconductor substrate 21.

For example, a plurality of wiring layers such as a wiring configured to supply a gate electrode of the transfer transistor 33 with a drive signal or a wiring configured to connect the FD part 32 and a gate electrode of an amplification transistor (not illustrated) are formed on the wiring layer 22 via an interlayer insulative film.

The planarization film 23 is provided to planarize the backside of the semiconductor substrate 21.

The filter layer 24 is arranged with a color filter 34 configured to transmit a light of a predetermined color per pixel 12. For example, a color filter 34-1 configured to transmit a red (R) light, a color filter 34-2 configured to transmit a green (G) light, and a color filter 34-3 configured to transmit a blue (B) light are arranged for the pixel 12-1, the pixel 12-2, and the pixel 12-3, respectively.

A micro-lens 35 configured to collect lights per pixel 12 is arranged on the on-chip lens layer 25.

In the thus-configured solid-state image sensing device 11, a light emitted on the pixel 12 is collected on the micro-lens 35, transmits through the color filter 34, and is received by the PD 31, and charges photoelectrically converted in the PD 31 are transferred to the FD part 32 via the transfer transistor 33. Then, a potential at the level according to the charges accumulated in the FD part 32 is supplied to the gate electrode of the amplification transistor, and is output as a pixel signal.

Figure 2:
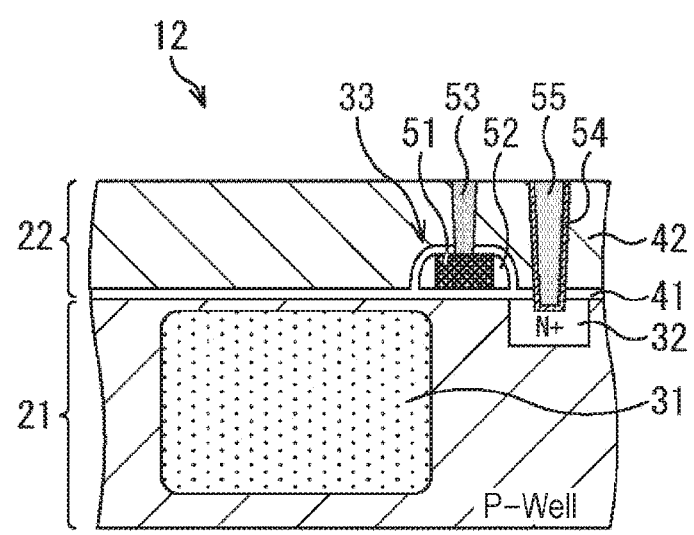
FIG. 2 is a diagram illustrating a first exemplary configuration of a pixel.

Then, FIG. 2 is a diagram illustrating a first exemplary configuration of the pixel 12.

As illustrated in FIG. 2, in the pixel 12, a silicon oxide film 41 is formed on the surface of the semiconductor substrate 21 on which the PD 31 and the FD part 32 are formed by a thermal processing, for example, and the transfer transistor 33 and an interlayer insulative film 42 are laminated via the silicon oxide film 41. The transfer transistor 33 is configured such that a sidewall part 52 with a predetermined thickness is formed to surround the side of a gate electrode 51 formed on the silicon oxide film 41 and a contact electrode 53 formed to penetrate through the interlayer insulative film 42 is connected to the gate electrode 51.

Further in the pixel 12, the contact electrode 53 configured to read charges from the FD part 32 is in a connection structure in which it is connected to the FD part 32 via a high-dielectric insulative film 54.

The high-dielectric insulative film 54 is a metal-based insulative film inserted between the FD part 32 and a contact electrode 55. For example, the high-dielectric insulative film 54 is formed by use of high-dielectric metal oxide such as titanium dioxide (TiO2) to be a thin film with a thickness of about 2.0 nm to 3.0 nm.

The contact electrode 55 is formed by filling a metal such as tungsten (W) in a contact hole formed to penetrate through the interlayer insulative film 42 down to the FD part 32.

Here, the FD part 32 is an N-type region (N+) formed by implanting an N-type impurity such as phosphorus (P) or arsenic (As) in the P-type semiconductor substrate 21 (P-Well), and in the pixel 12 the concentration of the N-type impurity for forming the FD part 32 can be further lowered than conventionally. Further, a reduction in contact resistance can be achieved between the FD part 32 and the contact electrode 55.

For example, conventionally, a schottky barrier is caused between silicon and metal in a structure in which a silicon substrate is directly contacted with an electrode metal, which causes an increase in contact resistance.

To the contrary, the FD part 32 and the contact electrode 55 are connected via the high-dielectric insulative film 54 in the pixel 12, thereby restricting Fermi-level pinning causing a schottky barrier. That is, the high-dielectric insulative film 54 includes a material which reduces the schottky barrier height between the FD part 32 and the contact electrode 55. Thereby, a reduction in contact resistance can be realized while keeping the N-type concentration of the FD part 32 low. In order to achieve this, the high-dielectric insulative film 54 needs to be so thin that electrons tunnel.

As described above, the pixel 12 is configured such that the contact electrode 55 is connected to the FD part 32 via the high-dielectric insulative film 54, thereby lowering the N-type concentration of the FD part 32 and reducing the contact resistance. Then, the N-type concentration of the FD part 32 is lowered, and thus an electric field intensity of a PN junction part with the semiconductor substrate 21 (P-Well) is weakened, thereby restricting an occurrence of a dark current. Thereby, a dark current can be avoided from mixing into a charge signal in the pixel 12, thereby improving image quality.

Additionally, the connection structure in which the FD part 32 and the contact electrode 55 are connected via the high-dielectric insulative film 54 as in the pixel 12 will be called advanced contact structure below as needed.

The steps of manufacturing the pixel 12 in the method for manufacturing the solid-state image sensing device 11 will be described below with reference to FIG. 3 and FIG. 4.

Figure 3:
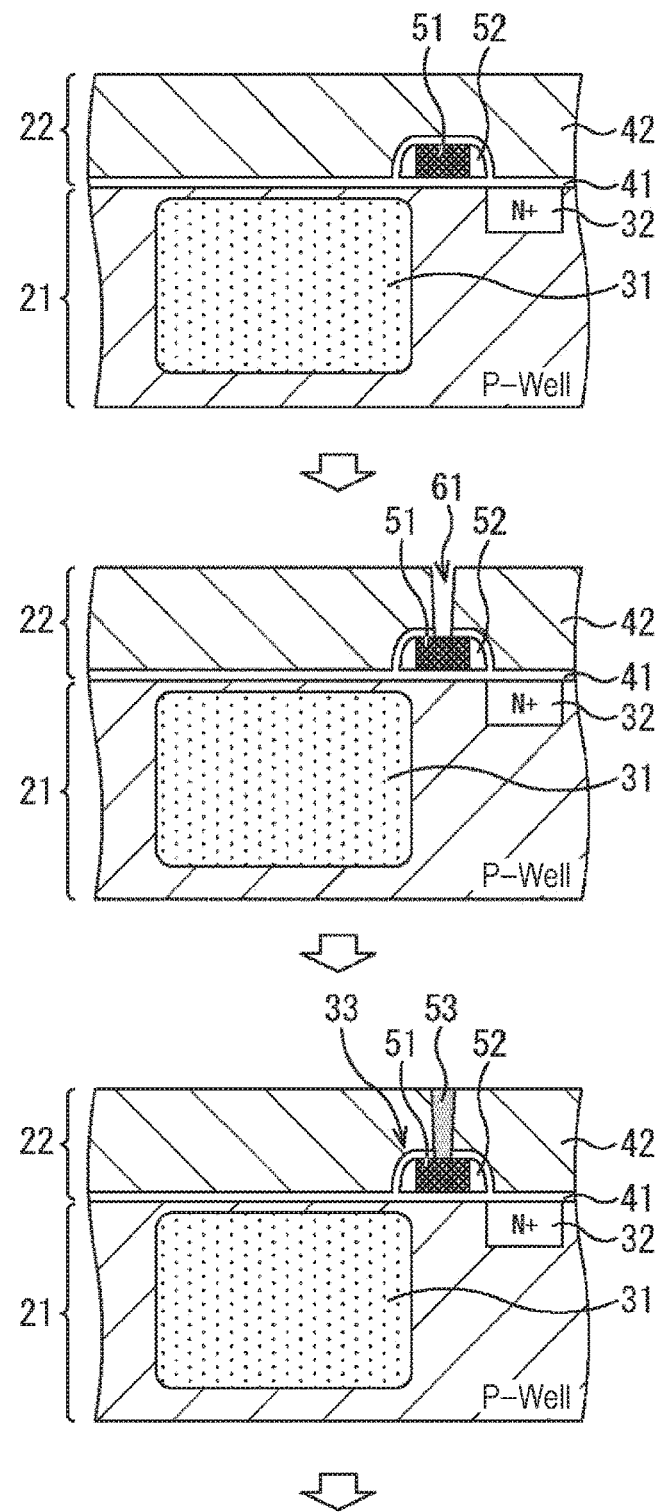
FIG. 3 is a diagram for explaining the steps of manufacturing the pixel in the first exemplary configuration.

At first, in the first step, as illustrated in the top stage of FIG. 3, the gate electrode 51 and the sidewall part 52 are formed on the silicon oxide film 41 formed on the surface of the semiconductor substrate 21, an N-type impurity is ion-implanted in the P-type semiconductor substrate 21 thereby to form the PD 31 and the FD part 32, and then the interlayer insulative film 42 is laminated.

Then in the second step, as illustrated in the middle stage of FIG. 3, a contact hole 61 is formed in the interlayer insulative film 42 down to the gate electrode 51. Further in the third step, as illustrated in the bottom stage of FIG. 3, tungsten, for example, is filled in the contact hole 61 thereby to form the contact electrode 53.

Subsequently in the fourth step, as illustrated in the top stage of FIG. 4, a contact hole 62 is formed in the interlayer insulative film 42 down to the FD part 32. Further in the fifth step, as illustrated in the middle stage of FIG. 4, titanium dioxide, for example, is deposited thereby to form the high-dielectric insulative film 54 on the bottom and the inner peripheral face of the contact hole 62. Thereafter, in the sixth step, as illustrated in the bottom stage of FIG. 3, tungsten, for example, is filled in the contact hole 62 thereby to form the contact electrode 55, thereby forming the pixel 12.

As described above, it is possible to manufacture the solid-state image sensing device 11 including the pixels 12 in the advanced contact structure in which the FD part 32 and the contact electrode 55 are connected via the high-dielectric insulative film 54. Further, the film thickness of the high-dielectric insulative film 54 can be easily controlled in the manufacturing method, thereby forming the high-dielectric insulative film 54 with a desired film thickness.

Figure 5:
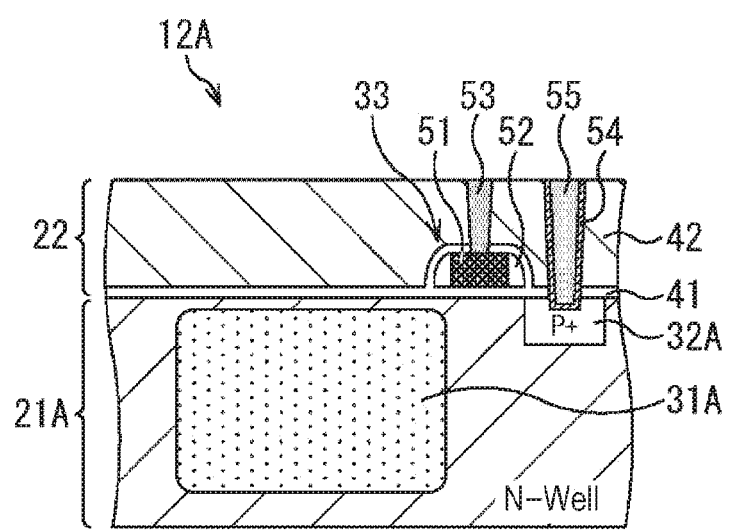
FIG. 5 is a diagram illustrating a second exemplary configuration of the pixel.

Then, FIG. 5 is a diagram illustrating a second exemplary configuration of the pixel 12. Additionally, the common components in a pixel 12A illustrated in FIG. 5 with those in the pixel 12 of FIG. 2 are denoted with the same reference numerals, and the detailed description thereof will be omitted.

The pixel 12A illustrated in FIG. 5 is different from the pixel 12 of FIG. 2 in that an N-type semiconductor substrate 21A (N-Well) is used and a PD 31A and a FD part 32A are P-type regions. That is, the pixel 12 of FIG. 2 is of electron reading type while the pixel 12A is of hole reading type.

In the thus-configured pixel 12A, the advanced contact structure can be employed in which the FD part 32A and the contact electrode 55 are connected via the high-dielectric insulative film 54 similarly as in the pixel 12 of FIG. 2. Additionally, a material suitable for the FD part 32A as P-type region is selected for the high-dielectric insulative film 54. Thereby, the P-type concentration of the FD part 32A can be lowered thereby to reduce the contact resistance and to restrict an occurrence of a dark current in the pixel 12A.

The steps of forming the pixel 12A in the method for manufacturing the solid-state image sensing device 11 will be described below with reference to FIG. 6 and FIG. 7.

Figure 6:
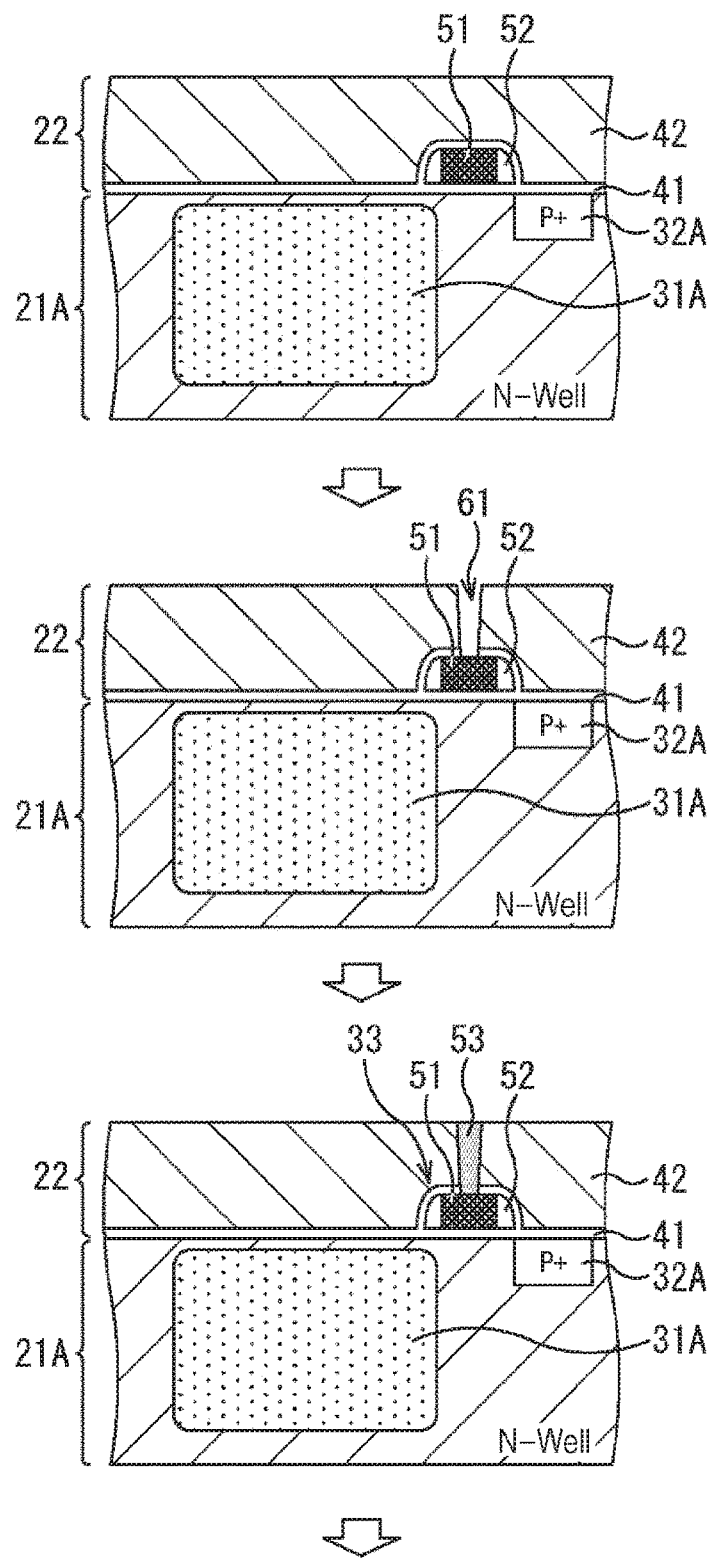
FIG. 6 is a diagram for explaining the steps of manufacturing the pixel in the second exemplary configuration.

At first, in the 11th step, as illustrated in the top stage of FIG. 6, the gate electrode 51 and the sidewall part 52 are formed on the silicon oxide film 41 formed on the surface of the semiconductor substrate 21A, a P-type impurity is ion-implanted in the N-type semiconductor substrate 21A thereby to form the PD 31A and the FD part 32A, and then the interlayer insulative film 42 is laminated.

Then in the 12th step, as illustrated in the middle stage of FIG. 6, the contact hole 61 is formed in the interlayer insulative film 42 down to the gate electrode 51. Further in the 13th step, as illustrated in the bottom stage of FIG. 6, tungsten, for example, is filled in the contact hole 61 thereby to form the contact electrode 53.

Subsequently in the 14th step, as illustrated in the top stage of FIG. 7, the contact hole 62 is formed in the interlayer insulative film 42 down to the FD part 32A. Further in the 15th step, as illustrated in the middle stage of FIG. 7, titanium dioxide, for example, is deposited thereby to form the high-dielectric insulative film 54 on the bottom and the inner peripheral face of the contact hole 62. Thereafter, in the 16th step, as illustrated in the bottom stage of FIG. 7, tungsten, for example, is filled in the contact hole 62 thereby to form the contact electrode 55, thereby forming the pixel 12A.

With the manufacturing method, it is possible to manufacture the solid-state image sensing device 11 including the pixels 12A of hole reading type in the advanced contact structure in which the FD part 32A and the contact electrode 55 are connected via the high-dielectric insulative film 54.

Figure 8:
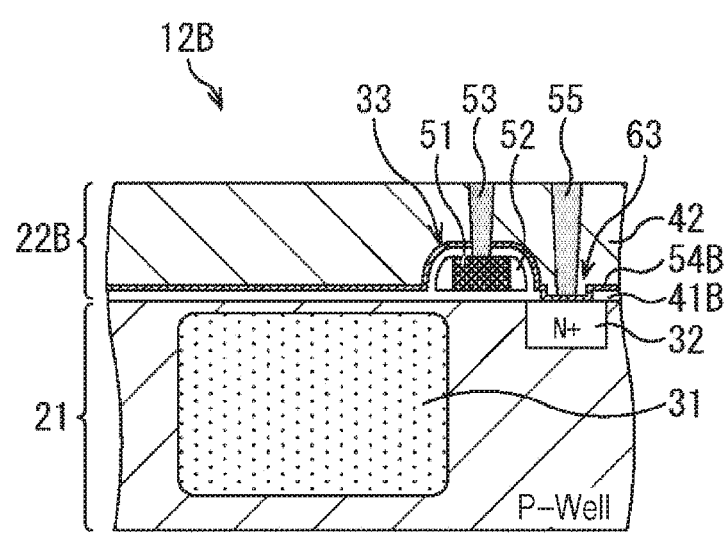
FIG. 8 is a diagram illustrating a third exemplary configuration of the pixel.

Then, FIG. 8 is a diagram illustrating a third exemplary configuration of the pixel 12. Additionally, the common components in a pixel 12B illustrated in FIG. 8 with those in the pixel 12 of FIG. 2 are denoted with the same reference numerals, and the detailed description thereof will be omitted.

As illustrated in FIG. 8, the pixel 12B is different from the pixel 12 of FIG. 2 in that an opening 63 is formed on a silicon oxide film 41B such that the FD part 32 in the semiconductor substrate 21 appears in the surface, and a high-dielectric insulative film 54B is formed on the silicon oxide film 41B and the FD part 32.

That is, the pixel 12B is structured such that the silicon oxide film 41B is formed before the contact hole 62 (FIG. 11) for forming the contact electrode 55 therein is formed, and thus the silicon oxide film 41B contacts the contact electrode 55 only between the FD part 32 and the contact electrode 55. Thereby, the pixel 12B can further reduce capacitance occurring relative to a wiring formed in a wiring layer 22B than in the configuration in which the silicon oxide film 41 is formed on the side of the contact electrode 55 similarly to the pixel 12 of FIG. 2.

Further, the pixel 12B is in the advanced contact structure in which the FD part 32 and the contact electrode 55 are connected via the high-dielectric insulative film 54B similarly to the pixel 12 of FIG. 2, thereby lowering the N-type concentration of the FD part 32 to reduce the contact resistance, and restricting an occurrence of a dark current.

Figure 10:
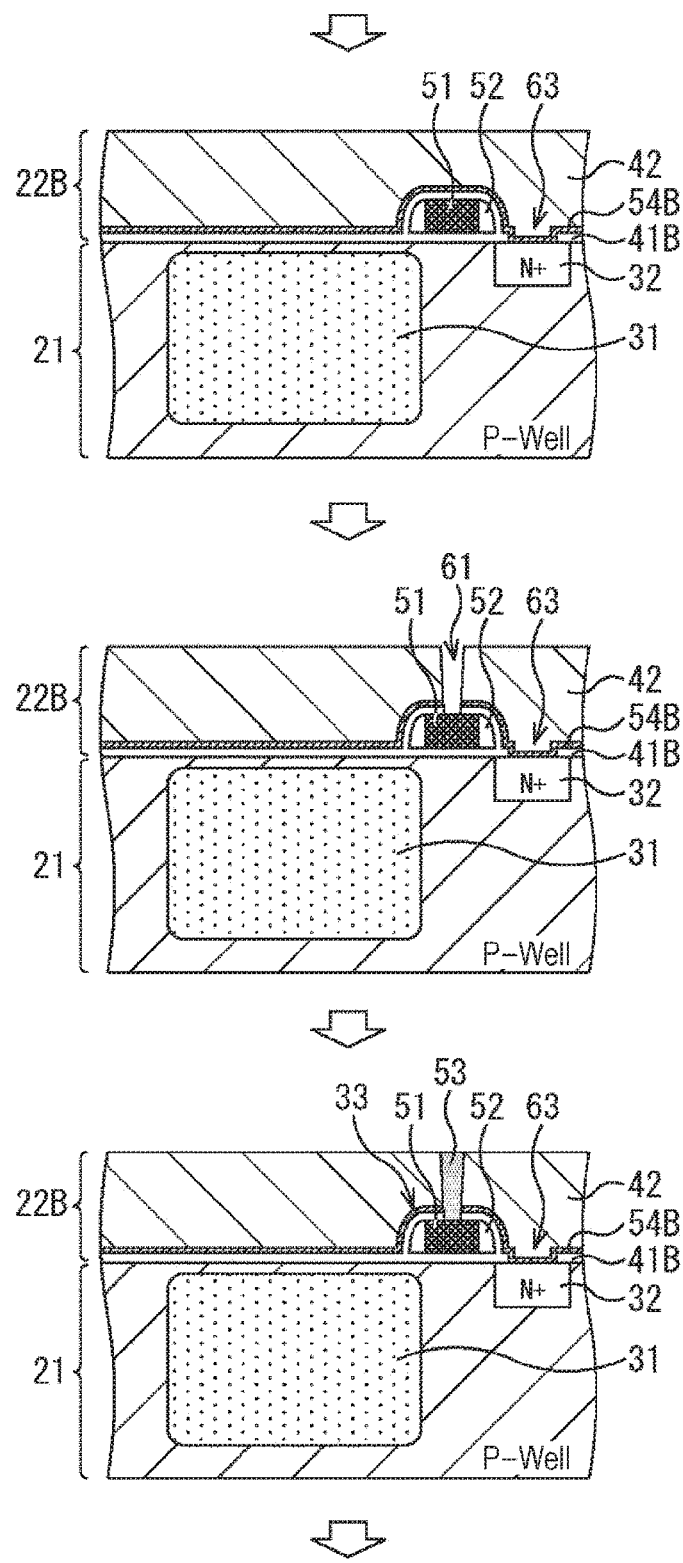
FIG. 10 is a diagram for explaining the steps of manufacturing the pixel in the third exemplary configuration.

The steps of manufacturing the pixel 12B in the method for manufacturing the solid-state image sensing device 11 will be described below with reference to FIG. 9 to FIG. 11.

At first, in the 21st step, as illustrated in the top stage of FIG. 9, the gate electrode 51 and the sidewall part 52 are formed on a silicon oxide film 41B' on the surface of the semiconductor substrate 21, and an N-type impurity is ion-implanted in the P-type semiconductor substrate 21 thereby to form the PD 31 and the FD part 32.

Further in the 22nd step, as illustrated in the middle stage of FIG. 9, the region where the FD part 32 is formed in the silicon oxide film 41B' formed on the entire surface of the semiconductor substrate 21 is etched. Thereby, the silicon oxide film 41B is formed in which the opening 63 is provided such that the FD part 32 appears on the surface of the semiconductor substrate 21.

Then in the 23rd step, as illustrated in the bottom stage of FIG. 9, titanium dioxide, for example, is deposited on the entire surface of the silicon oxide film 41B and the FD part 32 in the opening 63 thereby to form the high-dielectric insulative film 54B.

Subsequently in the 24th step, as illustrated in the top stage of FIG. 10, the interlayer insulative film 42 is formed on the silicon oxide film 41B. Further in the 25th step, as illustrated in the middle stage of FIG. 10, the contact hole 61 is formed in the interlayer insulative film 42 down to the gate electrode 51. Then in the 26th step, as illustrated in the bottom stage of FIG. 10, tungsten, for example, is filled in the contact hole 61 thereby to form the contact electrode 53.

Figure 11:
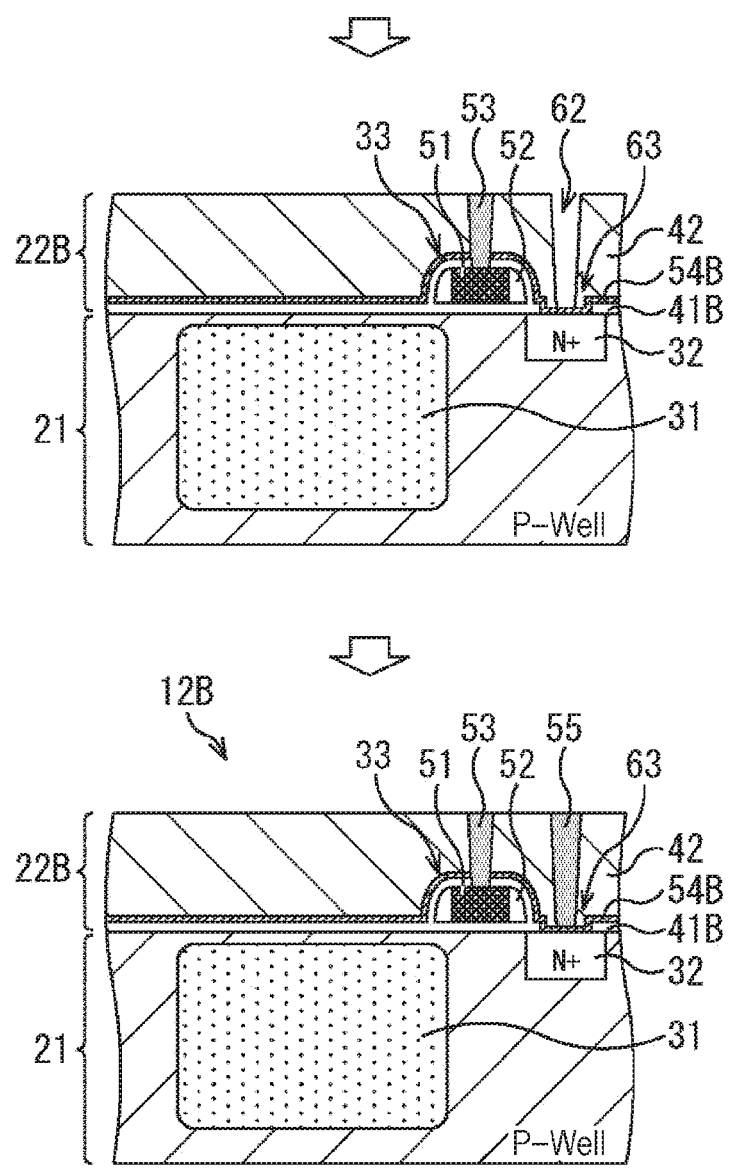
FIG. 11 is a diagram for explaining the steps of manufacturing the pixel in the third exemplary configuration.

Further in the 27th step, as illustrated in the top stage of FIG. 11, the interlayer insulative film 42 is etched to form the contact hole 62, and stops being etched on the high-dielectric insulative film 54B. Thereafter, in the 28th step, as illustrated in the bottom stage of FIG. 11, tungsten, for example, is filled in the contact hole 62 formed down to the high-dielectric insulative film 54B thereby to form the contact electrode 55, thereby forming the pixel 12B.

As described above, it is possible to manufacture the solid-state image sensing device 11 including the pixels 12B in the advanced contact structure in which the FD part 32 and the contact electrode 55 are connected via the high-dielectric insulative film 54B.

Figure 12:
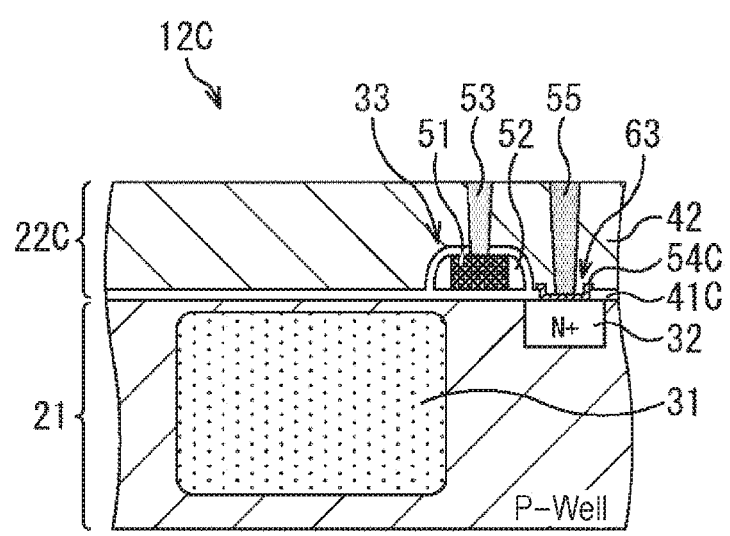
FIG. 12 is a diagram illustrating a fourth exemplary configuration of the pixel.

Then, FIG. 12 is a diagram illustrating a fourth exemplary configuration of the pixel 12. Additionally, the common components in a pixel 12C illustrated in FIG. 12 with those in the pixel 12 of FIG. 2 are denoted with the same reference numerals, and the detailed description thereof will be omitted.

As illustrated in FIG. 12, the pixel 12C is different from the pixel 12 of FIG. 2 in that the opening 63 is formed in a silicon oxide film 41C such that the FD part 32 in the semiconductor substrate 21 appears in the surface and a high-dielectric insulative film 54C is formed on the FD part 32 in the opening 63.

For example, the pixel 12B of FIG. 8 is configured such that the high-dielectric insulative film 54B is entirely formed on the silicon oxide film 41B while the pixel 12C is configured such that the high-dielectric insulative film 54C is removed except near the opening 63 on the silicon oxide film 41C. That is, the high-dielectric insulative film 54C is partially formed on at least the FD part 32 in the opening 63. In this way, the high-dielectric insulative film 54B is removed at the PD 31 as a PN junction part with a strong electric field intensity so that the pixel 12C can obtain a greater effect of alleviating an electric field than the pixel 12B. Thereby, it is possible to restrict a dark current occurring in the PD 31.

The steps of manufacturing the pixel 12C in the method for manufacturing the solid-state image sensing device 11 will be described below with reference to FIG. 13 to FIG. 15.

Figure 13:
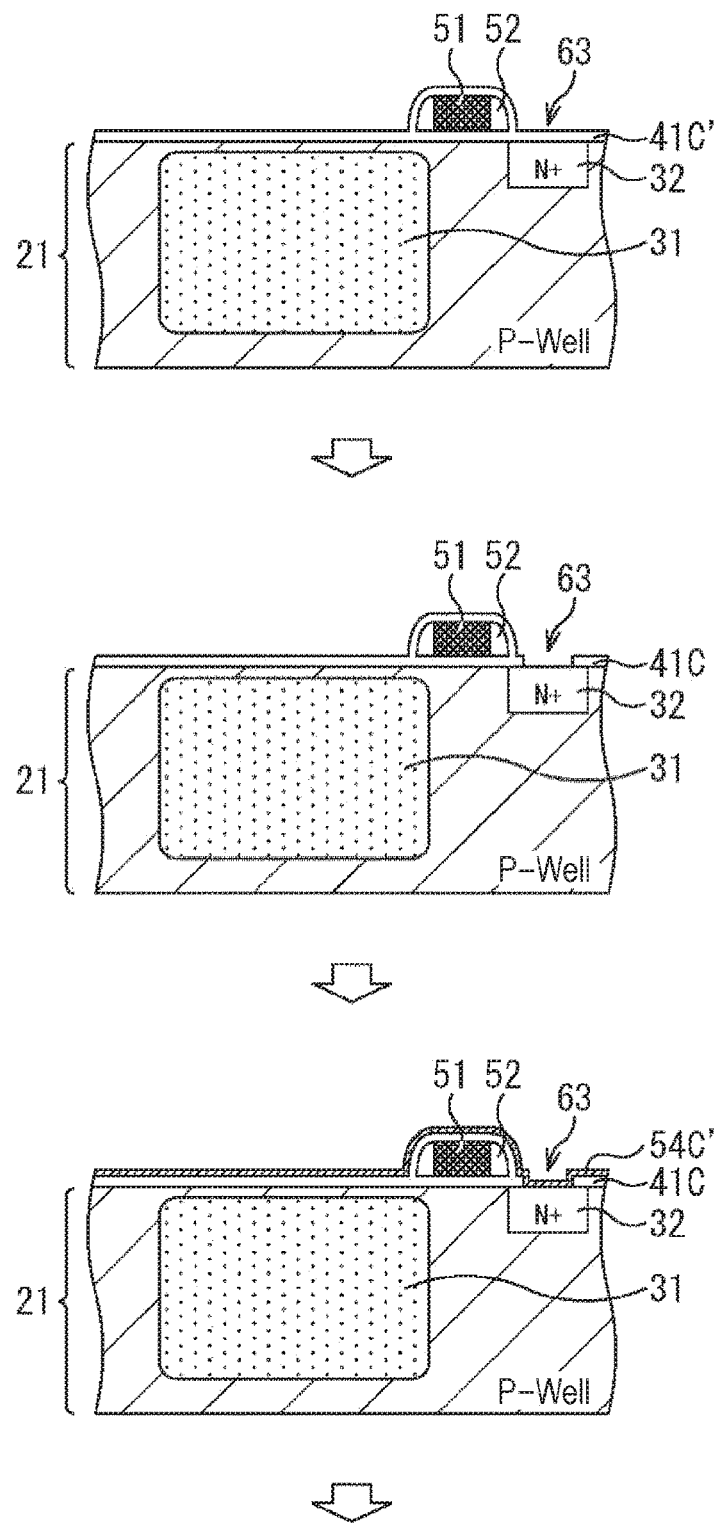
FIG. 13 is a diagram for explaining the steps of manufacturing the pixel in the fourth exemplary configuration.

At first, in the 31st step, as illustrated in the top stage of FIG. 13, the gate electrode 51 and the sidewall part 52 are formed on a silicon oxide film 41C' formed on the surface of the semiconductor substrate 21, and an N-type impurity is ion-implanted in the P-type semiconductor substrate 21 thereby to form the PD 31 and the FD part 32.

Further in the 32nd step, as illustrated in the middle stage of FIG. 13, the region where the FD part 32 is formed in the silicon oxide film 41C' formed on the entire surface of the semiconductor substrate 21 is etched. Thereby, the silicon oxide film 41C is formed in which the opening 63 is provided such that the FD part 32 appears on the surface of the semiconductor substrate 21.

Then in the 33rd step, as illustrated in the bottom stage of FIG. 13, titanium dioxide, for example, is deposited on the entire surface of the silicon oxide film 41C and the FD part 32 in the opening 63 thereby to form a high-dielectric insulative film 54C'.

Subsequently in the 34th step, as illustrated in the top stage of FIG. 14, the high-dielectric insulative film 54C' is removed except near the opening 63 on the silicon oxide film 41C thereby to form the high-dielectric insulative film 54C covering at least the FD part 32 in the opening 63.

Figure 14:
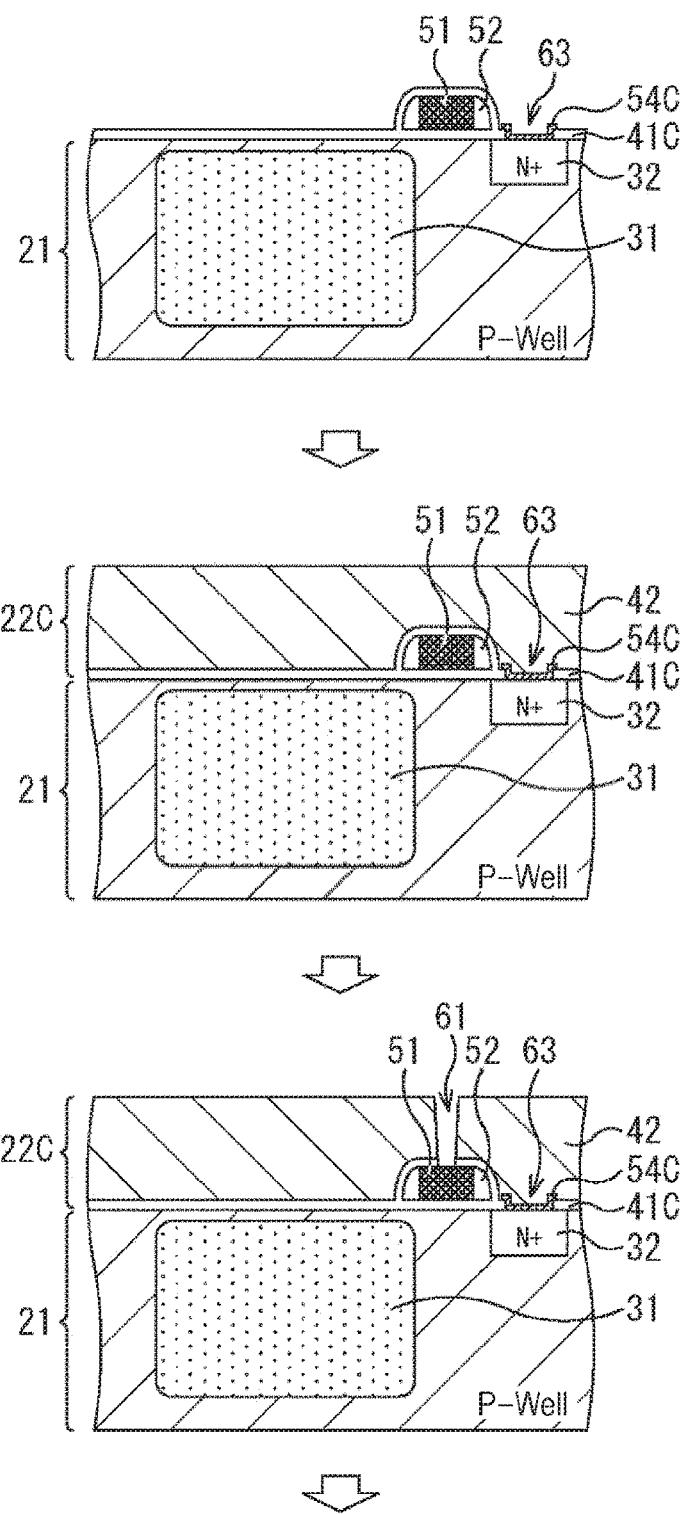
FIG. 14 is a diagram for explaining the steps of manufacturing the pixel in the fourth exemplary configuration.
Figure 15:
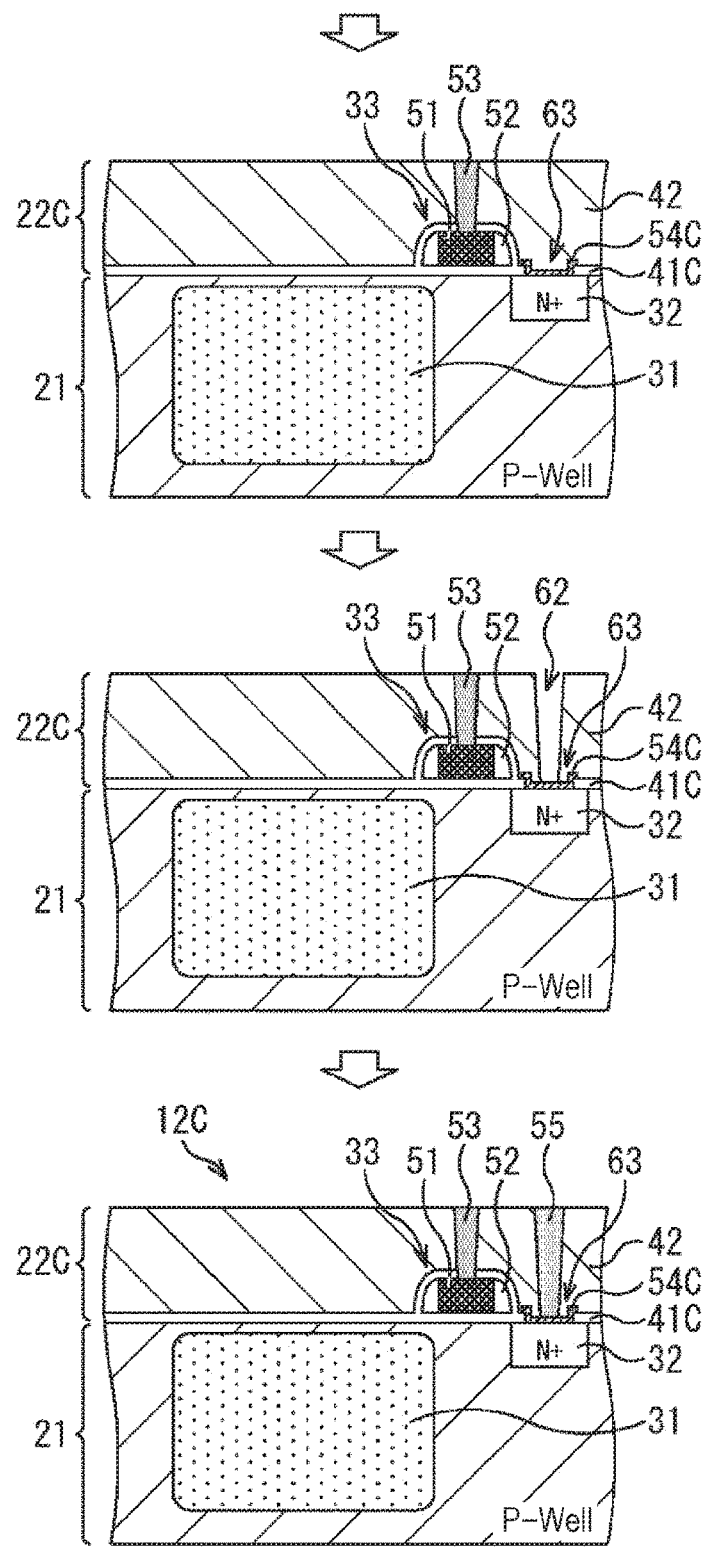
FIG. 15 is a diagram for explaining the steps of manufacturing the pixel in the fourth exemplary configuration.

Further in the 35th step, as illustrated in the middle stage of FIG. 14, the interlayer insulative film 42 is formed on the silicon oxide film 41C and the high-dielectric insulative film 54C. Then in the 36th step, as illustrated in the bottom stage of FIG. 14, the contact hole 61 is formed in the interlayer insulative film 42 down to the gate electrode 51.

Subsequently in the 37th step, as illustrated in the top stage of FIG. 15, tungsten, for example, is filled in the contact hole 61 thereby to form the contact electrode 53. Then in the 38th step, as illustrated in the middle stage of FIG. 15, the interlayer insulative film 42 is etched in order to form the contact hole 62, and stops being etched on the high-dielectric insulative film 54C. Thereafter, in the 39th step, as illustrated in the bottom stage of FIG. 15, tungsten, for example, is filled in the contact hole 62 formed down to the high-dielectric insulative film 54C thereby to form the contact electrode 55, thereby forming the pixel 12C.

As described above, it is possible to manufacture the solid-state image sensing device 11 including the pixels 12C in the advanced contact structure in which the FD part 32 and the contact electrode 55 are connected via the high-dielectric insulative film 54C.

Figure 16:
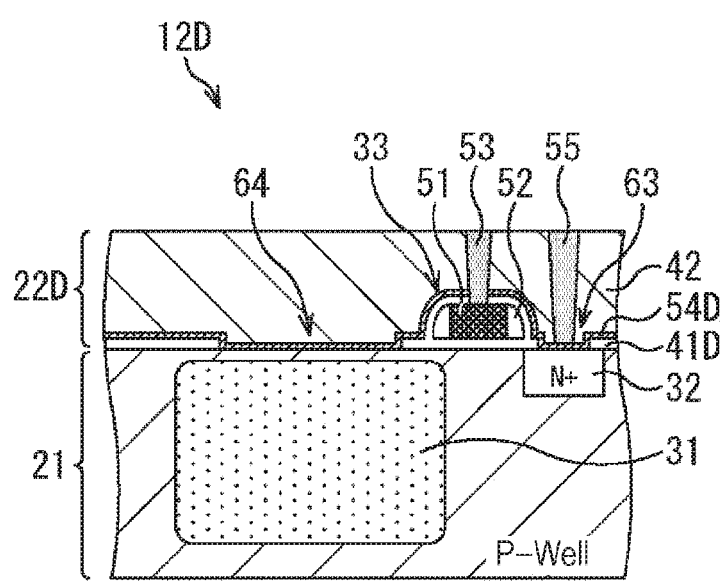
FIG. 16 is a diagram illustrating a fifth exemplary configuration of the pixel.

Then, FIG. 16 is a diagram illustrating a fifth exemplary configuration of the pixel 12. Additionally, the common components in a pixel 12D illustrated in FIG. 16 with those in the pixel 12 of FIG. 2 are denoted with the same reference numerals, and the detailed description thereof will be omitted.

As illustrated in FIG. 16, in the pixel 12D, the opening 63 is formed on a silicon oxide film 41D such that the FD part 32 in the semiconductor substrate 21 appears in the surface, and an opening 64 is formed in the silicon oxide film 41D such that the semiconductor substrate 21 corresponding to the region where the PD 31 is formed appears in the surface. Then, the pixel 12D is different from the pixel 12 of FIG. 2 in that the high-dielectric insulative film 54D is formed on the silicon oxide film 41D, the FD part 32 in the opening 63, and the semiconductor substrate 21 in the opening 64.

In this way, the high-dielectric insulative film 54D is provided on the surface of the semiconductor substrate 21 corresponding to the region where the PD 31 is formed in the pixel 12D, thereby enhancing pinning on the surface and restricting an occurrence of a white spot, a dark current in the PD 31 or the like.

Further, the pixel 12D is in the advanced contact structure in which the FD part 32 and the contact electrode 55 are connected via the high-dielectric insulative film 54D similarly to the pixel 12 of FIG. 2, thereby lowering the N-type concentration of the FD part 32 thereby to reduce the contact resistance, and restricting an occurrence of a dark current.

The steps of manufacturing the pixel 12D in the method for manufacturing the solid-state image sensing device 11 will be described below with reference to FIG. 17 to FIG. 19.

Figure 17:
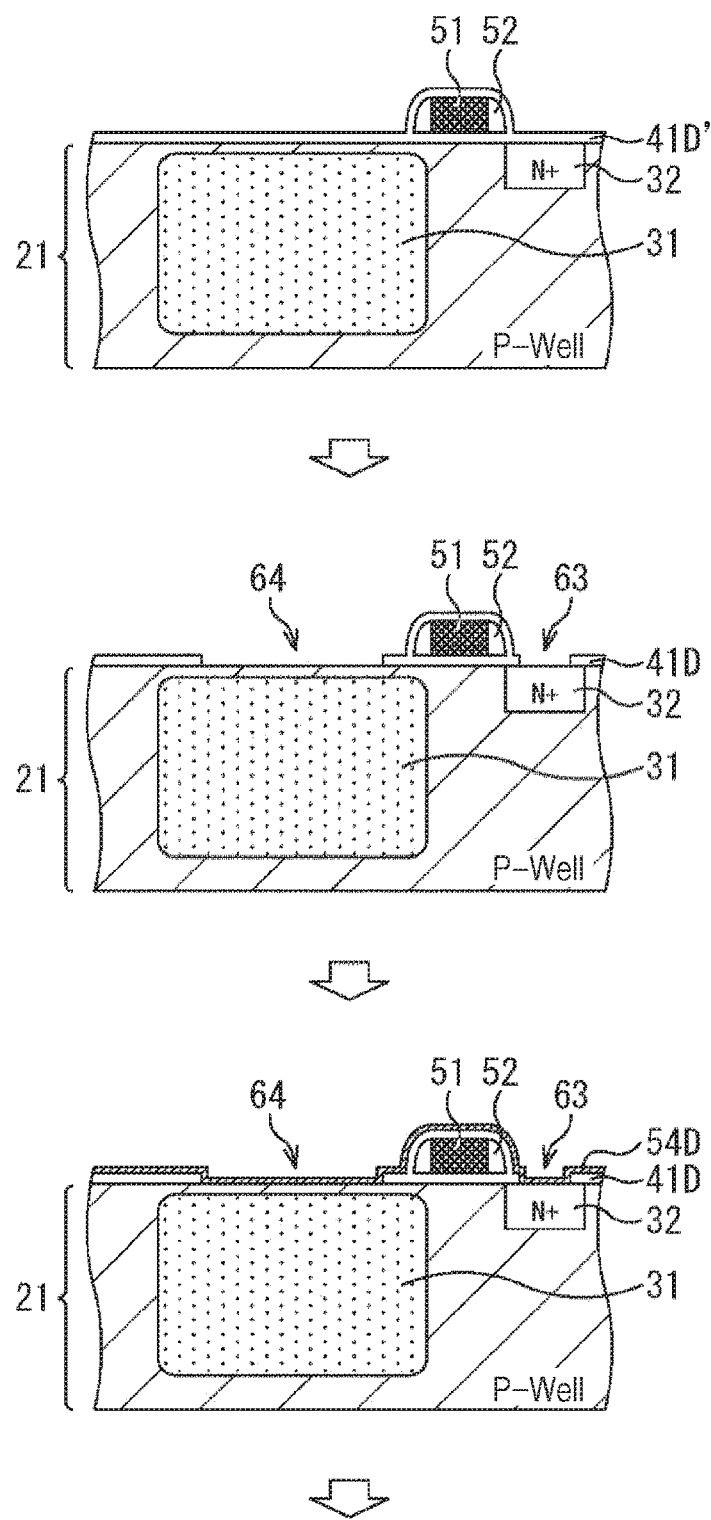
FIG. 17 is a diagram for explaining the steps of manufacturing the pixel in the fifth exemplary configuration.
Figure 18:
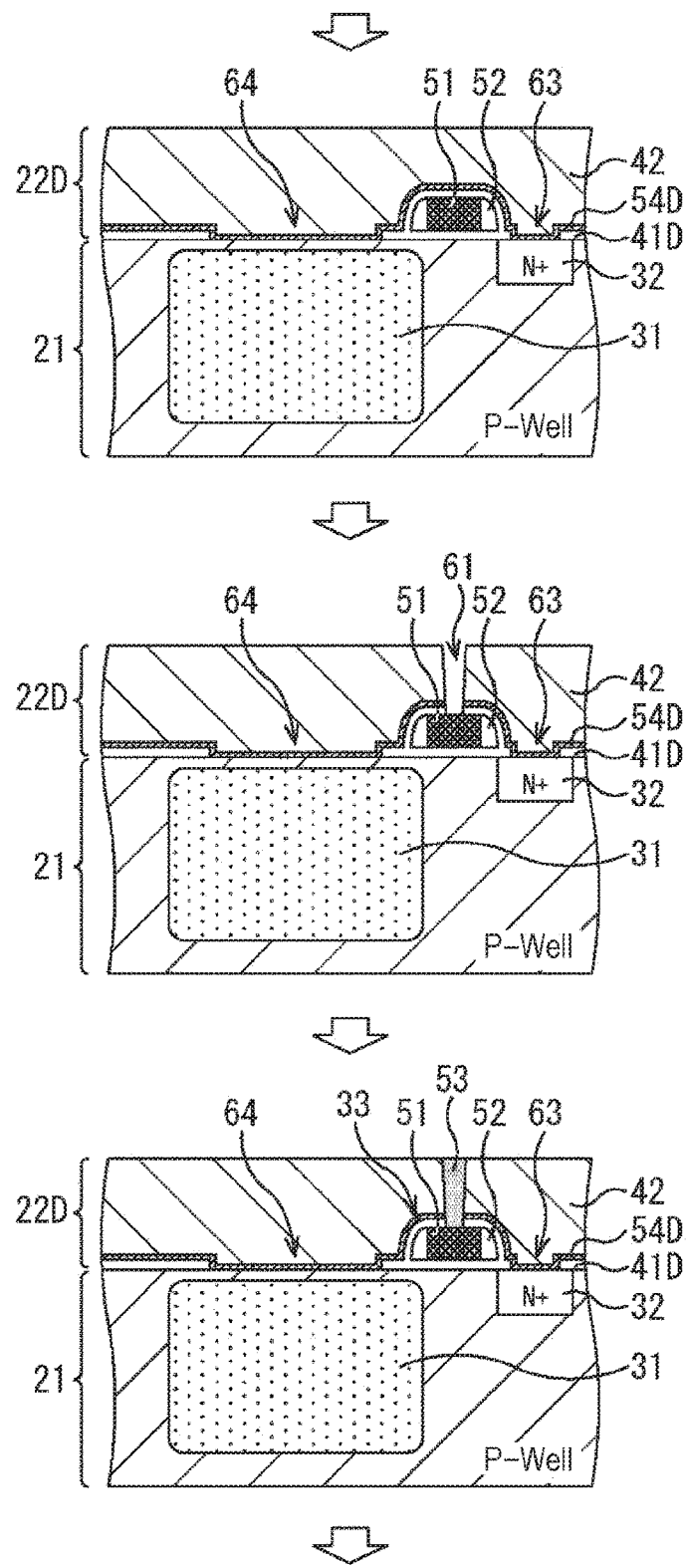
FIG. 18 is a diagram for explaining the steps of manufacturing the pixel in the fifth exemplary configuration.

At first, in the 41st step, as illustrated in the top stage of FIG. 17, the gate electrode 51 and the sidewall part 52 are formed on a silicon oxide film 41D' formed on the surface of the semiconductor substrate 21, and an N-type impurity is ion-implanted in the P-type semiconductor substrate 21 thereby to form the PD 31 and the FD part 32.

Further in the 42nd step, as illustrated in the middle stage of FIG. 17, the region where the FD part 32 is formed and the region where the PD 31 is formed are etched in the silicon oxide film 41D' formed on the entire surface of the semiconductor substrate 21. Thereby, the silicon oxide film 41D is formed in which the opening 63 is provided such that the FD part 32 appears on the surface of the semiconductor substrate 21 and the opening 64 is provided such that the semiconductor substrate 21 corresponding to the region where the PD 31 is formed appears in the surface.

Then in the 43rd step, as illustrated in the bottom stage of FIG. 17, titanium dioxide, for example, is deposited on the silicon oxide film 41D, the FD part 32 in the opening 63, and the semiconductor substrate 21 in the opening 64 thereby to entirely form the high-dielectric insulative film 54D.

Subsequently in the 44th step, as illustrated in the top stage of FIG. 18, the interlayer insulative film 42 is formed on the silicon oxide film 41D. Further in the 45th step, as illustrated in the middle stage of FIG. 18, the contact hole 61 is formed in the interlayer insulative film 42 down to the gate electrode 51. Then in the 46th step, as illustrated in the bottom stage of FIG. 18, tungsten, for example, is filled in the contact hole 61 thereby to form the contact electrode 53.

Further in the 47th step, as illustrated in the top stage of FIG. 19, the interlayer insulative film 42 is etched in order to form the contact hole 62, and stops being etched on the high-dielectric insulative film 54D. Thereafter, in the 48th step, as illustrated in the bottom stage of FIG. 19, tungsten, for example, is filled in the contact hole 62 formed down to the high-dielectric insulative film 54D thereby to form the contact electrode 55, thereby forming the pixel 12D.

As described above, it is possible to manufacture the solid-state image sensing device 11 including the pixels 12D in the advanced contact structure in which the FD part 32 and the contact electrode 55 are connected via the high-dielectric insulative film 54D. Further, the high-dielectric insulative film 54D is formed on the FD part 32 in the opening 63 and the semiconductor substrate 21 in the opening 64 at the same time, thereby configuring the advanced contact structure in as many steps as for the pixel 12B of FIG. 8, for example.

Figure 20:
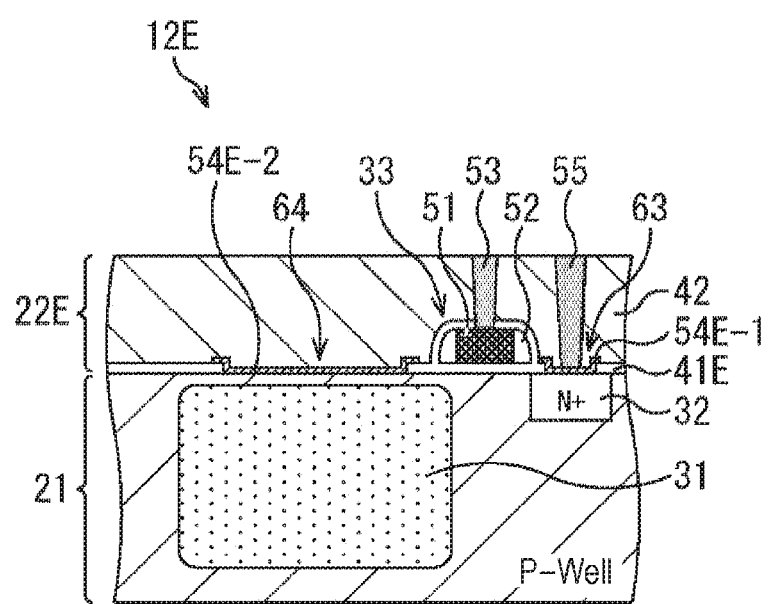
FIG. 20 is a diagram illustrating a sixth exemplary configuration of the pixel.

Then, FIG. 20 is a diagram illustrating a sixth exemplary configuration of the pixel 12. Additionally, the common components in a pixel 12E illustrated in FIG. 20 with those in the pixel 12 of FIG. 2 are denoted with the same reference numerals, and the detailed description thereof will be omitted.

As illustrated in FIG. 20, in the pixel 12E, the opening 63 is formed in a silicon oxide film 41E such that the FD part 32 in the semiconductor substrate 21 appears in the surface, and the opening 64 is formed in the silicon oxide film 41E such that the semiconductor substrate 21 corresponding to the region where the PD 31 is formed appears in the surface. Then, the pixel 12E is different from the pixel 12 of FIG. 2 in that a high-dielectric insulative film 54E-1 is formed on the FD part 32 in the opening 63 and a high-dielectric insulative film 54E-2 is formed on the semiconductor substrate 21 in the opening 64.

For example, the high-dielectric insulative film 54B is entirely formed on the silicon oxide film 41D in the pixel 12D of FIG. 16, while the high-dielectric insulative film formed except near the opening 63 and the opening 64 in the silicon oxide film 41E is removed in the pixel 12E. That is, the high-dielectric insulative film 54E-1 is partially formed on at least the FD part 32 in the opening 63, and the high-dielectric insulative film 54E-2 is partially formed on at least the semiconductor substrate 21 in the opening 64. In this way, the high-dielectric insulative film 54E on the PD 31 as a PN junction part with a strong electric field intensity is removed so that the pixel 12E can obtain a greater effect of alleviating an electric field than the pixel 12D. Thereby, it is possible to restrict a dark current occurring in the PD 31.

The steps of manufacturing the pixel 12E in the method for manufacturing the solid-state image sensing device 11 will be described below with reference to FIG. 21 to FIG. 23.

At first, in the 51st step, as illustrated in the top stage of FIG. 21, the gate electrode 51 and the sidewall part 52 are formed on a silicon oxide film 41E' formed on the surface of the semiconductor substrate 21, and an N-type impurity is ion-implanted in the P-type semiconductor substrate 21 thereby to form the PD 31 and the FD part 32.

Further in the 52nd step, as illustrated in the middle stage of FIG. 21, the region where the FD part 32 is formed and the region where the PD 31 is formed in the silicon oxide film 41E' formed on the entire surface of the semiconductor substrate 21 are etched. Thereby, the silicon oxide film 41E is formed in which the opening 63 is provided such that the FD part 32 appears on the surface of the semiconductor substrate 21 and the opening 64 is provided such that the semiconductor substrate 21 corresponding to the region where the PD 31 is formed appears in the surface.

Then in the 53rd step, as illustrated in the bottom stage of FIG. 21, titanium dioxide, for example, is deposited on the silicon oxide film 41E, the FD part 32 in the opening 63, and the semiconductor substrate 21 in the opening 64 thereby to entirely form a high-dielectric insulative film 54E'.

Subsequently in the 54th step, as illustrated in the top stage of FIG. 22, the high-dielectric insulative film 54E' is removed except near the opening 63 and the opening 64 in the silicon oxide film 41E. Thereby, the high-dielectric insulative film 54E-1 covering at least the FD part 32 in the opening 63 and the high-dielectric insulative film 54E-2 covering at least the semiconductor substrate 21 in the opening 64 are formed.

Further in the 55th step, as illustrated in the middle stage of FIG. 22, the interlayer insulative film 42 is formed on the silicon oxide film 41E and the high-dielectric insulative films 54E-1 and 54E-2. Then in the 56th step, as illustrated in the bottom stage of FIG. 22, the contact hole 61 is formed in the interlayer insulative film 42 down to the gate electrode 51.

Subsequently in the 57th step, as illustrated in the top stage of FIG. 23, tungsten, for example, is filled in the contact hole 61 thereby to form the contact electrode 53. Then in the 58th step, as illustrated in the middle stage of FIG. 23, the interlayer insulative film 42 is etched in order to form the contact hole 62, and stops being etched on the high-dielectric insulative film 54E-1. Thereafter, in the 59th step, as illustrated in the bottom stage of FIG. 23, tungsten, for example, is filled in the contact hole 62 formed down to the high-dielectric insulative film 54E-1 thereby to form the contact electrode 55, thereby forming the pixel 12E.

As described above, it is possible to manufacture the solid-state image sensing device 11 including the pixels 12E in the advanced contact structure in which the FD part 32 and the contact electrode 55 are connected via the high-dielectric insulative film 54E-1. Further, the high-dielectric insulative film 54E' is formed on the FD part 32 in the opening 63 and the semiconductor substrate 21 in the opening 64 at the same time, thereby configuring the advanced contact structure in as many steps as for the pixel 12C of FIG. 12, for example.

Figure 24:
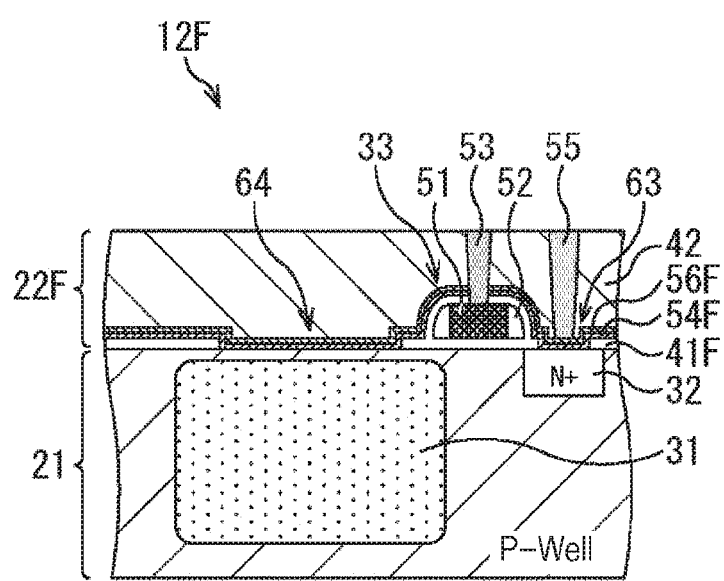
FIG. 24 is a diagram illustrating a seventh exemplary configuration of the pixel.

Then, FIG. 24 is a diagram illustrating a seventh exemplary configuration of the pixel 12. Additionally, the common components in a pixel 12F illustrated in FIG. 24 with those in the pixel 12 of FIG. 2 are denoted with the same reference numerals, and the detailed description thereof will be omitted.

As illustrated in FIG. 24, in the pixel 12F, the opening 63 is formed on a silicon oxide film 41F such that the FD part 32 in the semiconductor substrate 21 appears in the surface and the opening 64 is formed on the silicon oxide film 41F such that the semiconductor substrate 21 corresponding to the region where the PD 31 is formed appears in the surface. Then, the pixel 12F is different from the pixel 12 of FIG. 2 in that a high-dielectric insulative film 54F is formed on the silicon oxide film 41F, the FD part 32 in the opening 63, and the semiconductor substrate 21 in the opening 64 and a high-dielectric insulative film 56F is further formed on the high-dielectric insulative film 54F. That is, the high-dielectric insulative film 54 is formed in a single layer in the pixel 12 while the high-dielectric insulative film 54F and the high-dielectric insulative film 56F using different materials, respectively, are formed in two layers in the pixel 12F.

In this way, the pixel 12F is configured such that a plurality of layers of high-dielectric insulative films are laminated or the high-dielectric insulative film 54F including $TiO_2$ or the like and the high-dielectric insulative film 56F including $HfO_2$, $Al_2O_3$, or the like are laminated, for example. Thereby, pinning on the FD part 32 can be further enhanced in the pixel 12F than in the pixel 12D of FIG. 16, for example. Further, the pixel 12F can obtain the effect of alleviating an electric field by partially removing the silicon oxide film 41F similarly to the pixel 12B of FIG. 8 and the pixel 12E of FIG. 20. Thereby, it is possible to restrict a dark current occurring in the PD 31.

The steps of manufacturing the pixel 12F in the method for manufacturing the solid-state image sensing device 11 will be described below with reference to FIG. 25 to FIG. 27.

Figure 25:
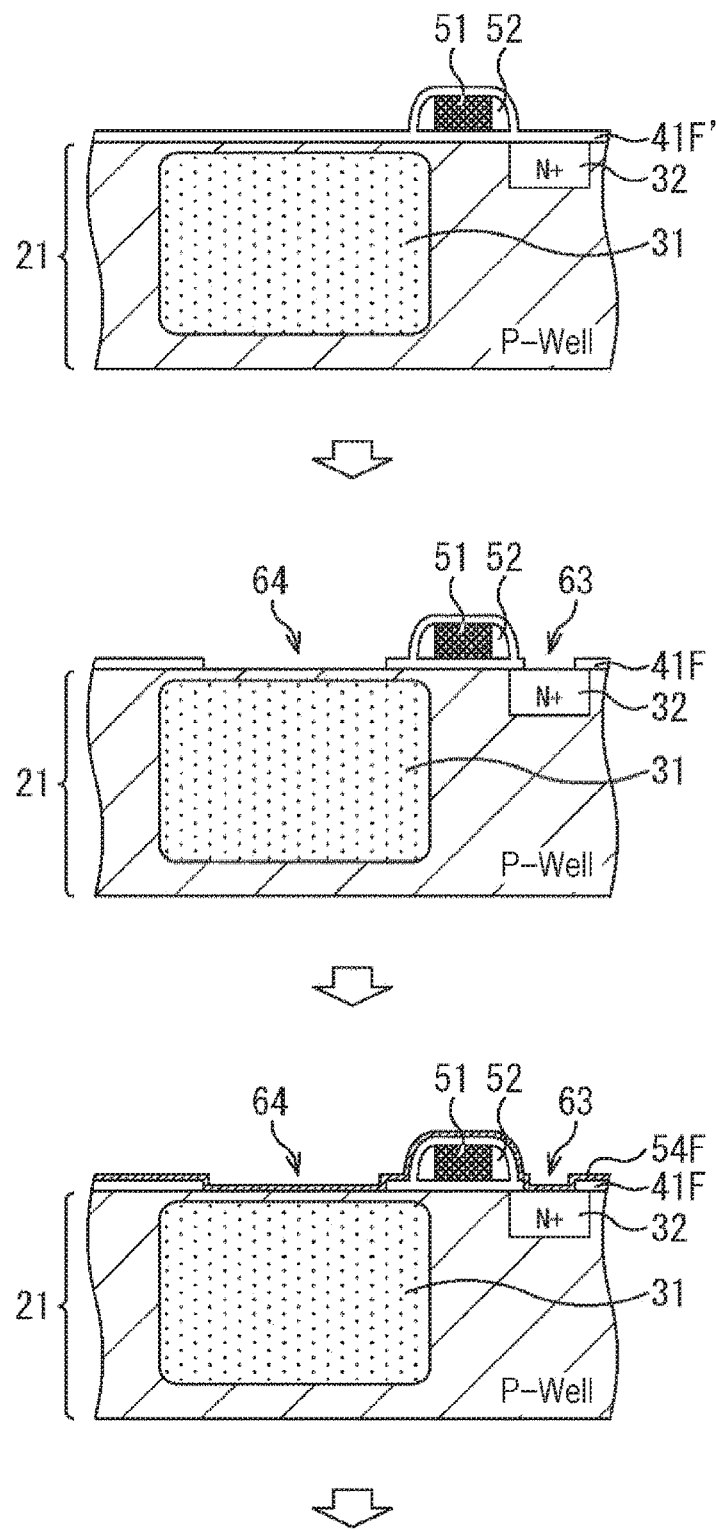
FIG. 25 is a diagram for explaining the steps of manufacturing the pixel in the seventh exemplary configuration.

At first, in the 61st step, as illustrated in the top stage of FIG. 25, the gate electrode 51 and the sidewall part 52 are formed on a silicon oxide film 41F' formed on the surface of the semiconductor substrate 21, and an N-type impurity is ion-implanted in the P-type semiconductor substrate 21 thereby to form the PD 31 and the FD part 32.

Further in the 62nd step, as illustrated in the middle stage of FIG. 25, the region where the FD part 32 is formed and the region where the PD 31 is formed in the silicon oxide film 41F' formed on the entire surface of the semiconductor substrate 21 are etched. Thereby, the silicon oxide film 41F is formed in which the opening 63 is provided such that the FD part 32 appears on the surface of the semiconductor substrate 21 and the opening 64 is provided such that the semiconductor substrate 21 corresponding to the region where the PD 31 is formed appears in the surface.

Then in the 63rd step, as illustrated in the bottom stage of FIG. 25, titanium dioxide, for example, is deposited on the silicon oxide film 41F, the FD part 32 in the opening 63, and the semiconductor substrate 21 in the opening 64 thereby to entirely form the high-dielectric insulative film 54F.

Subsequently in the 64th step, as illustrated in the top stage of FIG. 26, hafnium oxide, for example, is deposited on the high-dielectric insulative film 54F thereby to form the high-dielectric insulative film 56F.

Figure 26:
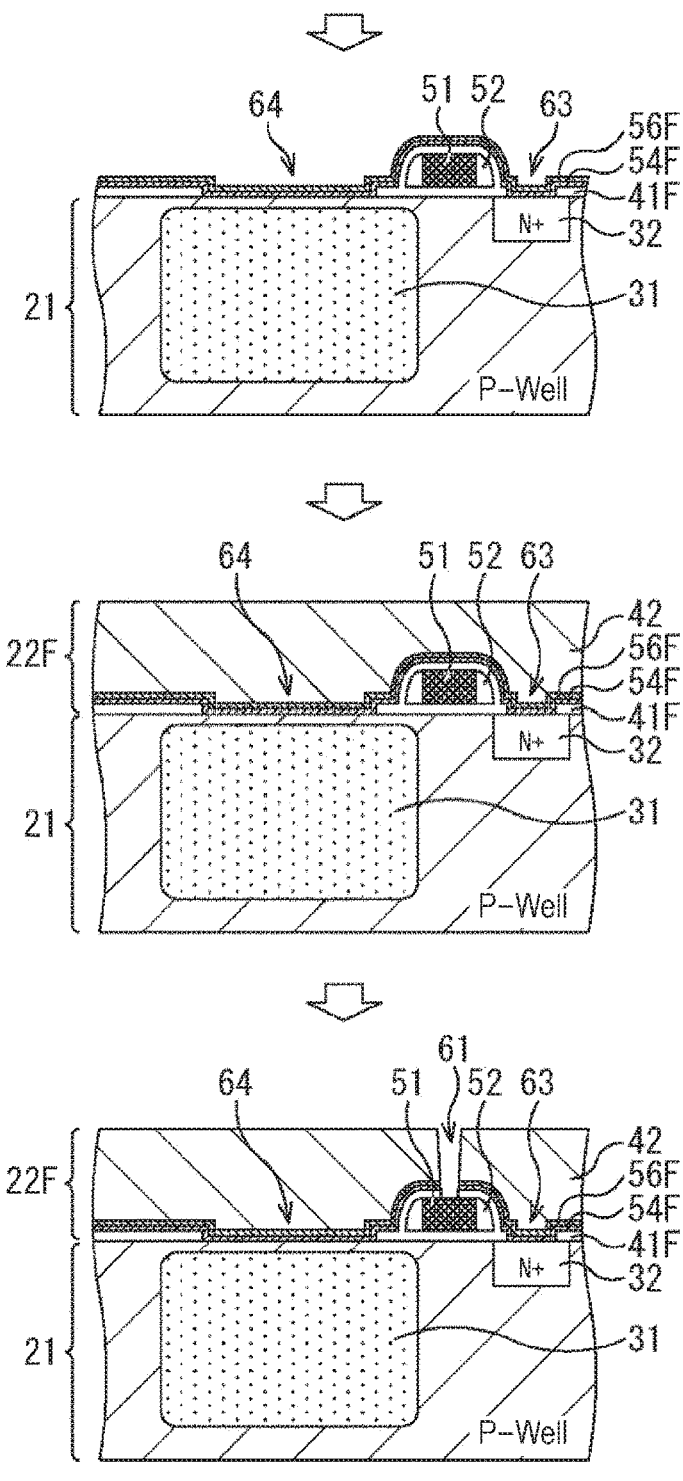
FIG. 26 is a diagram for explaining the steps of manufacturing the pixel in the seventh exemplary configuration.
Figure 27:
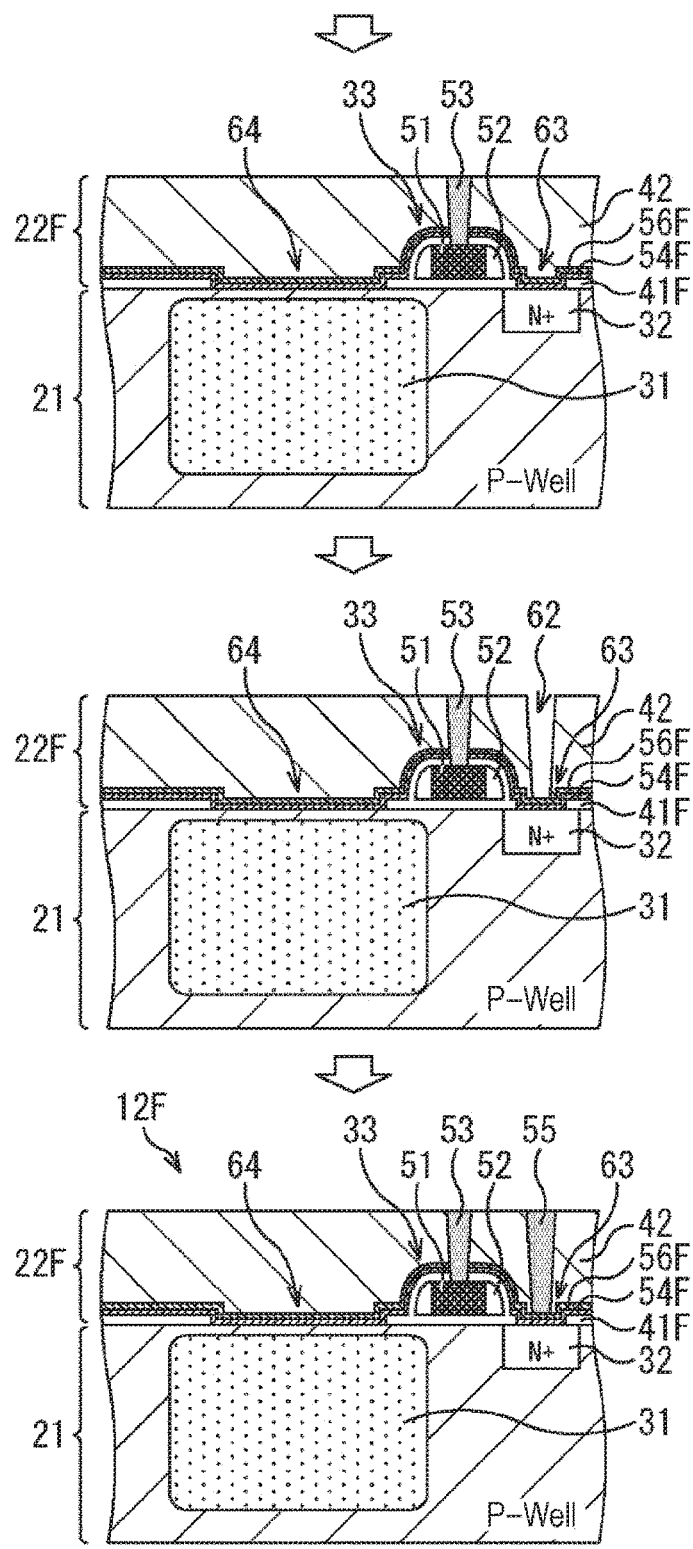
FIG. 27 is a diagram for explaining the steps of manufacturing the pixel in the seventh exemplary configuration.

Further in the 65th step, as illustrated in the middle stage of FIG. 26, the interlayer insulative film 42 is formed on the high-dielectric insulative film 56F. Then in the 66th step, as illustrated in the bottom stage of FIG. 26, the contact hole 61 is formed in the interlayer insulative film 42 down to the gate electrode 51.

Subsequently in the 67th step, as illustrated in the top stage of FIG. 27, tungsten, for example, is filled in the contact hole 61 thereby to form the contact electrode 53. Then in the 68th step, as illustrated in the middle stage of FIG. 27, the interlayer insulative film 42 is etched in order to form the contact hole 62, and stops being etched on the high-dielectric insulative film 54F. Thereafter, in the 69th step, as illustrated in the bottom stage of FIG. 23, tungsten, for example, is filled in the contact hole 62 formed down to the high-dielectric insulative film 54F thereby to form the contact electrode 55, thereby forming the pixel 12F.

As described above, it is possible to manufacture the solid-state image sensing device 11 including the pixels 12F in the advanced contact structure in which the FD part 32 and the contact electrode 55 are connected via the high-dielectric insulative film 54F and the high-dielectric insulative film 56F. Further, the effect of alleviating an electric field can be obtained in the configuration in which the high-dielectric insulative film 54F and the high-dielectric insulative film 56F are partially removed similarly as in the pixel 12C of FIG. 12 and the pixel 12E of FIG. 20.

Figure 28:
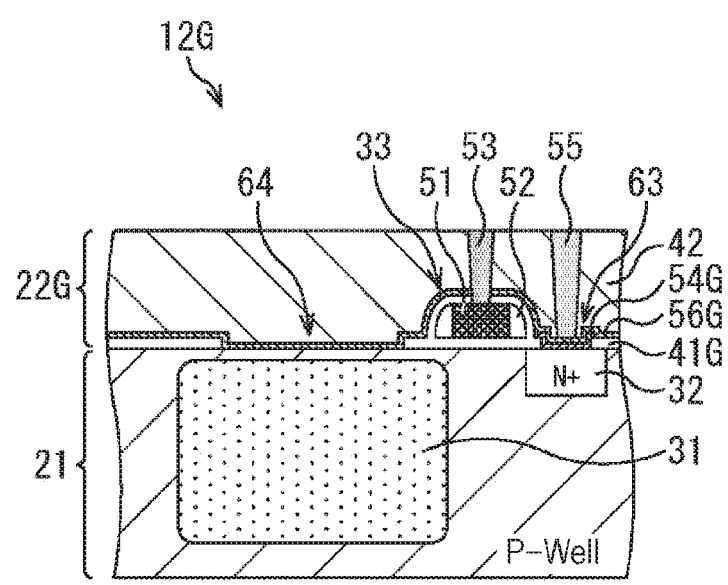
FIG. 28 is a diagram illustrating an eighth exemplary configuration of the pixel.

Then, FIG. 28 is a diagram illustrating an eighth exemplary configuration of the pixel 12. Additionally, the common components in a pixel 12G illustrated in FIG. 28 with those in the pixel 12 of FIG. 2 are denoted with the same reference numerals, and the detailed description thereof will be omitted.

As illustrated in FIG. 28, in the pixel 12G, the opening 63 is formed on a silicon oxide film 41G such that the FD part 32 in the semiconductor substrate 21 appears in the surface and the opening 64 is formed on the silicon oxide film 41G such that the semiconductor substrate 21 corresponding to the region where the PD 31 is formed appears in the surface.

Then, the pixel 12G is different from the pixel 12 of FIG. 2 in that a high-dielectric insulative film 54G is formed on the FD part 32 in the opening 63 and a high-dielectric insulative film 56G is formed on the silicon oxide film 41G, the high-dielectric insulative film 54G, and the semiconductor substrate 21 in the opening 64.

That is, in the pixel 12G, the high-dielectric insulative film 54G including TiO2 or the like and suitable for reducing the contact resistance (schottky barrier height) can be used for the FD part 32 and the high-dielectric insulative film 56G including HfO2, Al2O3, or the like and suitable for enhancing pinning (with high pinning strength) can be used for the PD 31. Further, the effect of alleviating an electric field can be obtained in the configuration in which the high-dielectric insulative film 54G and the high-dielectric insulative film 56G are partially removed similarly as in the pixel 12C of FIG. 12 and the pixel 12E of FIG. 20.

The steps of manufacturing the pixel 12G in the method for manufacturing the solid-state image sensing device 11 will be described below with reference to FIG. 29 to FIG. 31.

At first, in the 71st step, as illustrated in the top stage of FIG. 29, the gate electrode 51 and the sidewall part 52 are formed on a silicon oxide film 41G' formed on the surface of the semiconductor substrate 21, and an N-type impurity is ion-implanted in the P-type semiconductor substrate 21 thereby to form the PD 31 and the FD part 32.

Further in the 72nd step, as illustrated in the middle stage of FIG. 29, the region where the FD part 32 is formed in the silicon oxide film 41G' formed on the entire surface of the semiconductor substrate 21 is etched. Thereby, the silicon oxide film 41G is formed in which the opening 63 is formed such that the FD part 32 appears on the surface of the semiconductor substrate 21.

Then in the 73rd step, as illustrated in the bottom stage of FIG. 29, titanium dioxide, for example, is deposited on the silicon oxide film 41G and the FD part 32 in the opening 63 thereby to form a high-dielectric insulative film 54G'.

Subsequently in the 74th step, as illustrated in the top stage of FIG. 30, the high-dielectric insulative film 54G' is removed except near the opening 63 on the silicon oxide film 41G thereby to form the high-dielectric insulative film 54G covering at least the FD part 32 in the opening 63.

Figure 30:
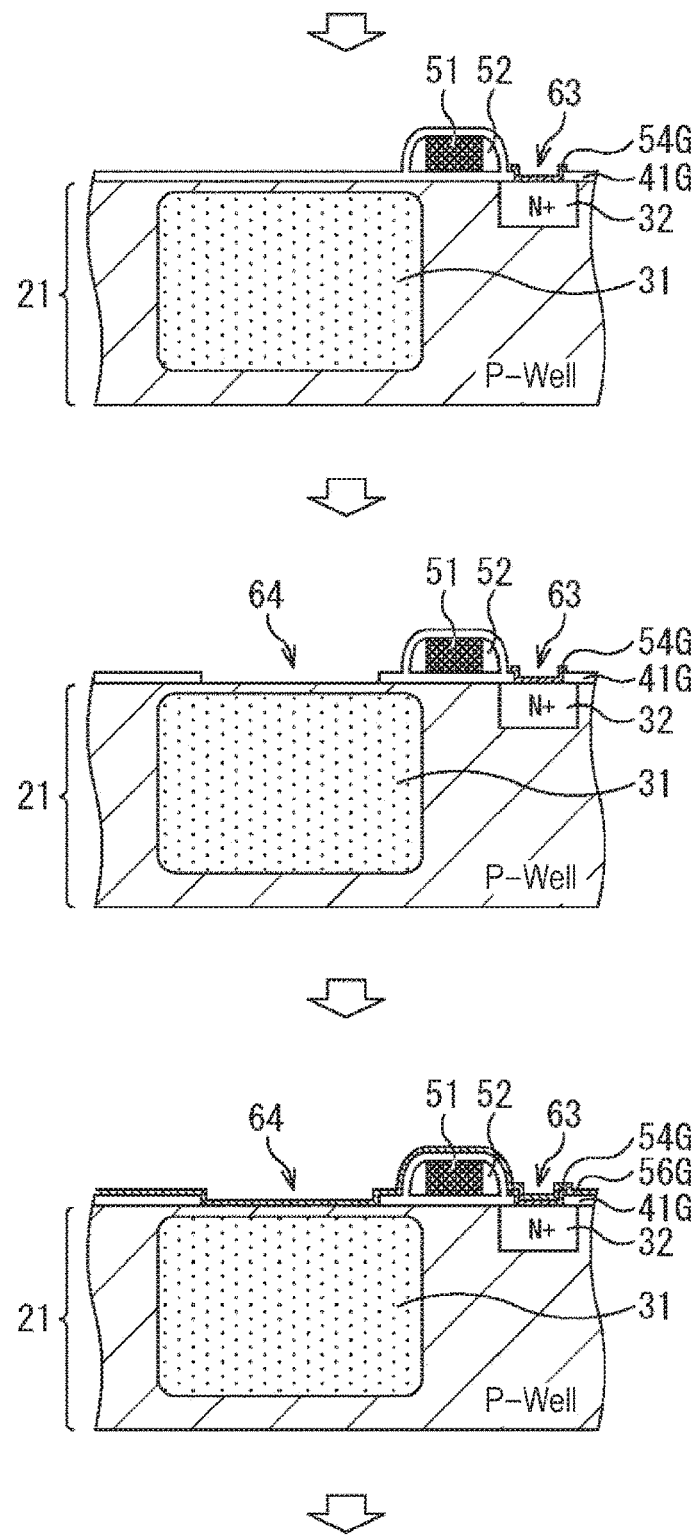
FIG. 30 is a diagram for explaining the steps of manufacturing the pixel in the eighth exemplary configuration.
Figure 31:
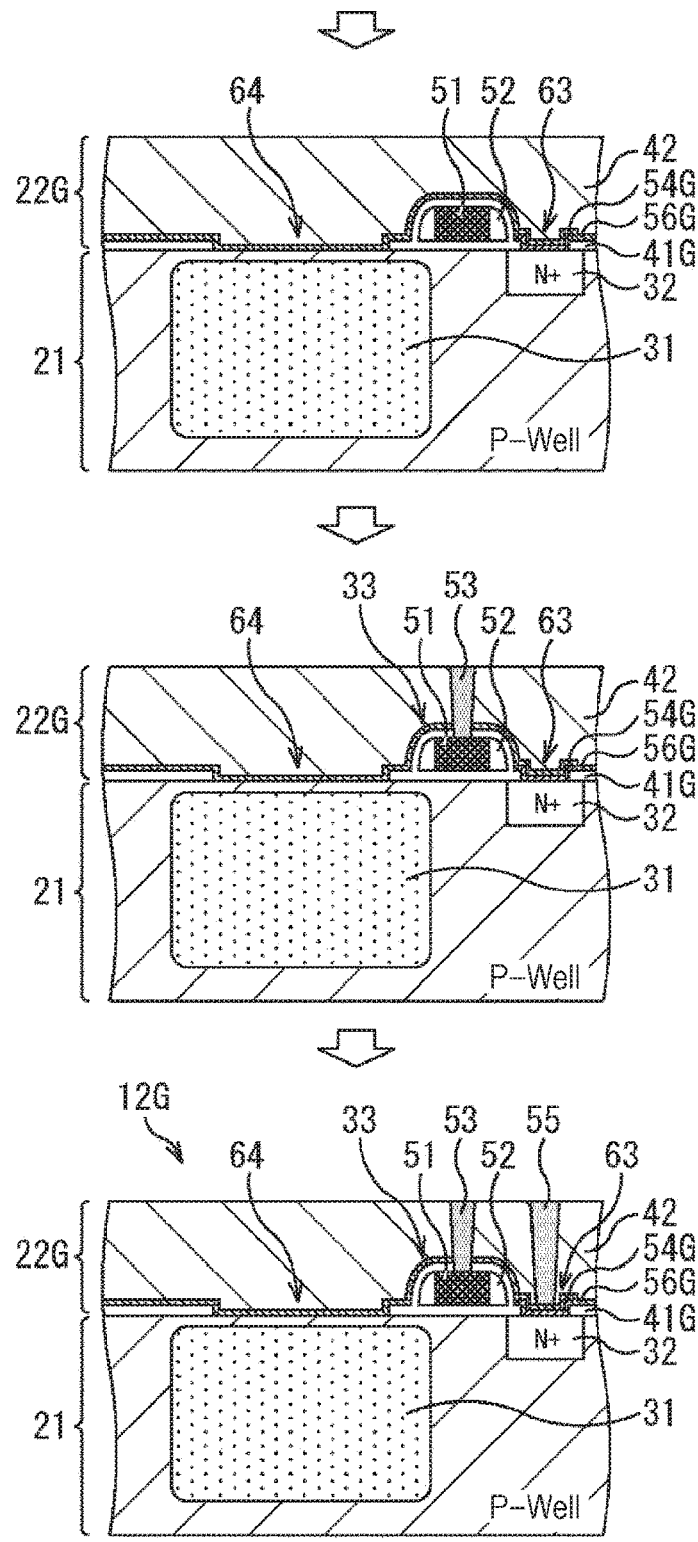
FIG. 31 is a diagram for explaining the steps of manufacturing the pixel in the eighth exemplary configuration.

Further in the 75th step, as illustrated in the middle stage of FIG. 30, the region where the PD 31 is formed in the silicon oxide film 41G formed on the entire surface of the semiconductor substrate 21 is etched. Thereby, the silicon oxide film 41G is formed in which the opening 64 is provided such that the semiconductor substrate 21 corresponding to the region where the PD 31 is formed appears in the surface.

Then in the 76th step, as illustrated in the bottom stage of FIG. 30, hafnium oxide, for example, is entirely deposited on the silicon oxide film 41G, the high-dielectric insulative film 54G, and the semiconductor substrate 21 in the opening 64 thereby to form the high-dielectric insulative film 56G.

Subsequently in the 77th step, as illustrated in the top stage of FIG. 31, the interlayer insulative film 42 is formed on the high-dielectric insulative film 56G. Further in the 78th step, as illustrated in the middle stage of FIG. 31, a contact hole (not illustrated) is formed, and then the contact electrode 53 is formed. Thereafter, in the 79th step, as illustrated in the bottom stage of FIG. 31, a contact hole (not illustrated) is formed, and then the contact electrode 55 is formed, thereby forming the pixel 12G.

As described above, it is possible to manufacture the solid-state image sensing device 11 including the pixels 12G in the advanced contact structure in which the FD part 32 and the contact electrode 55 are connected via the high-dielectric insulative film 54G. Further, the effect of alleviating an electric field can be obtained in the configuration in which the high-dielectric insulative film 54G and the high-dielectric insulative film 56G are partially removed similarly as in the pixel 12C of FIG. 12 and the pixel 12E of FIG. 20.

Additionally, the above advanced contact structure can be employed for the solid-state image sensing device 11 of surface irradiation type, the solid-state image sensing device 11 of backside irradiation type, or the solid-state image sensing device 11 of laminated type, for example.

Figure 32:
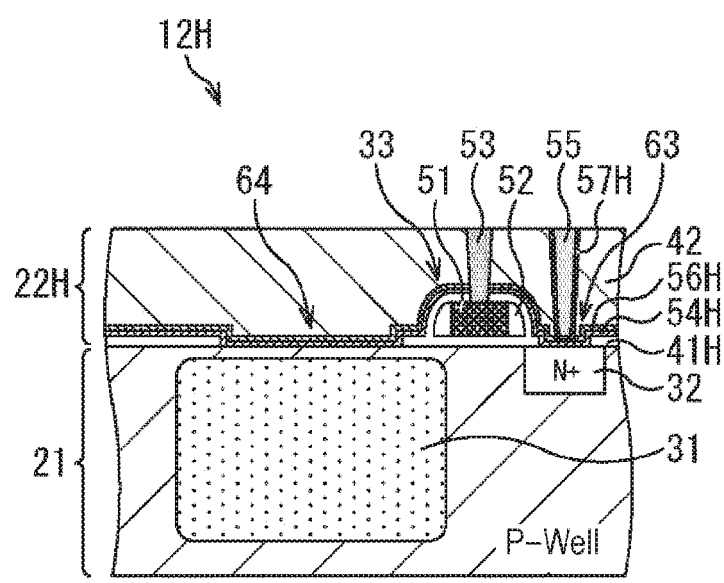
FIG. 32 is a diagram illustrating a ninth exemplary configuration of the pixel.

Then, FIG. 32 is a diagram illustrating a ninth exemplary configuration of the pixel 12. Additionally, the common components in a pixel 12H illustrated in FIG. 32 with those in the pixel 12 of FIG. 2 are denoted with the same reference numerals, and the detailed description thereof will be omitted.

As illustrated in FIG. 32, in the pixel 12H, the opening 63 is formed on a silicon oxide film 41H such that the FD part 32 in the semiconductor substrate 21 appears in the surface and the opening 64 is formed on the silicon oxide film 41H such that the semiconductor substrate 21 corresponding to the region where the PD 31 is formed appears in the surface. Then in the pixel 12H, a high-dielectric insulative film 54H which restricts Fermi-level pinning and has small band offset relative to the N-type silicon is formed as a first insulative film on at least the FD part 32 in the opening 63 and the semiconductor substrate 21 in the opening 64. Further, the pixel 12H is different from the pixel 12 of FIG. 2 in that a fixed charge film 56H with negative fixed charges is formed as a second insulative film on the high-dielectric insulative film 54H. That is, in the pixel 12H, the layer structure of the FD part 32 is different from the layer structure on the surface of the semiconductor substrate 21 corresponding to the region where the PD 31 is formed.

Further, a barrier metal 57H is formed to cover the contact electrode 55 in the pixel 12H.

Here, the high-dielectric insulative film 54H and the fixed charge film 56H are formed by using the atomic layer deposition (ALD) method, the metal organic chemical vapor deposition (MOCVD) method, the physical vapor deposition (PVD) method, or the like, for example.

For example, the high-dielectric insulative film 54H is an oxide film containing at least one of titanium (Ti), tantalum (Ta), Zinc (Zn), strontium (Sr), selenium (Se), and lanthanum (La). The material thereof may be titanium oxide (TiOx), tantalum oxide (Ta2O5), zinc oxide (ZnO), zinc selenide (ZnSe), zinc sulfide (ZnS), strontium titanate (SrTiO3), or lanthanum oxide (La2O3), for example. Further, the high-dielectric insulative film 54H is formed at a film thickness of about 0.5 to 3 nm, for example.

Further, the fixed charge film 56H may be formed by use of aluminum oxide (Al2O3), for example, and is formed at a film thickness of about 1 to 20 nm, for example.

In the thus-configured pixel 12H, the high-dielectric insulative film 54H including a metal-based material is formed on the semiconductor substrate 21, and the contact part between the FD part 32 and the contact electrode 55 is different in structure from other parts. That is, the pixel 12H is structured such that the high-dielectric insulative film 54H is formed on the contact part between the FD part 32 and the contact electrode 55 and the high-dielectric insulative film 54H and the fixed charge film 56H are formed on other parts.

In this way, the pixel 12H can be configured in the advanced contact structure in which the FD part 32 and the contact electrode 55 are connected via the high-dielectric insulative film 54H similarly to the pixel 12 of FIG. 2.

The steps of manufacturing the pixel 12H in the method for manufacturing the solid-state image sensing device 11 will be described below with reference to FIG. 33 and FIG. 34.

For example, the opening 63 and the opening 64 are formed on the silicon oxide film 41H and then the high-dielectric insulative film 54H and the fixed charge film 56H are formed similarly as in the 61st to 65th steps described with reference to FIG. 25 and FIG. 26.

Figure 33:
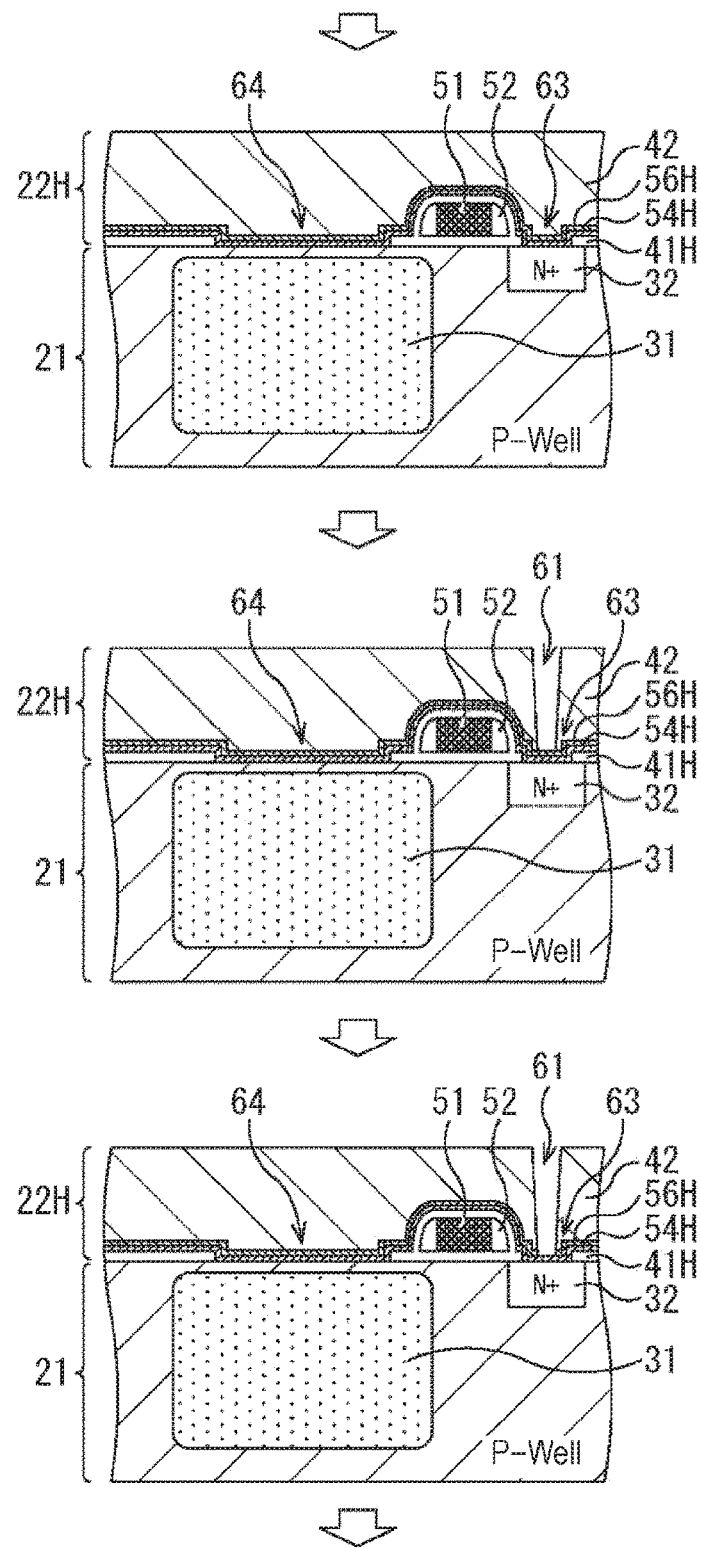
FIG. 33 is a diagram for explaining the steps of manufacturing the pixel in the ninth exemplary configuration.
Figure 34:
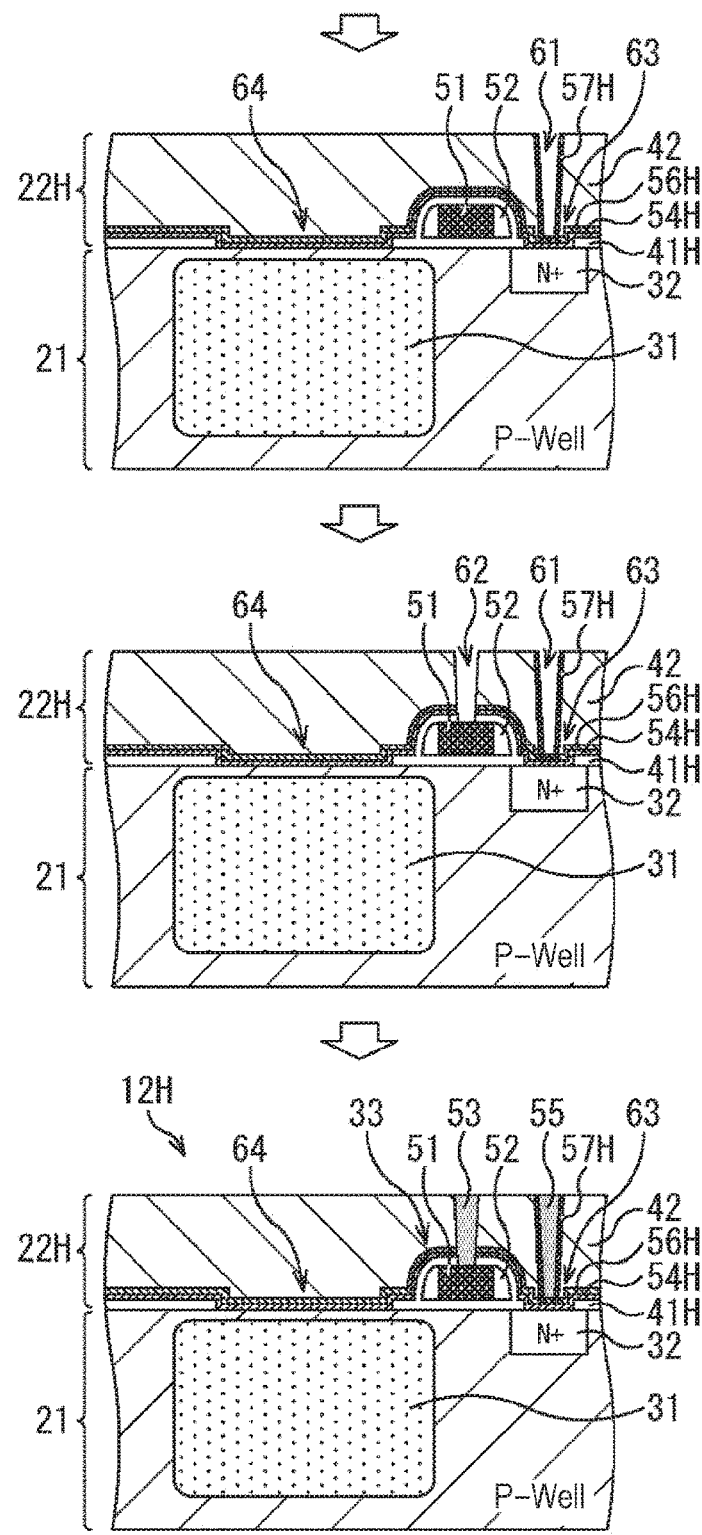
FIG. 34 is a diagram for explaining the steps of manufacturing the pixel in the ninth exemplary configuration.

Then in the 81st step, as illustrated in the top stage of FIG. 33, the interlayer insulative film 42 is formed on the fixed charge film 56H.

Further in the 82nd step, as illustrated in the middle stage of FIG. 33, the contact hole 61 is formed in the interlayer insulative film 42. At this time, for example, the interlayer insulative film 42 is etched in the dry etching method using SF6 or Cl gas, thereby forming the contact hole 61. Thereby, the etching rate of the dry-etching remarkably lowers on the fixed charge film 56H formed on the semiconductor substrate 21, and the etching is stopped. In this way, the fixed charge film 56H is assumed as a dry-etching stopper, thereby preventing a dry-etching damage on the semiconductor substrate 21.

Further in the 83rd step, as illustrated in the bottom stage of FIG. 33, the fixed charge film 56H at the bottom of the contact hole 61 is removed in the wet etching method using hydrofluoric acid as etchant. At this time, the high-dielectric insulative film 54H does not react with the etchant and stops being etched, and thus the fixed charge film 56H is removed and only the high-dielectric insulative film 54H remains on the surface of the FD part 32.

Subsequently in the 84th step, as illustrated in the top stage of FIG. 34, a Ti or TiN film is formed thereby to form the barrier metal 57H. Further in the 85th step, as illustrated in the middle stage of FIG. 34, the interlayer insulative film 42 is etched thereby to form the contact hole 62. Then in the 86th step, as illustrated in the bottom stage of FIG. 34, tungsten, for example, is filled in the contact hole 61 and the contact hole 62 thereby to form the contact electrode 53 and the contact electrode 55, thereby forming the pixel 12H.

Here, the connection part between the FD part 32 and the contact electrode 55 is MIS advanced contact and has less dry etching damages, thereby realizing preferable low-resistance connection. Further, the fixed charge film 56H remains formed on the high-dielectric insulative film 54H except the FD part 32, thereby restricting an occurrence of a dark current on the interface due to the pinning effect of negative fixed charges.

Additionally, the fixed charge film 56H can have an adverse effect on the logic characteristics in the pixel layout in which a logic circuit is formed on the semiconductor substrate 21 and the pixels 12H and the logic circuit coexist, and thus the fixed charge film 56H may be released in the logic circuit.

Further in the pixel 12H, an insulative film with excellent MIS contact property with N-type silicon and a metal-based insulative film with negative fixed charges such as Al2O3 are formed on the semiconductor substrate 21 before the contact hole 61 is formed. Thereby, the dry-etching can be stopped by Al2O3 when the contact hole 61 of the FD part 32 is formed, thereby restricting a damage on the semiconductor substrate 21.

Thereafter, Al2O3 is released by wet etching, and thus dry-etching damages can be reduced and the excellent MIS advanced contact structure can be formed by the high-dielectric insulative film 54H on the FD part 32. Further, the fixed charge film 56H including Al2O3 with a large amount of negative fixed charges is formed on the high-dielectric insulative film 54H in the PD 31, thereby enhancing the pinning performance and obtaining the effect of restricting a dark current. Further, there is configured such that TiOx, Al2O3, or the like is not arranged in the contact hole 61, thereby preventing a reduction in wiring resistance.

Figure 35:
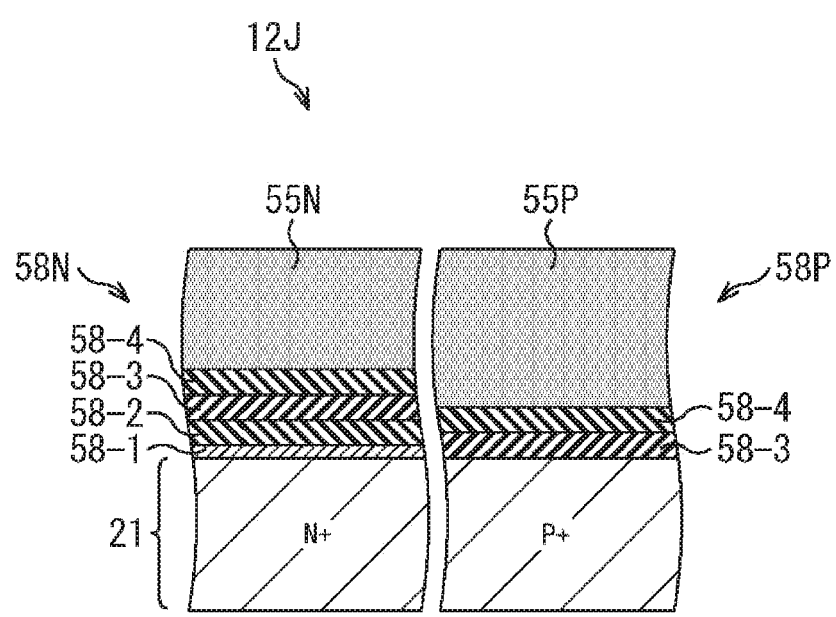
FIG. 35 is a diagram illustrating a 10th exemplary configuration of the pixel.

Then, FIG. 35 is a diagram illustrating a 10th exemplary configuration of the pixel 12. Additionally, the common components in a pixel 12J illustrated in FIG. 35 with those in the pixel 12 of FIG. 2 are denoted with the same reference numerals, and the detailed description thereof will be omitted.

Additionally, FIG. 35 illustrates a partial cross-section of a laminated structure 58N at a connection part between the N-type region of the semiconductor substrate 21 and a contact electrode 55N and a laminated structure 58P at a connection part between the P-type region of the semiconductor substrate 21 and a contact electrode 55P.

As illustrated in FIG. 35, there is employed a contact structure in which the contact electrode 55N including tungsten is connected to the N-type region of the semiconductor substrate 21 via the laminated structure 58N in which a titanium oxide layer 58-1, a titanium nitride layer 58-2, a titanium layer 58-3, and a titanium nitride layer 58-4 are laminated. That is, the N-type region of the semiconductor substrate 21 has the MIS contact structure in which the titanium oxide layer 58-1 (metal insulative film) is present on the semiconductor substrate 21.

Further, there is employed a contact structure in which the contact electrode 55P including tungsten is connected to the P-type region of the semiconductor substrate 21 via the laminated structure 58P in which the titanium layer 58-3 and the titanium nitride layer 58-4 are laminated. That is, the P-type region of the semiconductor substrate 21 has the ohmic contact structure configured of the titanium layer 58-3 (titanium silicide layer) and the titanium nitride layer 58-4.

In this way, the titanium layer 58-3 and the titanium nitride layer 58-4 are commonly used in the laminated structure 58N and the laminated structure 58P. For example, the titanium oxide layer 58-1 and the titanium nitride layer 58-2 in the laminated structure 58N are first formed, and then a contact hole for the contact electrode 55P is formed, and the titanium layer 58-3 and the titanium nitride layer 58-4 are formed at the same time. Thereby, part of the process of forming the laminated structure 58N and the laminated structure 58P can be commonalized, thereby reducing the number of steps.

Further, the titanium layer 58-3 is formed on the titanium oxide layer 58-1 and the titanium nitride layer 58-2 in the MIS contact structure in which the contact electrode 55N is connected to the N-type region of the semiconductor substrate 21, thereby scavenging only SiO2 on the interface between the semiconductor substrate 21 (silicon) and the titanium oxide layer 58-1 due to reduction of titanium. Thereby, an increase in resistance can be restricted by SiO2 on the interface with the N-type region of the semiconductor substrate 21.

That is, different metal insulative films need to be formed corresponding to the N-type and P-type work functions in a conventional solid-state image sensing device to which the MIS contact structure is applied. For example, if TiO2, which is known as a metal insulative film for N-type MIS contact, is applied also to P-type, the schottky structure is assumed and resistance increases. Thus, the contact structures for N-type and P-type need to be prepared. However, in order to prepare them, the process of forming a contact hole, embedding a metal therein, and removing unnecessary part needs to be repeated twice, which causes an increase in the number of steps. Further in the MIS contact structure, resistance increases due to a native oxide film on an interface between silicon and titanium oxide or the like.

Figure 53:
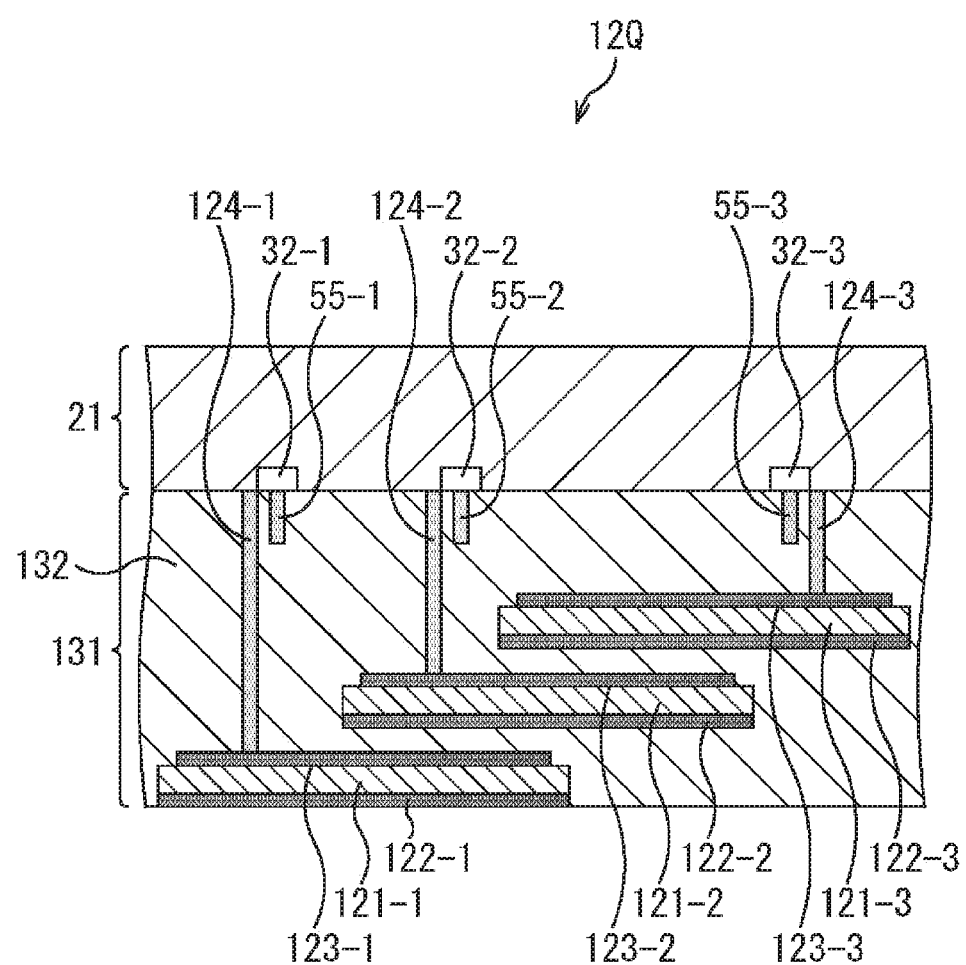
FIG. 53 is a diagram illustrating a third exemplary configuration of a pixel employing the longitudinal spectroscopic structure.

To the contrary, part of the process of forming the laminated structure 58N and the laminated structure 58P is commonalized in the contact structure of the pixel 12J illustrated in FIG. 53, thereby avoiding an increase in the number of steps and restricting an increase in resistance as described above. Further, an increase in resistance due to SiO2 on the interface with the N-type region of the semiconductor substrate 21 can be restricted.

The steps of manufacturing the pixel 12J in the method for manufacturing the solid-state image sensing device 11 will be described below with reference to FIG. 36 to FIG. 38.

Figure 36:
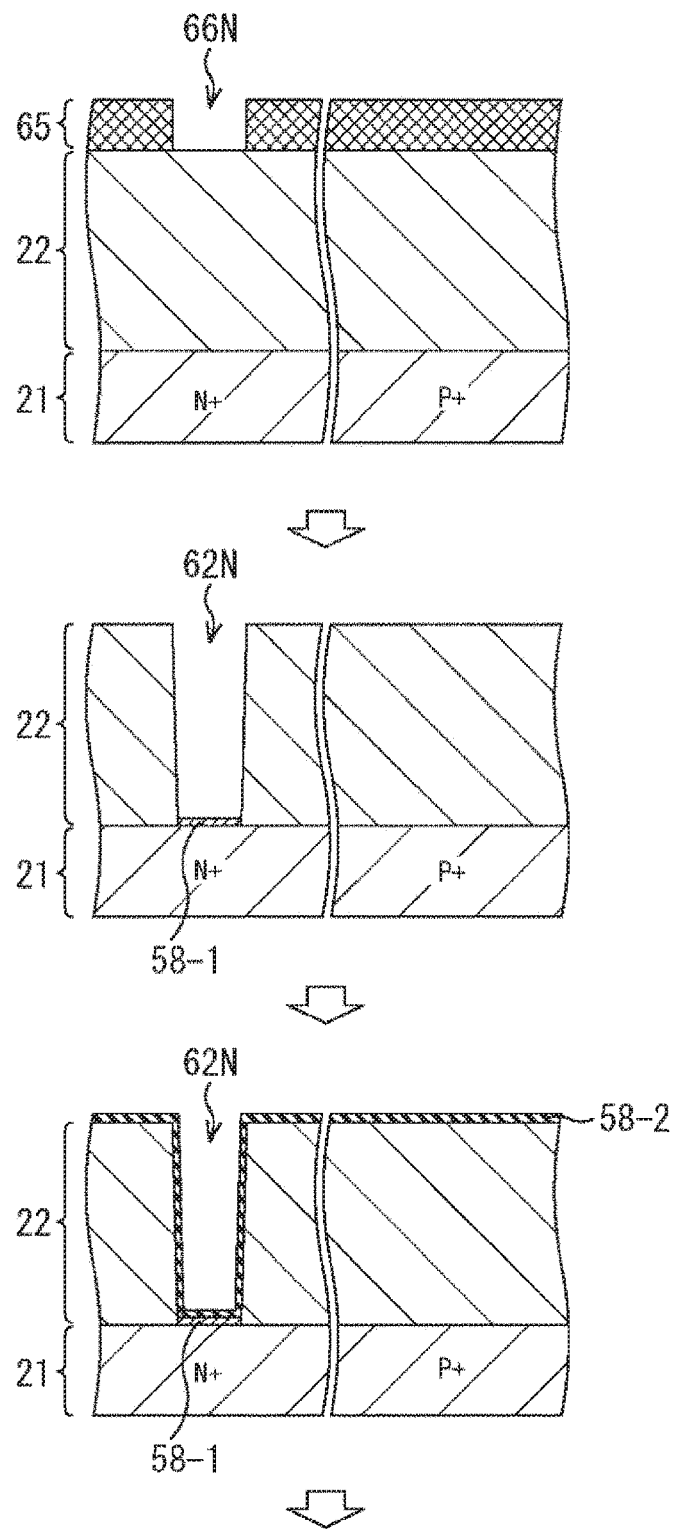
FIG. 36 is a diagram for explaining the steps of manufacturing the pixel in the 10th exemplary configuration.

At first, in the 91st step, as illustrated in the top stage of FIG. 36, a resist 65 is formed on the wiring layer 22, and an opening 66N is patterned such that the region where the contact electrode 55N connected to the N-type region of the semiconductor substrate 21 is to be formed is opened.

Then in the 92nd step, as illustrated in the middle stage of FIG. 36, the wiring layer 22 is etched in the dry etching method thereby to form a contact hole 62N, and then the resist 65 is released. The titanium oxide layer 58-1 is then formed on the semiconductor substrate 21 at the bottom of the contact hole 62N.

Further in the 93rd step, as illustrated in the bottom stage of FIG. 36, the titanium nitride layer 58-2 is formed on the surface of the wiring layer 22, the side face of the contact hole 62N, and the titanium oxide layer 58-1 at the bottom of the contact hole 62N. Here, the titanium oxide layer 58-1 and the titanium nitride layer 58-2 are formed by using the atomic layer deposition (ALD) method, the metal organic chemical vapor deposition (MOCVD) method, the physical vapor deposition (PVD) method, or the like.

Subsequently in the 94th step, as illustrated in the top stage of FIG. 37, the resist 65 is formed on the titanium nitride layer 58-2, and an opening 66P is patterned such that the region where the contact electrode 55N connected to the P-type region of the semiconductor substrate 21 is formed is opened.

Further in the 95th step, as illustrated in the middle stage of FIG. 37, the titanium nitride layer 58-2 and the wiring layer 22 are etched by the dry etching method. At this time, the inside of the contact hole 62N is protected by the resist 65. Then, the contact hole 62P is formed by etching, and then the resist 65 is released.

Then in the 96th step, as illustrated in the bottom stage of FIG. 37, the titanium layer 58-3 is formed inside the contact hole 62N and the contact hole 62P at the same time by the atomic layer deposition (ALD) method, the metal organic chemical vapor deposition (MOCVD) method, the physical vapor deposition (PVD) method, or the like, and the titanium nitride layer 58-4 is subsequently formed. At this time, the titanium layer 58-3 is formed inside the contact hole 62N, and thus the reduction of titanium works and the native oxide layer at the interface between silicon of the semiconductor substrate 21 and the titanium oxide layer 58-1 can be scavenged and removed.

Subsequently in the 97th step, as illustrated in the top stage of FIG. 38, the annealing processing is performed to react titanium in the contact hole 62P with silicon, thereby forming a titanium silicide layer.

Figure 38:
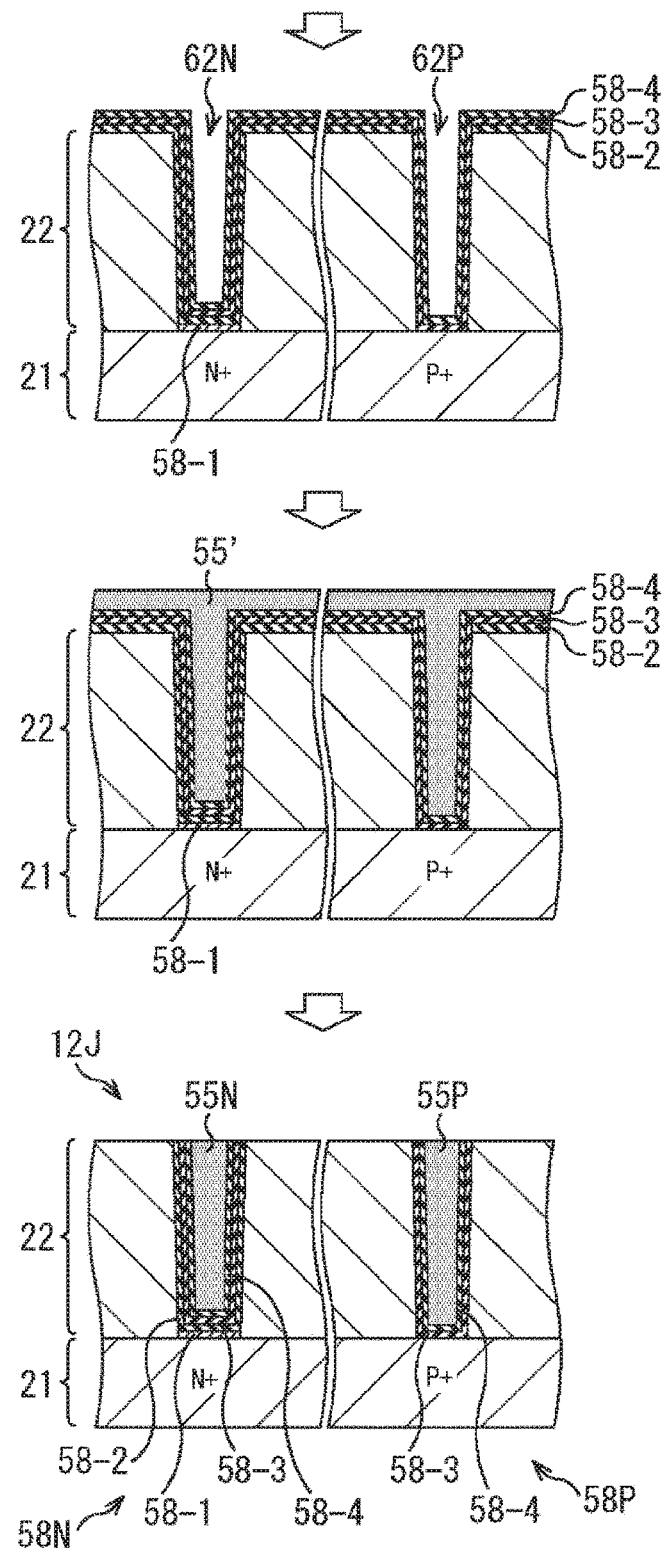
FIG. 38 is a diagram for explaining the steps of manufacturing the pixel in the 10th exemplary configuration.

Then in the 98th step, as illustrated in the middle stage of FIG. 38, tungsten is embedded in the chemical vapor deposition (CVD) method or the like, and a contact plug 55' is formed in the contact hole 62N and the contact hole 62P at the same time.

Thereafter, in the 99th step, as illustrated in the bottom stage of FIG. 38, the unnecessary metal film on the surface is removed in the chemical mechanical polishing (CMP) method or the like thereby to form the contact electrode 55N and the contact electrode 55P.

In the above steps, it is possible to manufacture the solid-state image sensing device 11 including the pixels 12J in which the MIS-structured contact is formed for the N-type region of the semiconductor substrate 21 and the conventional ohmic contact structure is prepared for the P-type region of the semiconductor substrate 21, respectively.

Additionally, a metal insulative film using a material except titanium oxide (TiOx) may be used instead of the titanium oxide layer 58-1, and, for example, an oxide film containing at least one of titanium (Ti), tantalum (Ta), zinc (Zn), strontium (Sr), selenium (Se), and lanthanum (La) may be employed. The material thereof may be tantalum oxide (Ta2O5), zinc oxide (ZnO), zinc selenide (ZnSe), zinc sulfide (ZnS), strontium titanate (SrTiO3), or lanthanum oxide (La2O3), for example. Further, the metal insulative film is formed at a film thickness of about 0.5 to 3 nm, for example.

Figure 39:
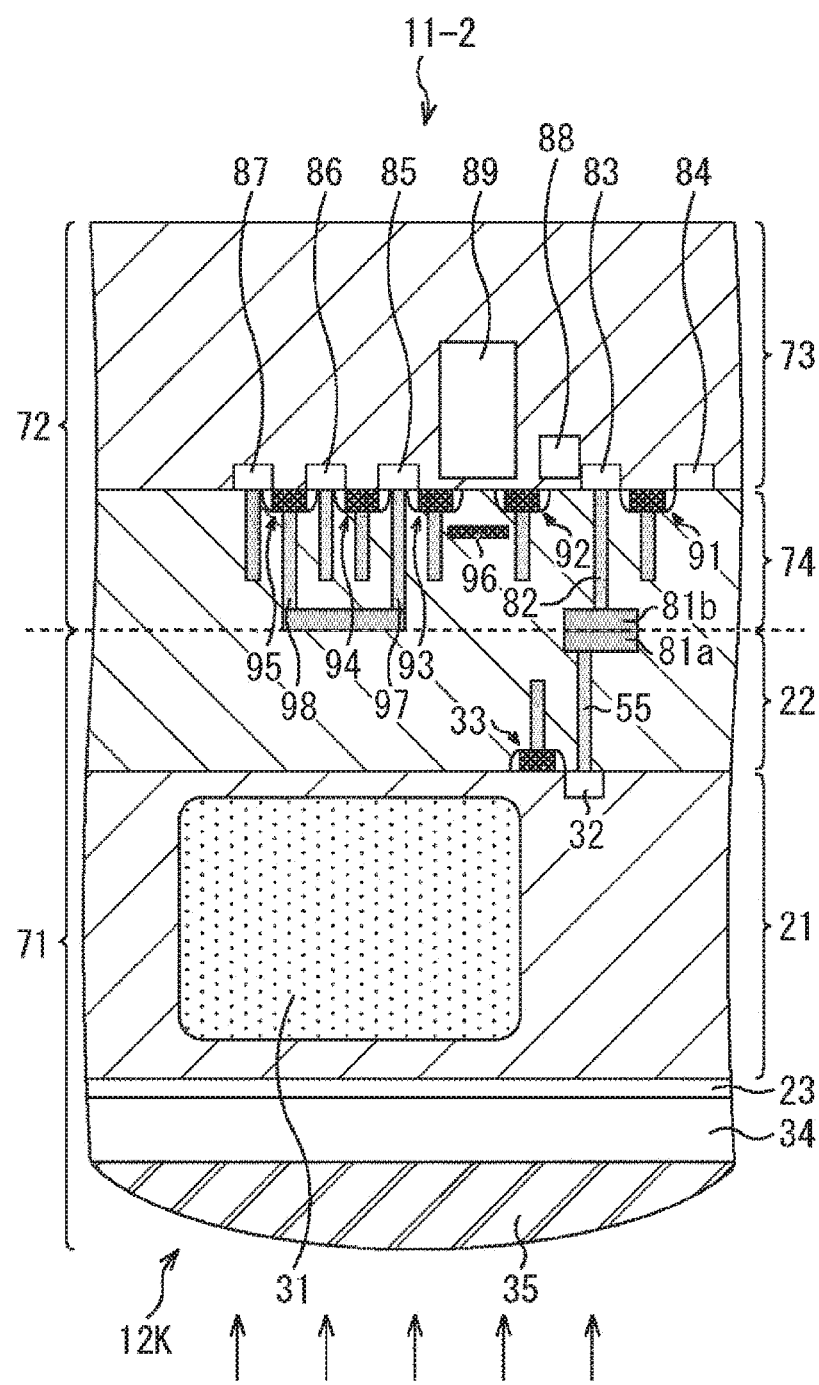
FIG. 39 is a diagram illustrating an exemplary cross-section configuration of a second embodiment of a solid-state image sensing device.

Then, FIG. 39 is a diagram illustrating an exemplary cross-section configuration of a second embodiment of the solid-state image sensing device 11. Additionally, the common components in a solid-state image sensing device 11-2 illustrated in FIG. 39 with those in the solid-state image sensing device 11 of FIG. 1 and the pixel 12 of FIG. 2 are denoted with the same reference numerals, and the detailed description thereof will be omitted.

As illustrated in FIG. 39, the solid-state image sensing device 11-2 is configured such that a light receiving substrate 71 and a reading substrate 72 are electrically and mechanically bonded on a bonding face illustrated in a broken line. FIG. 39 illustrates a cross-section of one pixel 12K of the solid-state image sensing device 11-2.

The light receiving substrate 71 is configured such that the wiring layer 22 is laminated on the surface of the semiconductor substrate 21, and the planarization film 23, the color filter 34, and the micro-lens 35 are laminated on the backside of the semiconductor substrate 21. Additionally, a light is incident in the pixel 12K from the lower side of FIG. 39.

In the pixel 12K, the PD 31 and the FD part 32 are formed in the semiconductor substrate 21, and the transfer transistor 33 is formed on the surface of the semiconductor substrate 21.

In the pixel 12K, for example, a bonding part 81a including copper wiring is formed to be exposed on the bonding face in the wiring layer 22, and the FD part 32 and the bonding part 81a are connected via the contact electrode 55 formed to penetrate through the wiring layer 22.

The reading substrate 72 is configured such that a wiring layer 74 is laminated on the surface of a semiconductor substrate 73, and is adhered to the light receiving substrate 71 such that a bonding part 81b formed on the bonding face of the wiring layer 74 is bonded to the bonding part 81a of the light receiving substrate 71. Further, a contact electrode 82 is formed to penetrate through the wiring layer 74, and the bonding part 81b and a FD part 83 in the semiconductor substrate 73 are connected via the contact electrode 82. Therefore, the FD part 32 is connected to the FD part 83 via the contact electrode 55, the bonding part 81a, the bonding part 81b, and the contact electrode 82, and charges transferred from the PD 31 to the FD part 32 are read by the reading substrate 72.

In the pixel 12K, N-type impurity regions 84 to 89 are formed on the semiconductor substrate 73, an overflow gate 91, a transfer transistor 92, a transfer transistor 93, a reset transistor 94, and an amplification transistor 95 are formed on the surface of the semiconductor substrate 73.

For example, in the pixel 12K, the N-type impurity region 88 functions as an overflow buffer for charges accumulated in the FD part 83, and charges overflowed from the FD part 83 are discharged to the N-type impurity region 84 via the overflow gate 91. Further, the N-type impurity region 89 is supplied with charges from the FD part 83 and the N-type impurity region 88 via the transfer transistor 92, and the N-type impurity region 89 functions as a memory unit configured to hold charges generated in the PD 31 until the charges are read when the solid-state image sensing device 11-2 performs the global shutter operation. Further, a light shielding film 96 is formed on the wiring layer 74 in order to prevent the N-type impurity region 89 from being irradiated with a light.

Further in the pixel 12K, charges held in the N-type impurity region 89 are transferred to the N-type impurity region 85 functioning as a FD part via the transfer transistor 93, and the N-type impurity region 89 is connected to the gate electrode of the amplification transistor 95 via the contact electrodes 97 and 98. The N-type impurity region 86 is connected to the drain power supply Vdd, the N-type impurity region 87 is connected to a vertical signal line, and charges accumulated in the N-type impurity region 85 are amplified by the amplification transistor 95 and output to the vertical signal line. Further, the charges accumulated in the N-type impurity region 85 are discharged to the drain power supply Vdd connected to the N-type impurity region 86 via the reset transistor 94.

In the thus-configured pixel 12K, the above advanced contact structure may be employed in at least one of the connection part between the FD part 32 and the contact electrode 55, the connection part between the FD part 83 and the contact electrode 82, and the connection part between the N-type impurity region 85 and the contact electrode 97, for example. Thereby, the pixel 12K can lower the P-type concentration of at least any of the FD part 32, the FD part 83, and the N-type impurity region 85, thereby reducing the contact resistance and preventing an occurrence of a dark current.

A method for manufacturing the solid-state image sensing device 11-2 will be described below with reference to FIG. 40 to FIG. 43.

At first, in the 101st step, as illustrated in FIG. 40, the PD 31 and the FD part 32 are formed in the semiconductor substrate 21 in a typical semiconductor process, and the transfer transistor 33 is formed on the surface of the semiconductor substrate 21. Thereafter, an interlayer insulative film is laminated on the wiring layer 22 and a contact hole is formed as described above thereby to form the contact electrode 55 to be connected to the FD part 32 in the advanced contact structure. The bonding part 81a is then formed to be exposed on the bonding face and connected to the contact electrode 55.

On the other hand, in the 102nd step, as illustrated in FIG. 41, the FD part 83 and the N-type impurity regions 84 to 89 are formed on the semiconductor substrate 73 in a typical semiconductor process. Further, the overflow gate 91, the transfer transistor 92, the transfer transistor 93, the reset transistor 94, and the amplification transistor 95 are formed on the surface of the semiconductor substrate 73. Thereafter, an interlayer insulative film is laminated on the wiring layer 22 and a contact hole is formed as described above thereby to form the contact electrode 82 to be connected to the FD part 83 in the advanced contact structure. Similarly, the contact electrodes 97 and 98 are formed in the wiring layer 22.

Further, the bonding part 81*b* is formed to be exposed on the bonding face and connected to the contact electrode 82. Further, the light shielding film 96 is formed to shield a light into the N-type impurity region 89 functioning as a memory unit. Additionally, a peripheral circuit configured to drive the solid-state image sensing device 11-2 is formed outside the pixel region in which a plurality of pixels 12K are arranged in a matrix shape.

Figure 42:
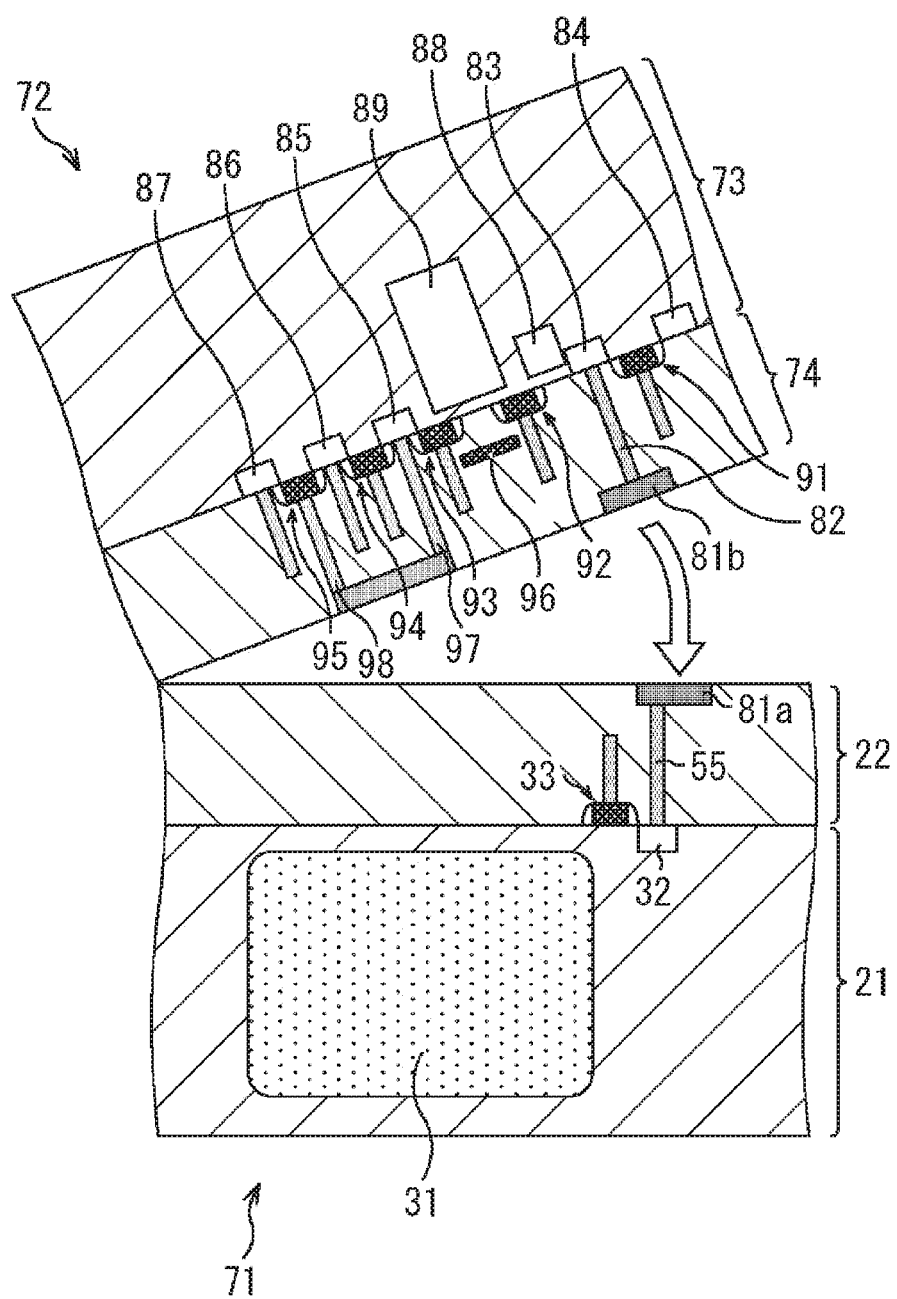
FIG. 42 is a diagram for explaining the method for manufacturing the solid-state image sensing device according to the second embodiment.

Then in the 103rd step, as illustrated in FIG. 42, the light receiving substrate 71 and the reading substrate 72 are bonded via the Cu—Cu bonding between the bonding part 81*a* of the light receiving substrate 71 and the bonding part 81*b* of the reading substrate 72.

Figure 43:
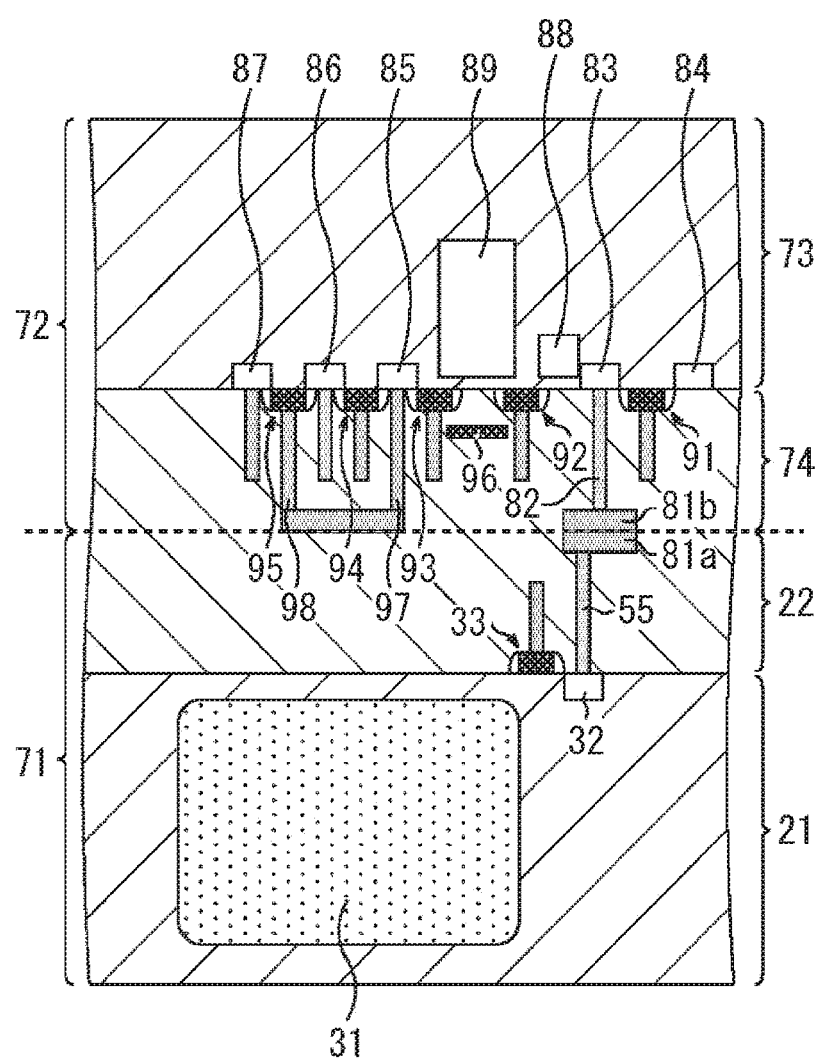
FIG. 43 is a diagram for explaining the method for manufacturing the solid-state image sensing device according to the second embodiment.

Further in the 104th step, as illustrated in FIG. 43, the light receiving face of the light receiving substrate 71 is polished to thin the light receiving substrate 71 at a silicon film thickness (about 2 to 10 μm, for example) at which the PD 31 remains.

Thereafter, as illustrated in FIG. 39, the steps of forming the planarization film 23, the color filter 34, and the microlens 35 on the backside of the semiconductor substrate 21 are performed, and the step of forming a pad (not illustrate) is further performed thereby to manufacture the solid-state image sensing device 11-2.

Figure 44:
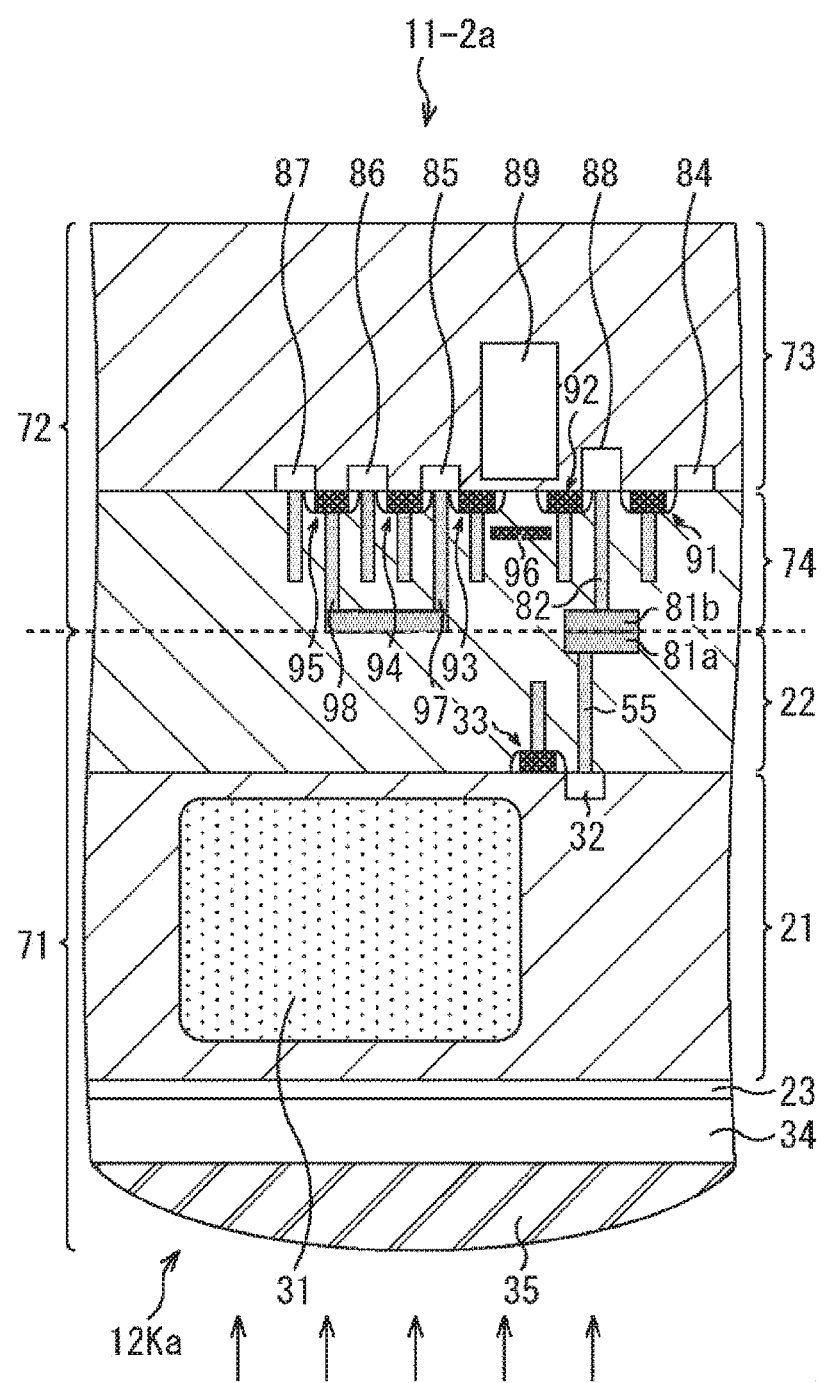
FIG. 44 is a diagram illustrating a first variant of the solid-state image sensing device according to the second embodiment.

Then, FIG. 44 is a diagram illustrating a first variant of the solid-state image sensing device 11-2 illustrated in FIG. 39. Additionally, the common components in a solid-state image sensing device 11-2*a* illustrated in FIG. 44 with those in the solid-state image sensing device 11-2 of FIG. 39 are denoted with the same reference numerals, and the detailed description thereof will be omitted.

That is, the solid-state image sensing device 11-2*a* is different from the solid-state image sensing device 11-2 of FIG. 39 in that a pixel 12K*a* is formed such that the contact electrode 82 is connected to the N-type impurity region 88 functioning as an overflow buffer which is arranged near the transfer transistor 92 configured to transfer charges to the N-type impurity region 89 functioning as a memory unit.

In the thus-configured solid-state image sensing device 11-2*a*, the above advanced contact structure can be employed in at least one of the connection part between the FD part 32 and the contact electrode 55 and the connection part between the FD part 83 and the contact electrode 82. Thereby, at least one of the FD part 32 and the FD part 88 can be lowered in its concentration (to be 1e20 cm-3 or less, for example). In this way, the charge transfer path is lowered in its capacitance, thereby easily transferring charges and reading charges with less noise.

Figure 45:
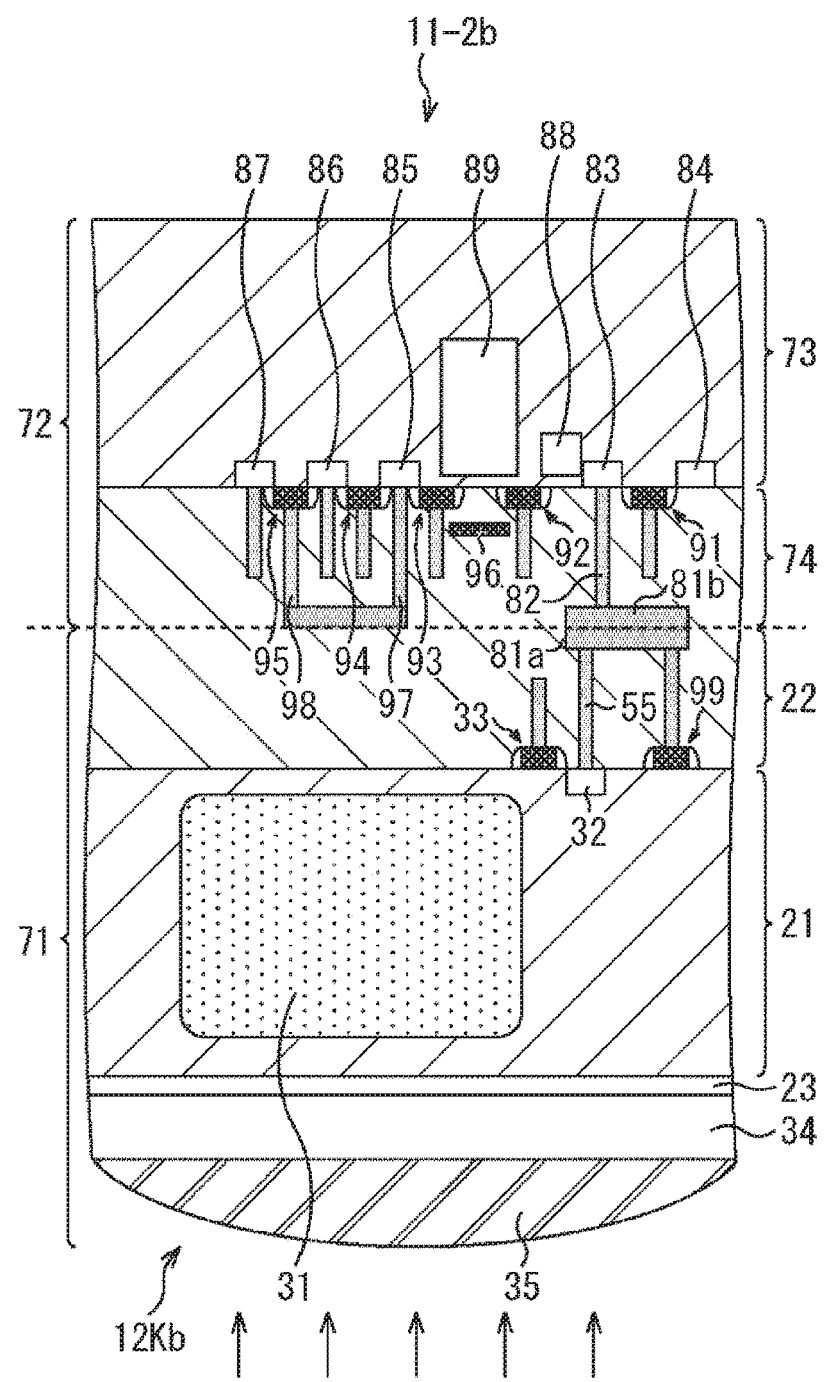
FIG. 45 is a diagram illustrating a second variant of the solid-state image sensing device according to the second embodiment.

Then, FIG. 45 is a diagram illustrating a second variant of the solid-state image sensing device 11-2 illustrated in FIG. 39. Additionally, the common components in a solid-state image sensing device 11-2*b* illustrated in FIG. 45 with those in the solid-state image sensing device 11-2 of FIG. 39 are denoted with the same reference numerals, and the detailed description thereof will be omitted.

That is, the solid-state image sensing device 11-2*b* is different from the solid-state image sensing device 11-2 of FIG. 39 in that a pixel 12K*b* is formed such that a gate electrode of a transfer transistor 99 is connected to the bonding part 81*a* connected with the contact electrode 55.

That is, the solid-state image sensing device 11-2*b* is configured such that charges are read from the reading substrate 72 in a case where the global shutter function is required and charges are read via the transfer transistor 99 in a case where the global shutter function is not required, for example. In this way, the solid-state image sensing device 11-2*b* can switch the presence of the global shutter function as needed. Therefore, for example, in a case where an imaging environment is at low illuminance and with lacking brightness, the solid-state image sensing device 11-2*b* selects reading of charges via the transfer transistor 99, and reads charges in the rolling shutter system, thereby shooting a preferable image with less noise.

Figure 46:
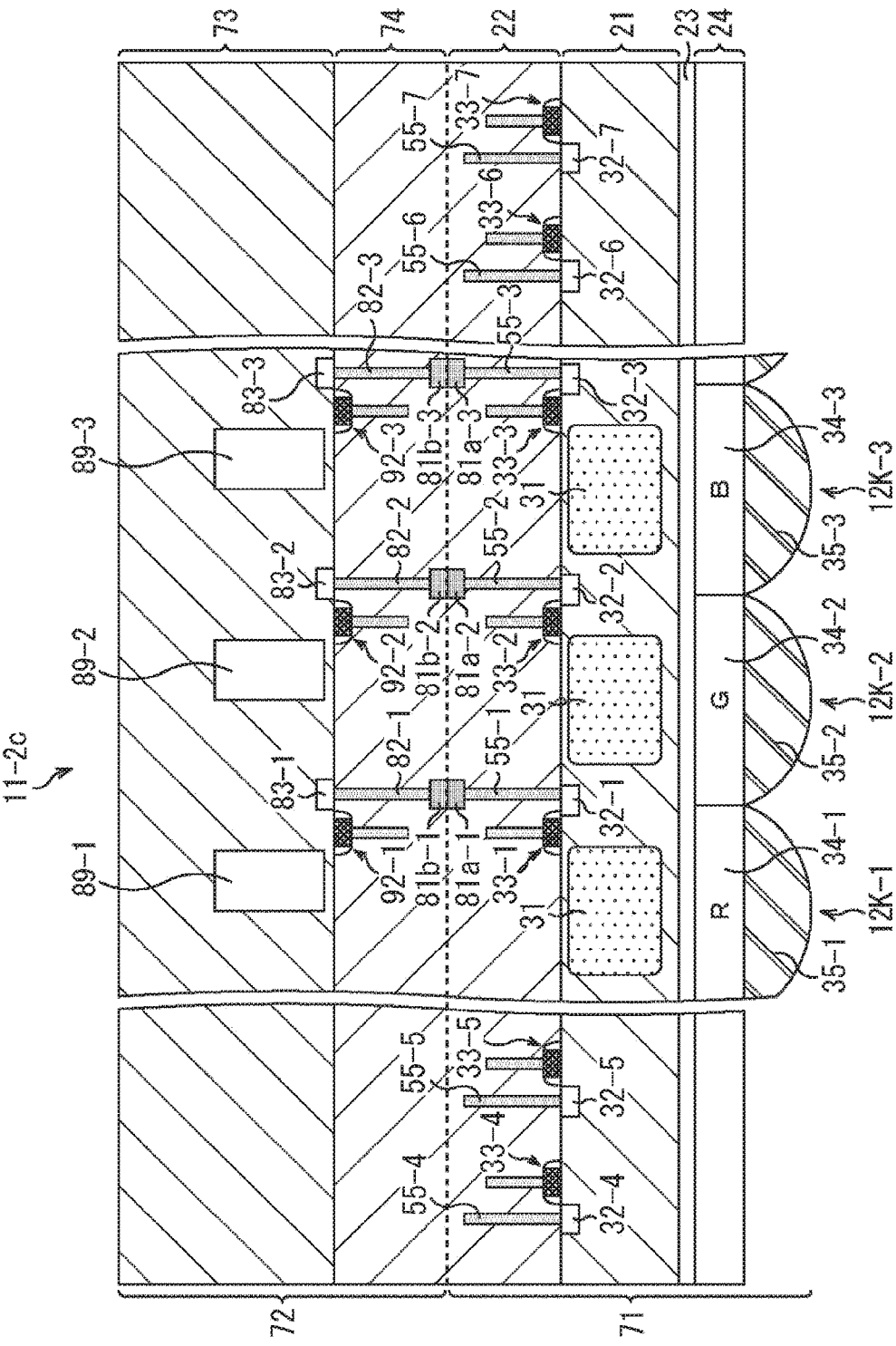
FIG. 46 is a diagram illustrating a third variant of the solid-state image sensing device according to the second embodiment.

Then, FIG. 46 is a diagram illustrating a third variant of the solid-state image sensing device 11-2 illustrated in FIG. 39. Additionally, the common components in a solid-state image sensing device 11-2*c* illustrated in FIG. 46 with those in the solid-state image sensing device 11-2 of FIG. 39 are denoted with the same reference numerals, and the detailed description thereof will be omitted.

As illustrated in FIG. 46, the solid-state image sensing device 11-2*c* is configured such that a peripheral circuit is provided outside the pixel region in which a plurality of pixels 12K are arranged in a matrix shape, where pixels 12K-1 to 12K-3 are similarly configured to the pixel 12K of FIG. 39. Then, a plurality of FD parts 32, a plurality of transfer transistors 33, and the like are formed also in the peripheral circuit similarly as in the pixel region, and the above advanced contact structure can be employed to connect the FD parts 32 and the contact electrodes 55.

Figure 47:
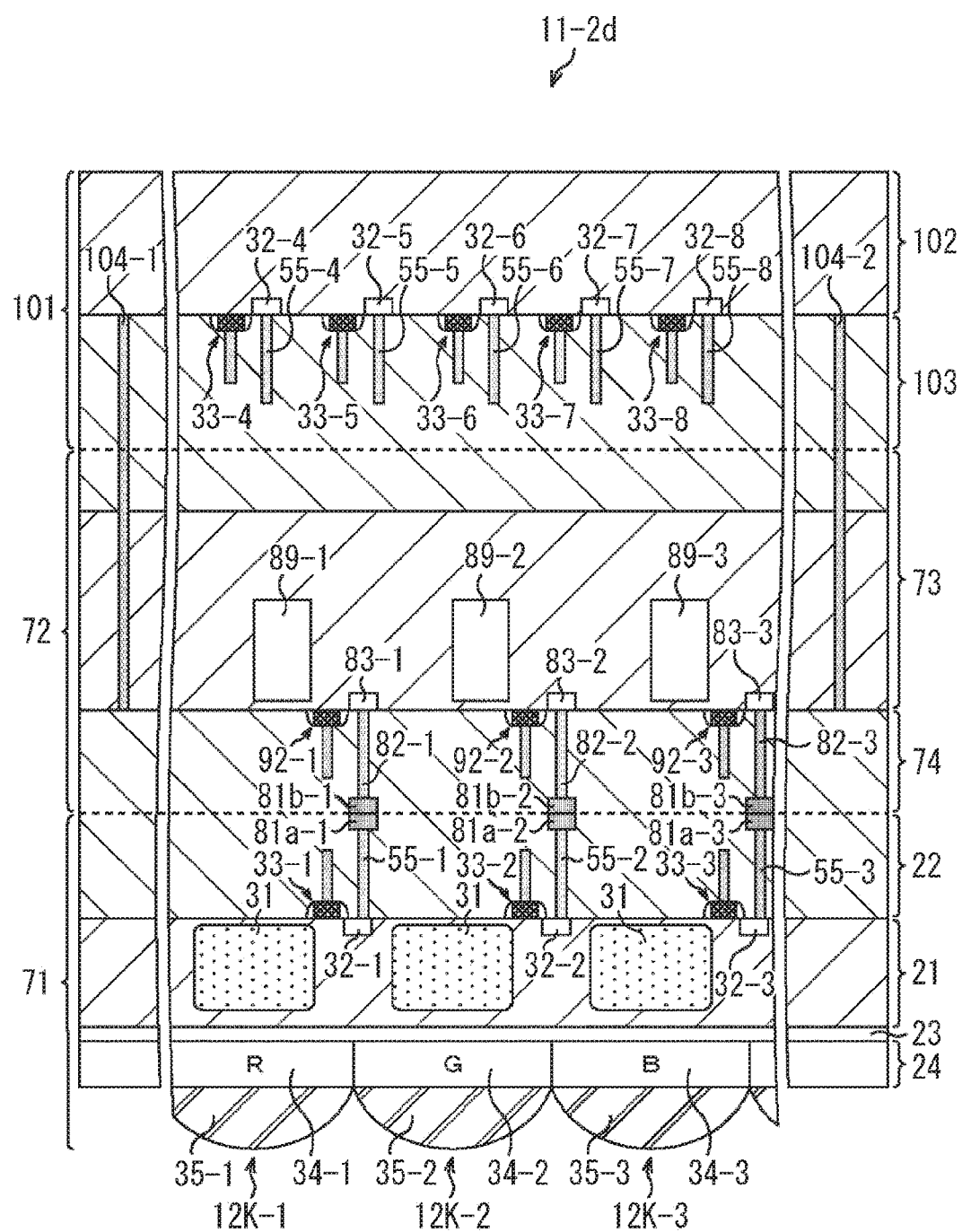
FIG. 47 is a diagram illustrating a fourth variant of the solid-state image sensing device according to the second embodiment.

Then, FIG. 47 is a diagram illustrating a fourth variant of the solid-state image sensing device 11-2 illustrated in FIG. 39. Additionally, the common components in a solid-state image sensing device 11-2*d* illustrated in FIG. 47 with those in the solid-state image sensing device 11-2 of FIG. 39 are denoted with the same reference numerals, and the detailed description thereof will be omitted.

As illustrated in FIG. 47, the solid-state image sensing device 11-2*d* is different from the solid-state image sensing device 11-2 of FIG. 39 in that the light receiving substrate 71, the reading substrate 72, and a peripheral circuit substrate 101 are laminated.

The peripheral circuit substrate 101 is bonded to the reading substrate 72 on the bonding face illustrated in a broken line, and is configured in which a semiconductor substrate 102 and a wiring layer 103 are laminated. Further, a signal is read from the reading substrate 72 to the peripheral circuit substrate 101 via penetrating electrodes 104-1 and 104-2 provided on the outer periphery. Then, a plurality of FD parts 32, a plurality of transfer transistors 33, and the like are formed also in the peripheral circuit substrate 101 similarly as in the light receiving substrate 71 and the reading substrate 72, and the above advanced contact structure can be employed for connecting the FD parts 32 and the contact electrodes 55.

In this way, the solid-state image sensing device 11-2*d* is configured in which the peripheral circuit substrate 101 is laminated, thereby reducing the chip area and employing latest-generation high-speed transistors for the peripheral circuit.

Additionally, in the solid-state image sensing device 11-2, the semiconductor substrate 21 in the light receiving substrate 71 may employ a silicon substrate, and a substrate including a laminated material such as III-V group substrate, for example. Further, the solid-state image sensing devices 11-2*a* to 11-2*d* are similarly configured. Specifically, a substrate with infrared sensitivity such as InP/InGaAs or InGaSb is employed thereby to obtain an infrared ray in the pixel 12K.

As described above, the solid-state image sensing device 11-2 can restrict effects of noise on the power supply of the transfer transistor 33, thereby realizing the imaging characteristics with less noise and realizing the imaging characteristics with a wide dynamic range. Thereby, the solid-state image sensing device 11-2 can provide the global shutter function with a restricted deterioration in imaging characteristics. Further, the solid-state image sensing devices 11-2a to 11-2d have the similar effects.

A configuration to which the above advanced contact structure is applicable will be described below with reference to FIG. 48 to FIG. 55.

Figure 48:
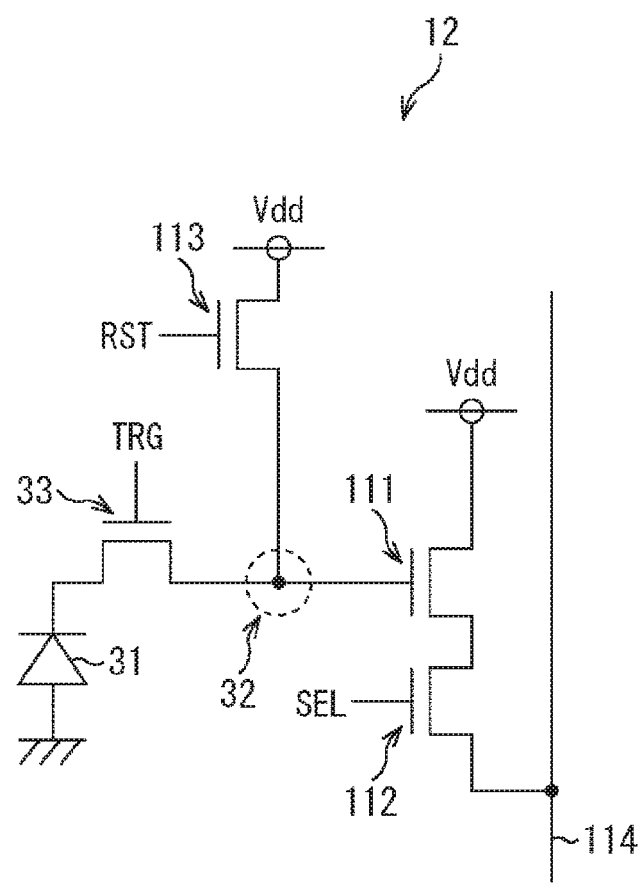
FIG. 48 is a diagram illustrating an equivalent circuit of a typical pixel.

FIG. 48 is a diagram illustrating an equivalent circuit of the typical pixel 12.

As illustrated in FIG. 48, the pixel 12 is such that the PD 31 is connected to the FD part 32 via the transfer transistor 33, the FD part 32 is connected to a gate electrode of an amplification transistor 111, and the amplification transistor 111 is connected to a vertical signal line 114 via a selection transistor 112. Further, the FD part 32 is connected to the drain power supply Vdd via a reset transistor 113.

In the thus-configured pixel 12, the above advanced contact structure can be applied to the connection configuration in the FD part 32 in a circle in a broken line.

Figure 49:
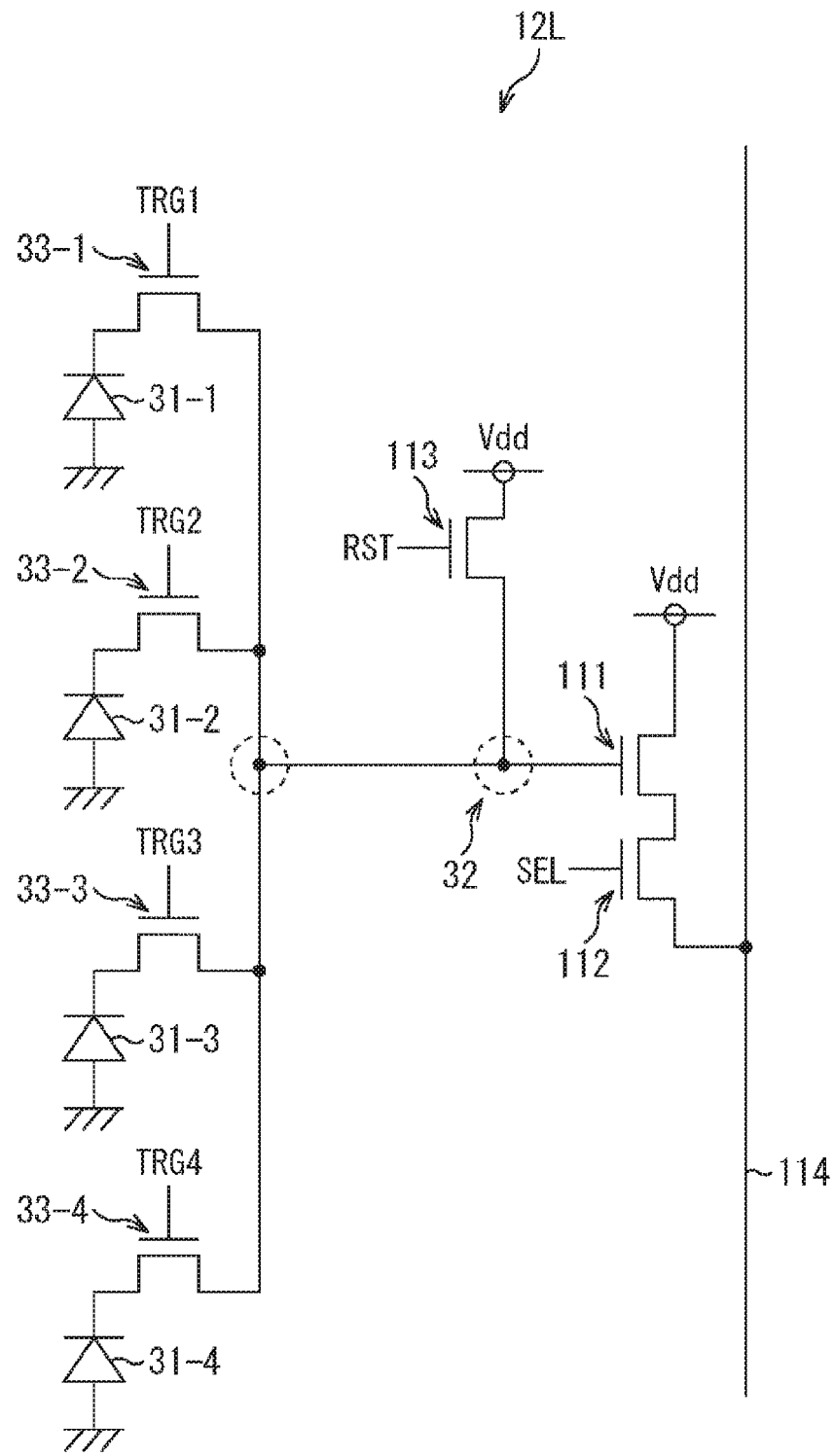
FIG. 49 is a diagram illustrating an equivalent circuit of a pixel employing the four-pixel sharing structure.

FIG. 49 is a diagram illustrating an equivalent circuit of the pixel 12 employing the four-pixel sharing structure.

As illustrated in FIG. 49, a pixel 12L is in the four-pixel sharing structure in which PDs 31-1 to 31-4 and transfer transistors 33-1 to 33-4 share and use a FD part 32, in which the transfer transistors 33-1 to 33-4 are connected at one part.

In the pixel 12L, the above advanced contact structure can be applied to the connection part where the transfer transistors 33-1 to 33-4 are connected and the connection configuration in the FD part 32 in circles in broken lines.

Figure 50:
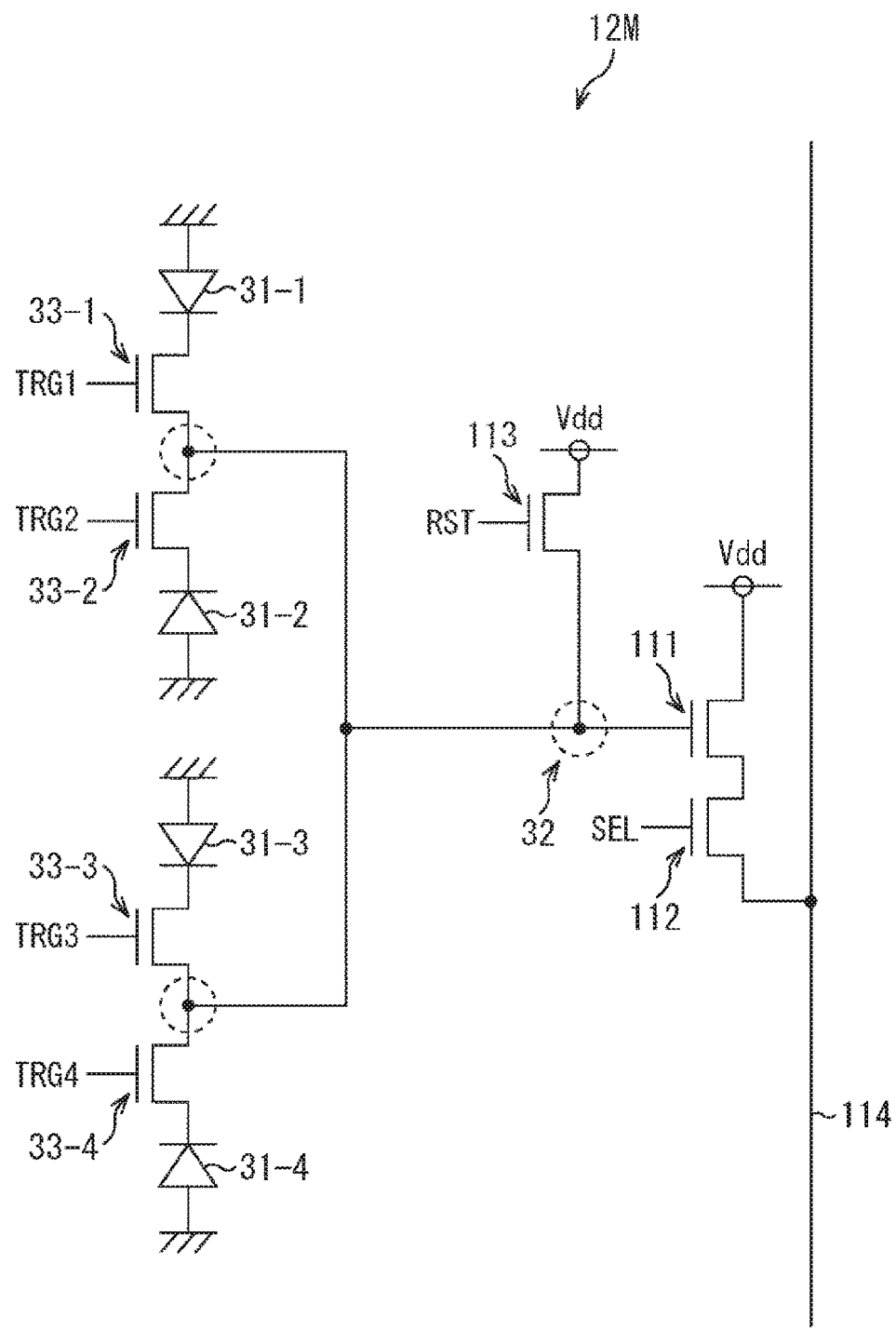
FIG. 50 is a diagram illustrating an equivalent circuit of a pixel employing the four-pixel sharing structure.

FIG. 50 is a diagram illustrating other equivalent circuit of the pixel 12 employing the four-pixel sharing structure.

As illustrated in FIG. 50, a pixel 12M is in the four-pixel sharing structure in which the PDs 31-1 to 31-4 and the transfer transistors 33-1 to 33-4 share and use a FD part 32. Further, the pixel 12M is such that the transfer transistors 33-1 and 33-2 are connected, the transfer transistors 33-3 and 33-4 are connected, and the connection parts thereof are connected to the FD part 32.

In the pixel 12M, the above advanced contact structure can be applied to the connection part between the transfer transistors 33-1 and 33-2, the connection part between the transfer transistors 33-3 and 33-4, and the connection configuration in the FD part 32 in circles in broken lines.

Figure 51:
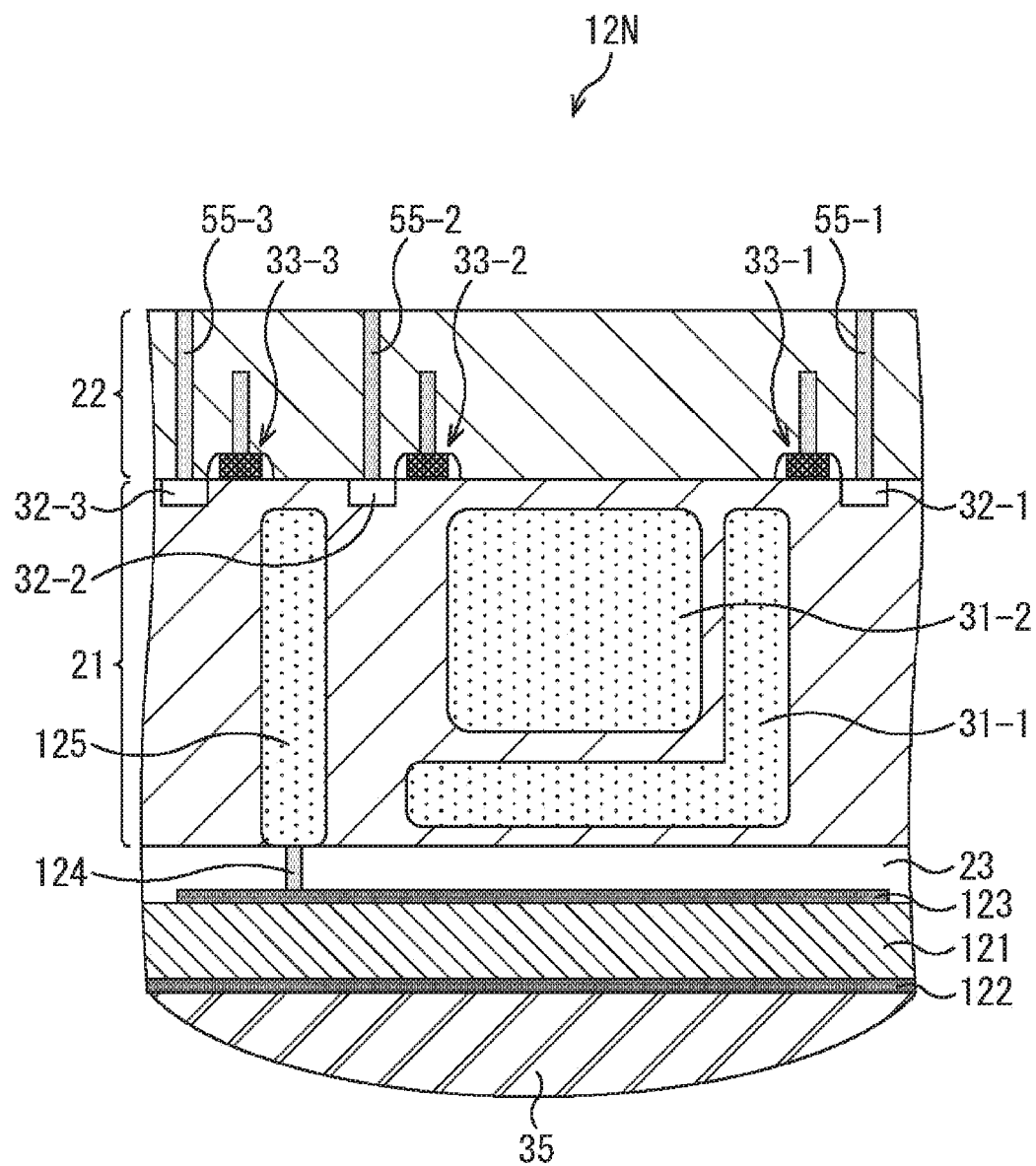
FIG. 51 is a diagram illustrating a first exemplary configuration of a pixel employing the longitudinal spectroscopic structure.

FIG. 51 is a diagram illustrating a first exemplary configuration of the pixel 12 employing the longitudinal spectroscopic structure.

As illustrated in FIG. 51, a pixel 12N is such that an organic photoelectric conversion film 121, the PD 31-1, and the PD 31-2 are arranged in the longitudinal direction, and the organic photoelectric conversion film 121 photoelectrically converts a green light, the PD 31-1 photoelectrically converts a blue light, and the PD 31-2 photoelectrically converts a red light, for example. The organic photoelectric conversion film 121 is sandwiched between an upper electrode 122 and a lower electrode 123 and charges are read from the organic photoelectric conversion film 121 via an electrode 124 connected to the lower electrode 123, and a diffusion layer 125.

Further, the pixel 12N is such that charges generated in the PD 31-1 are read via the transfer transistor 33-1, the FD part 32-1, and a contact electrode 55-1, and charges generated in the PD 31-2 are read via the transfer transistor 33-2, the FD part 32-2, and a contact electrode 55-2. Further, charges generated in the organic photoelectric conversion film 121 are read via the transfer transistor 33-3, the FD part 32-3, and a contact electrode 55-3.

In the thus-configured pixel 12N, the above advanced contact structure can be applied to the connection configurations in the FD parts 32-1 to 32-3.

Figure 52:
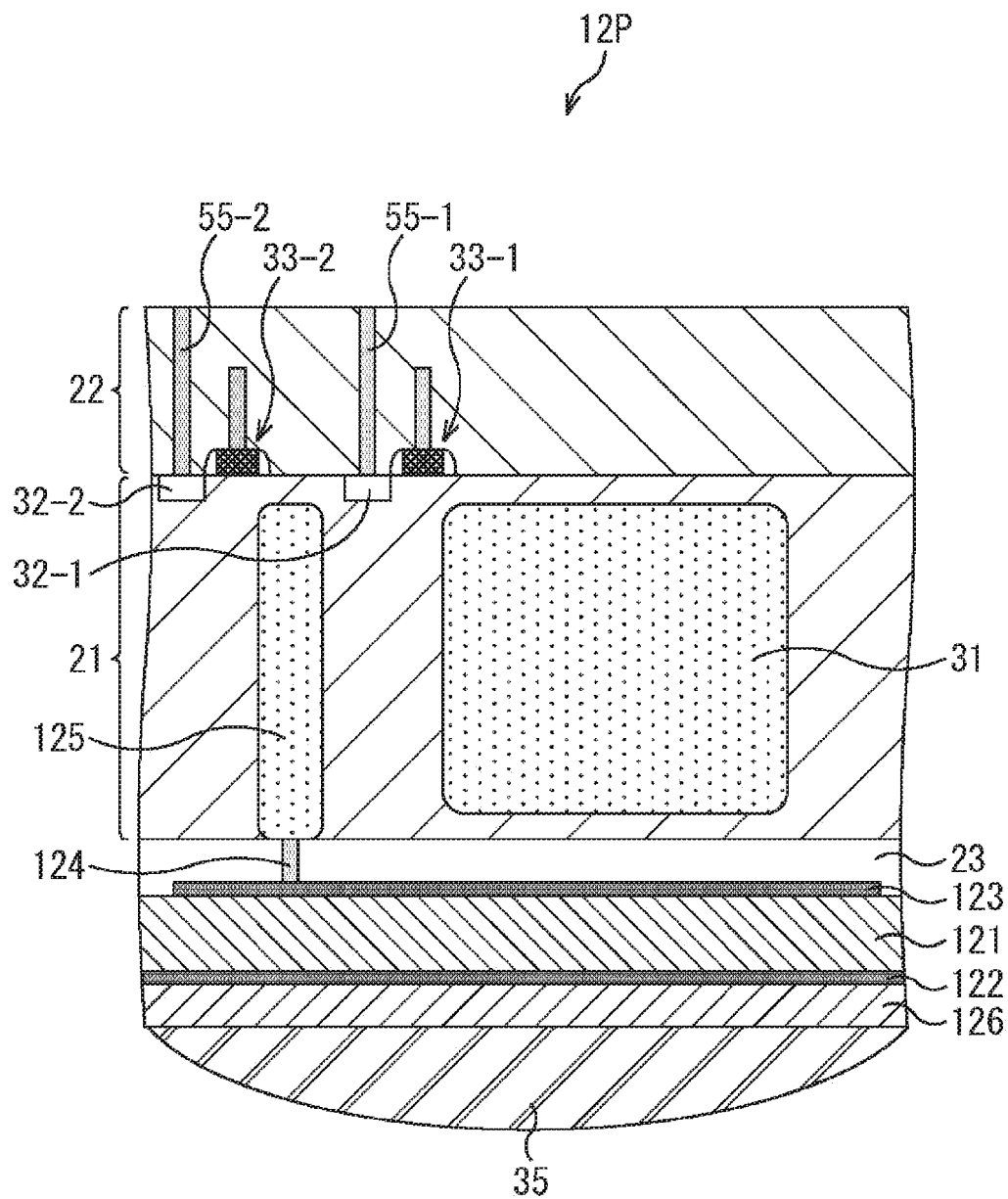
FIG. 52 is a diagram illustrating a second exemplary configuration of a pixel employing the longitudinal spectroscopic structure.

FIG. 52 is a diagram illustrating a second exemplary configuration of the pixel 12 employing the longitudinal spectroscopic structure.

As illustrated in FIG. 52, a pixel 12P is such that the organic photoelectric conversion film 121 and the PD 31 are arranged in the longitudinal direction and a color filter 126 is arranged between the organic photoelectric conversion film 121 and the micro-lens 35. The organic photoelectric conversion film 121 is sandwiched between the upper electrode 122 and the lower electrode 123, and chares are read from the organic photoelectric conversion film 121 via the electrode 124 connected to the lower electrode 123, and the diffusion layer 125. That is, the pixel 12P is such that the organic photoelectric conversion film 121 and the PD 31 can photoelectrically convert two colors of lights and a light of a color to be photoelectrically converted transmits through the color filter 126.

Further in the pixel 12P, charges generated in the PD 31 are read via the transfer transistor 33-1, the FD part 32-1, and the contact electrode 55-1. Furthermore, charges generated in the organic photoelectric conversion film 121 are read via the transfer transistor 33-2, the FD part 32-2, and the contact electrode 55-2.

In the thus-configured pixel 12P, the above advanced contact structure can be applied to the connection configurations in the FD parts 32-1 and 32-2.

FIG. 53 is a diagram illustrating a third exemplary configuration of the pixel 12 employing the longitudinal spectroscopic structure.

As illustrated in FIG. 53, a pixel 12Q is configured in which an organic photoelectric conversion layer 131 is laminated on the semiconductor substrate 21. The organic photoelectric conversion layer 131 is such that an organic photoelectric conversion film 121-1, an organic photoelectric conversion film 121-2, and an organic photoelectric conversion film 121-3 are insulated by an insulative film 132 and arranged in the longitudinal direction.

The organic photoelectric conversion film 121-1 is sandwiched between an upper electrode 122-1 and a lower electrode 123-1, and charges generated in the organic photoelectric conversion film 121 are read to the FD part 32-1 via an electrode 124-1 connected to the lower electrode 123-1. Further, the organic photoelectric conversion films 121-2 and 121-3 are configured similarly to the organic photoelectric conversion film 121-1.

In the thus-configured pixel 12Q, the above advanced contact structure can be applied to the connection configurations in the FD parts 32-1 to 32-3.

Figure 54:
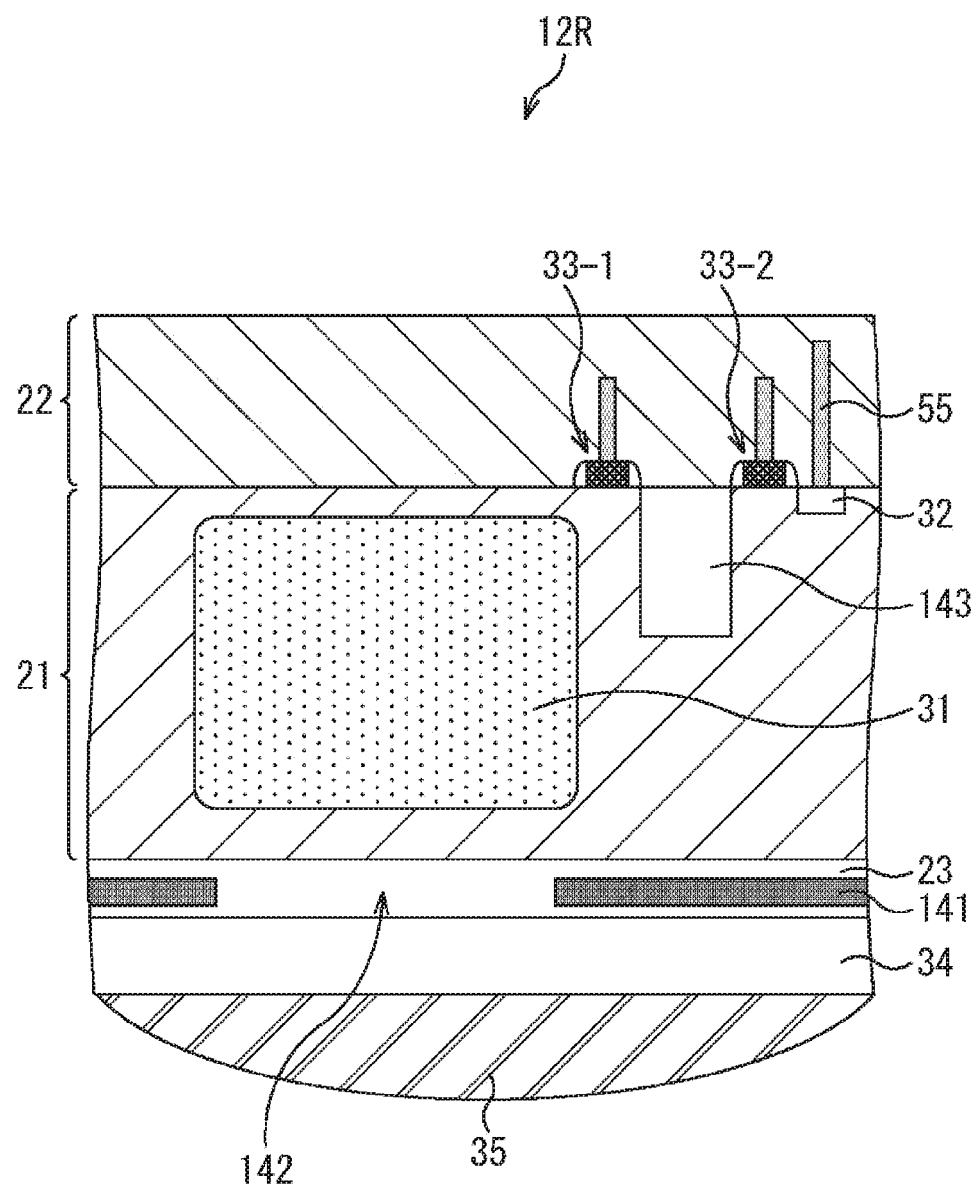
FIG. 54 is a diagram illustrating an exemplary configuration of a pixel employing the global shutter structure.

FIG. 54 is a diagram illustrating an exemplary configuration of the pixel 12 employing the global shutter structure.

As illustrated in FIG. 54, a pixel 12R is such that a light shielding film 141 is formed on the planarization film 23 laminated on the semiconductor substrate 21. An opening 142 configured to irradiate the PD 31 with a light is formed in the light shielding film 141, and a light is shielded on the part except the opening 142.

A memory unit 143 to which charges are concurrently transferred in all the pixels 12R and which is configured to hold the charges until the charges are read, and the FD part 32 are formed in the semiconductor substrate 21. Further, the transfer transistor 33-1 is formed between the PD 31 and the memory unit 143, the transfer transistor 33-2 is formed between the memory unit 143 and the FD part 32, and the contact electrode 55 is connected to the FD part 32 on the surface of the semiconductor substrate 21.

In the thus-configured pixel 12Q, the above advanced contact structure can be applied to the connection configuration in the FD part 32.

Figure 55:
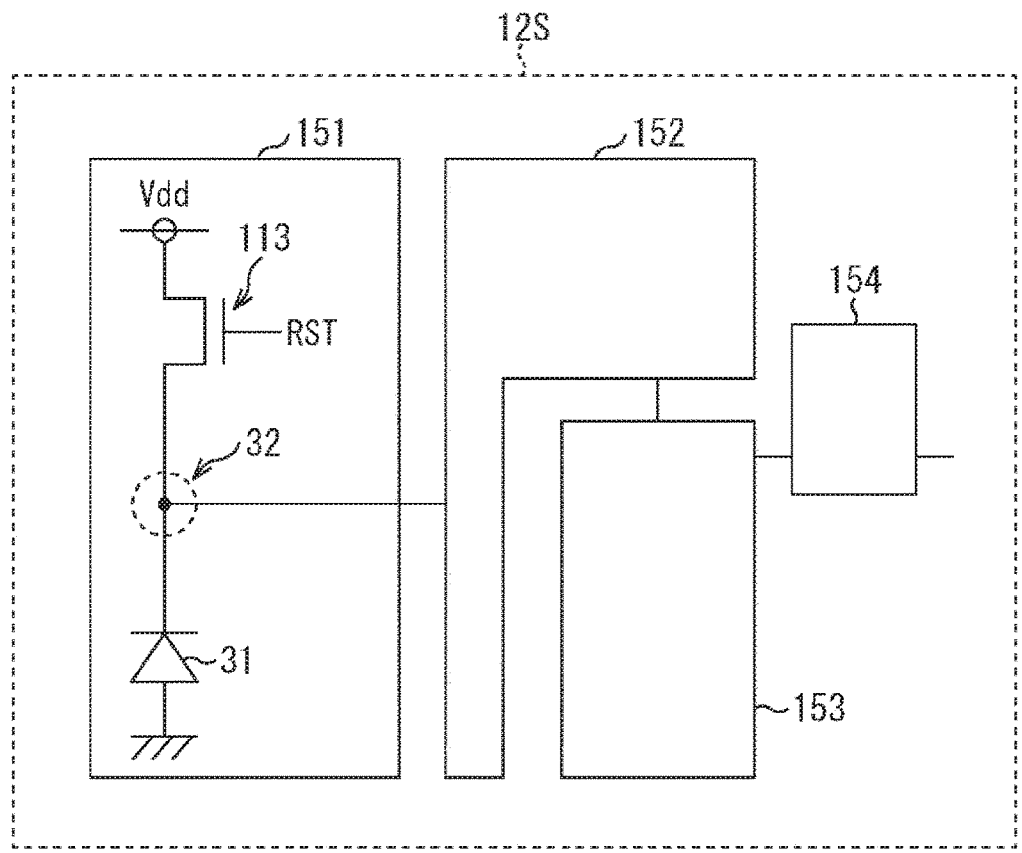
FIG. 55 is a diagram illustrating an exemplary configuration in which AD conversion is performed per pixel.

FIG. 55 is a diagram illustrating an exemplary configuration in which AD conversion is performed per pixel 12.

As illustrated in FIG. 55, a pixel 12S includes an integration circuit 151, a comparative current generation circuit 152, a comparator circuit 153, and a current addition node 154. Charges generated in the PD 31 in the integration circuit 151 are supplied to the comparative current generation circuit 152 via the FD part 32. Further, charges accumulated in the FD part 32 are discharged to the drain power supply Vdd via the reset transistor 113 to be reset. The comparator circuit 153 then compares the charges generated in the FD part 32 with a current generated in the comparative current generation circuit 152, and outputs the comparison result as a digital value via the current addition node 154.

In the thus-configured pixel 12Q, the above advanced contact structure can be applied to the connection configuration in the FD part 32 in a circle in a broken line.

Additionally, the above advanced contact structure may be applied to a configuration in which AD conversion is performed per a plurality of pixels 12 in a predetermined area, for example, in addition to the configuration in which AD conversion is performed per pixel 12.

<Exemplary Configuration of Electronic Device>

Additionally, the solid-state image sensing device 11 according to each embodiment described above can be applied to various electronic devices including shooting systems such as digital still camera or digital video camera, cell phones with an imaging function, and other devices with an imaging function.

Figure 56:
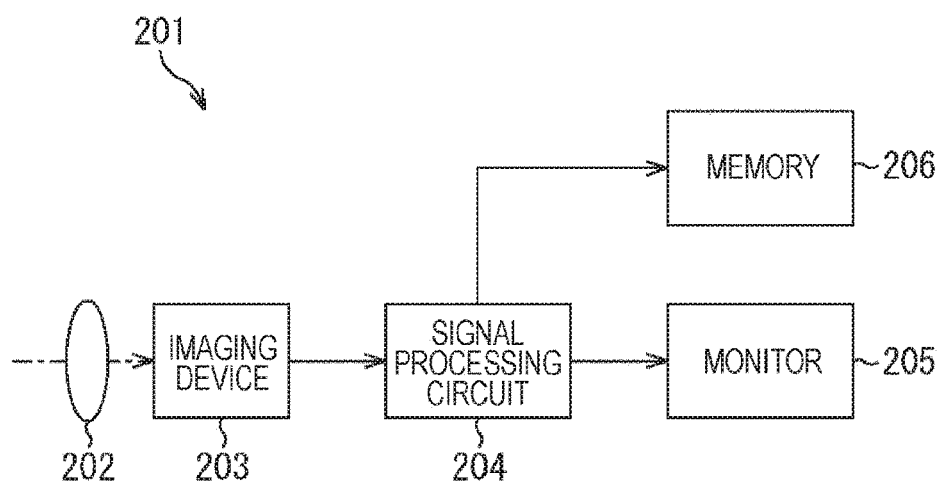
FIG. 56 is a block diagram illustrating an exemplary configuration of one embodiment of an electronic device to which the present technology is applied.

FIG. 56 is a block diagram illustrating an exemplary configuration of a shooting apparatus mounted on an electronic device.

As illustrated in FIG. 56, a shooting apparatus 201 includes an optical system 202, an imaging device 203, a signal processing circuit 204, a monitor 205, and a memory 206, and can shoot still images and moving images.

The optical system 202 includes one or more lenses, and guides an image light (incident light) from an object to the imaging device 203 to form an image on the light receiving face (sensor unit) of the imaging device 203.

The solid-state image sensing device 11 according to the embodiment is applied to the imaging device 203. Electrons are accumulated in the imaging device 203 according to an image formed on the light receiving face via the optical system 202 for a certain period of time. A signal depending on the electrons accumulated in the imaging device 203 is then supplied to the signal processing circuit 204.

The signal processing circuit 204 performs various signal processings on a pixel signal output from the imaging device 203. An image (image data) obtained by a signal processing in the signal processing circuit 204 is supplied to and displayed on the monitor 205, or supplied to and stored (recorded) in the memory 206.

In the thus-configured shooting apparatus 201, the solid-state image sensing device 11 according to the embodiment is applied thereby to shoot a preferable image with less noise, for example.

<Exemplary Use of Image Sensor>

Figure 57:
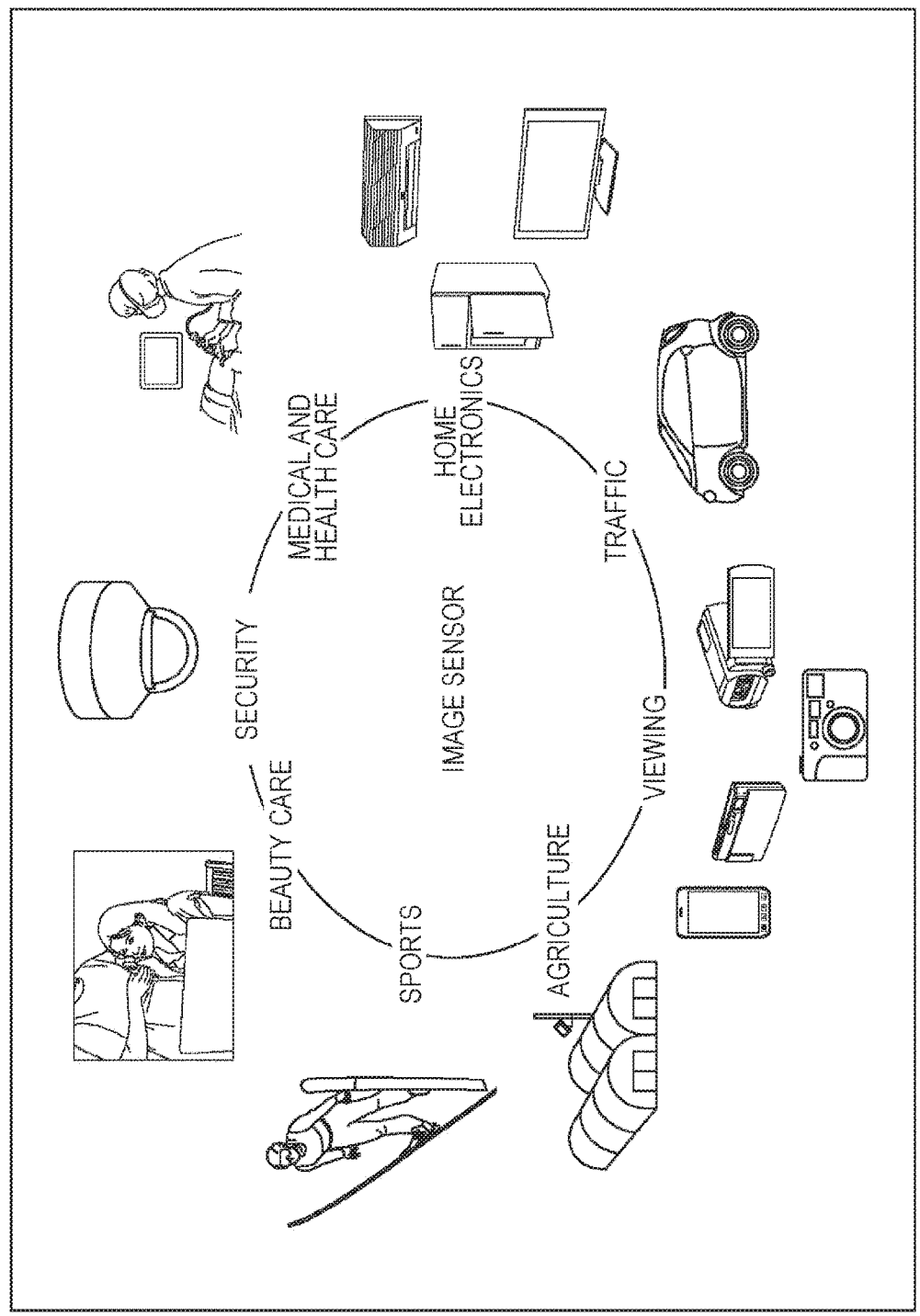
FIG. 57 is a diagram illustrating exemplary use of an image sensor.

FIG. 57 is a diagram illustrating exemplary use of the above image sensor (solid-state image sensing device package 11).

The above image sensor can be used in various cases for sensing a light such as visible ray, infrared ray, ultraviolet ray, or X ray as described below, for example.

Apparatuses for shooting images to be viewed such as digital camera or cell phone with camera function Traffic apparatuses for safe driving such as automatic stop, or recognition of driver's state, such as vehicle-mounted sensor for shooting in front of, behind, around, or inside an automobile, monitoring camera for monitoring traveling vehicle or road, or distance measuring sensor for measuring inter-vehicle distance or the like Home electronics such as TV, refrigerator, and air conditioner for shooting user's gesture and performing a device operation according to the gesture Medical or healthcare apparatuses such as endoscope, or apparatus for performing angiography by received infrared ray Security apparatus such as monitoring camera for crime prevention, or camera for person authentication Beauty care apparatuses such as skin measurement device for shooting the skin, or microscope for shooting the scalp Sports apparatuses such as action camera or wearable camera for sports Agricultural apparatus such as camera for monitoring state of field or crops Additionally, the present technology can take the following configurations.

(1)

A solid-state image sensing device including:

an impurity region formed on a semiconductor substrate of a predetermined type by implanting an impurity of a different type from the semiconductor substrate;

a high-dielectric insulative film laminated on at least the impurity region; and an electrode connected to the impurity region in a connection structure via the high-dielectric insulative film.

(2)

The solid-state image sensing device according to (1), in which the high-dielectric insulative film is formed on the bottom and the inner peripheral face of a contact hole formed in an interlayer insulative film in order to form the electrode.

(3)

The solid-state image sensing device according to (1), in which the high-dielectric insulative film is laminated on at least the surface of the impurity region before an interlayer insulative film for a wiring layer laminated on the semiconductor substrate is formed.

(4)

The solid-state image sensing device according to any of (1) to (3), in which the high-dielectric insulative film is formed in a single layer.

(5)

The solid-state image sensing device according to any of (1) to (3), in which the high-dielectric insulative film is formed in a plurality of layers including different materials, respectively.

(6)

The solid-state image sensing device according to any of (1) to (5), in which the high-dielectric insulative film is formed by use of a material which reduces the schottky barrier height in a connection part between the impurity region and the electrode.

(7)

The solid-state image sensing device according to any of (1) to (6), in which the high-dielectric insulative film is formed on the surface of the semiconductor substrate corresponding to a region where a photoelectric conversion unit is formed in the semiconductor substrate.

(8)

The solid-state image sensing device according to (7), in which a high-dielectric insulative film formed on the impurity region and a high-dielectric insulative film formed on the surface of the semiconductor substrate corresponding to the photoelectric conversion unit are formed by use of the same material.

(9)

The solid-state image sensing device according to (7), in which a first high-dielectric insulative film formed on the impurity region and a second high-dielectric insulative film formed on the surface of the semiconductor substrate corresponding to the photoelectric conversion unit are formed by use of different materials, respectively.

(10)

The solid-state image sensing device according to (9), in which the first high-dielectric insulative film is formed by use of a material which reduces the schottky barrier height in a connection part between the impurity region and the electrode, and the second high-dielectric insulative film is formed by use of a material with high pinning strength.

(11)

The solid-state image sensing device according to (9), in which the first high-dielectric insulative film is formed by use of a material with small band offset relative to the type of the impurity region, the second high-dielectric insulative film is formed on the first high-dielectric insulative film on the surface of the semiconductor substrate corresponding to the photoelectric conversion unit, and the first high-dielectric insulative film is different from the second high-dielectric insulative film in layer structure.

(12)

The solid-state image sensing device according to any of (1) to (11), including:

an overflow region arranged in front of a transfer transistor configured to transfer charges to a memory unit in which a first substrate on which a photoelectric conversion unit configured to generate charges depending on a received light, and the impurity region are formed, and a second substrate on which the memory unit configured to hold charges generated in the first substrate until the charges are read are laminated.

(13)

The solid-state image sensing device according to (12), in which a circuit required to drive a pixel having the photoelectric conversion unit is arranged around a pixel region in which a plurality of the pixels are arranged.

(14)

A method for manufacturing a solid-state image sensing device including:

forming an impurity region on a semiconductor substrate of a predetermined type by implanting an impurity of a different type from the semiconductor substrate;

laminating a high-dielectric insulative film on at least the impurity region; and forming an electrode connected to the impurity region in a connection structure via the high-dielectric insulative film.

(15)

An electronic device including a solid-state image sensing device, the solid-state image sensing device including:

an impurity region formed on a semiconductor substrate of a predetermined type by implanting an impurity of a different type from the semiconductor substrate;

a high-dielectric insulative film laminated on at least the impurity region; and an electrode connected to the impurity region in a connection structure via the high-dielectric insulative film.

Additionally, the present embodiments are not limited to the above embodiments, and can be variously changed without departing from the spirit of the present disclosure.

REFERENCE SIGNS LIST

11 Solid-state image sensing device
12 Pixel
21 Semiconductor substrate
22 Wiring layer
23 Planarization film
24 Filter layer
25 On-chip lens layer
26 Support substrate
31 PD
32 FD part
33 Transfer transistor
34 Color filter
35 Micro-lens
41 Silicon oxide film
42 Interlayer insulative film
51 Gate electrode
52 Sidewall part
53 Contact electrode
54 High-dielectric insulative film
55 Contact electrode

The invention claimed is:

1. A solid-state image sensing device, comprising:
an impurity region on a semiconductor substrate of a first type by implantation of an impurity of a second type from the semiconductor substrate;
a first dielectric insulative film on at least the impurity region;
a photoelectric conversion unit in the semiconductor substrate; and
an electrode connected to the impurity region in a connection structure via the first dielectric insulative film,
wherein a second dielectric insulative film is on a surface of the semiconductor substrate corresponding to a region where the photoelectric conversion unit is in the semiconductor substrate, and wherein the first dielectric insulative film comprises a first metal-based material and the second dielectric insulative film comprises a second metal-based material.

2. The solid-state image sensing device according to claim 1,
wherein the first dielectric insulative film is on a bottom and an inner peripheral face of a contact hole, and
wherein the contact hole is in an interlayer insulative film for the electrode.

3. The solid-state image sensing device according to claim 1,
wherein an interlayer insulative film for a wiring layer is on the semiconductor substrate with the first dielectric insulative film.

4. The solid-state image sensing device according to claim 1,
wherein the first dielectric insulative film is a single layer.

5. The solid-state image sensing device according to claim 1,
wherein the first dielectric insulative film comprises plurality of layers, and
wherein each layer of the plurality of layers comprise a different material.

6. The solid-state image sensing device according to claim 1,
wherein the first metal-based material reduces a schottky barrier height in a connection part between the impurity region and the electrode.

7. The solid-state image sensing device according to claim 1,
wherein the first dielectric insulative film on at least the impurity region and the second dielectric insulative film on the surface of the semiconductor substrate are of a same material.

8. The solid-state image sensing device according to claim 1,
wherein the first metal-based material is different from the second metal-based material.

9. The solid-state image sensing device according to claim 8,
wherein the first metal-based material reduces a schottky barrier height in a connection part between the impurity region and the electrode, and
wherein the second metal-based material enhances pinning strength.

10. The solid-state image sensing device according to claim 8,
wherein the first metal-based material has a small band offset relative to the second type of the impurity region,
wherein the second dielectric insulative film is on the first dielectric insulative film on the surface of the semiconductor substrate corresponding to the photoelectric conversion unit, and
wherein the first dielectric insulative film is different from the second dielectric insulative film in a layer structure.

11. The solid-state image sensing device according to claim 1, further comprising:
an overflow region;
a transfer transistor configured to transfer charges to a memory unit;
a first substrate that comprises:
the photoelectric conversion unit configured to generate charges based on received light, and
the impurity region; and
a second substrate, wherein the memory unit is on the second substrate and the memory unit is configured to hold the charges generated in the first substrate until the charges are read.

12. The solid-state image sensing device according to claim 11, further comprising a circuit configured to drive a pixel having the photoelectric conversion unit, wherein the circuit is around a pixel region in which a plurality of the pixels are arranged.

13. A method, comprising:
forming an impurity region on a semiconductor substrate of a first type by implanting an impurity of a second type from the semiconductor substrate;
laminating a first dielectric insulative film on at least the impurity region; and
forming an electrode connected to the impurity region in a connection structure via the first dielectric insulative film,
wherein a second dielectric insulative film is on a surface of the semiconductor substrate corresponding to a region where a photoelectric conversion unit is in the semiconductor substrate, and
wherein the first dielectric insulative film comprises a first metal-based material and the second dielectric insulative film comprises a second metal-based material.

14. An electronic device, comprising:
a solid-state image sensing device, wherein the solid-state image sensing device comprises:
an impurity region on a semiconductor substrate of a first type by implantation of an impurity of a second type from the semiconductor substrate;
a first dielectric insulative film on at least the impurity region;
a photoelectric conversion unit in the semiconductor substrate; and
an electrode connected to the impurity region in a connection structure via the first dielectric insulative film,
wherein a second dielectric insulative film is on a surface of the semiconductor substrate corresponding to a region where the photoelectric conversion unit is in the semiconductor substrate, and
wherein the first dielectric insulative film comprises a first metal-based material and the second dielectric insulative film comprises a second metal-based material.

* * * * *